US009178725B2

(12) United States Patent
Chang et al.

(10) Patent No.: US 9,178,725 B2
(45) Date of Patent: Nov. 3, 2015

(54) MULTI-BAND INTERCONNECT FOR INTER-CHIP AND INTRA-CHIP COMMUNICATIONS

(71) Applicant: THE REGENTS OF THE UNIVERSITY OF CALIFORNIA, Oakland, CA (US)

(72) Inventors: Mau-Chung Chang, Los Angeles, CA (US); Sai-Wang Tam, Rosemead, CA (US); Gyung-Su Byun, Morgantown, WV (US); Yanghyo Kim, Los Angeles, CA (US); Kanit Therdsteerasukdi, Los Angeles, CA (US); Jeremy Ir, Tempe, AZ (US); Glenn Reinman, Los Angeles, CA (US); Jingsheng Cong, Pacific Palisades, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 120 days.

(21) Appl. No.: 13/965,077

(22) Filed: Aug. 12, 2013

(65) Prior Publication Data
US 2014/0044157 A1 Feb. 13, 2014

Related U.S. Application Data

(63) Continuation of application No. PCT/US2012/025132, filed on Feb. 14, 2012.

(60) Provisional application No. 61/442,557, filed on Feb. 14, 2011, provisional application No. 61/443,154, filed on Feb. 15, 2011, provisional application No. 61/513,732, filed on Aug. 1, 2011.

(51) Int. Cl.
*H04B 1/38* (2015.01)
*H04L 5/16* (2006.01)
(Continued)

(52) U.S. Cl.
CPC ........ *H04L 25/0274* (2013.01); *G06F 15/7842* (2013.01); *G11C 5/063* (2013.01);
(Continued)

(58) Field of Classification Search
CPC ..... H04L 25/0274; H04L 27/04; H04L 45/60; G06F 15/7842
USPC .......................................... 375/219, 257, 258
See application file for complete search history.

(56) References Cited

U.S. PATENT DOCUMENTS 8,131,250 B2 * 3/2012 Gu et al. ....................... 455/333
2007/0245094 A1 10/2007 Lee et al.
(Continued)

FOREIGN PATENT DOCUMENTS

WO 2012/112618 A1 8/2012

OTHER PUBLICATIONS

Chang, M.-C.F. ; Verbauwhede, I. ; Chien, C. ; Xu, Z. ; Jongsun Kim ; Jenwei Ko ; Qun Gu ; Bo-Cheng Lai' "Advanced RF/baseband interconnect schemes for inter- and intra-ULSI communications," IEEE Transactions on Electron Devices, vol. 52 , Issue: 7, 2005 , pp. 1271-1285.*

(Continued)

*Primary Examiner* — Shuwang Liu
*Assistant Examiner* — Nader Bolourchi
(74) *Attorney, Agent, or Firm* — John P. O'Banion

(57) ABSTRACT

Systems, apparatus, modules, and methods of communicating with memory devices utilizing multi-band communication containing a baseband and one or more amplitude shift keyed (ASK) RF channels over each differential pair of off-chip transmission lines. Configurations are described for interfacing between microprocessors, or controllers and memory devices or modules, and within a DIMM and its DRAM devices, and between multiple DIMM memory modules.

50 Claims, 58 Drawing Sheets

(51) Int. Cl.
   *H04L 25/02* (2006.01)
   *G06F 15/78* (2006.01)
   *H04L 12/773* (2013.01)
   *G11C 5/06* (2006.01)
   *G11C 7/10* (2006.01)
   *H04L 27/04* (2006.01)

(52) U.S. Cl.
   CPC ............... *G11C 7/10* (2013.01); *G11C 7/1057* (2013.01); *G11C 7/1084* (2013.01); *H04L 27/04* (2013.01); *H04L 45/60* (2013.01); *G06F 2213/0038* (2013.01)

(56) References Cited

U.S. PATENT DOCUMENTS

2008/0263287 A1  10/2008  Kim
2010/0146157 A1   6/2010  Choi et al.

OTHER PUBLICATIONS

Korean Intellectual Property Office, International Search Report and Written Opinion issued on May 1, 2012 for corresponding International Patent Application No. PCT/US2012/025132, published as WO 2012/112618 (pp. 1-9) with claims searched (pp. 10-19) pp. 1-19.

* cited by examiner

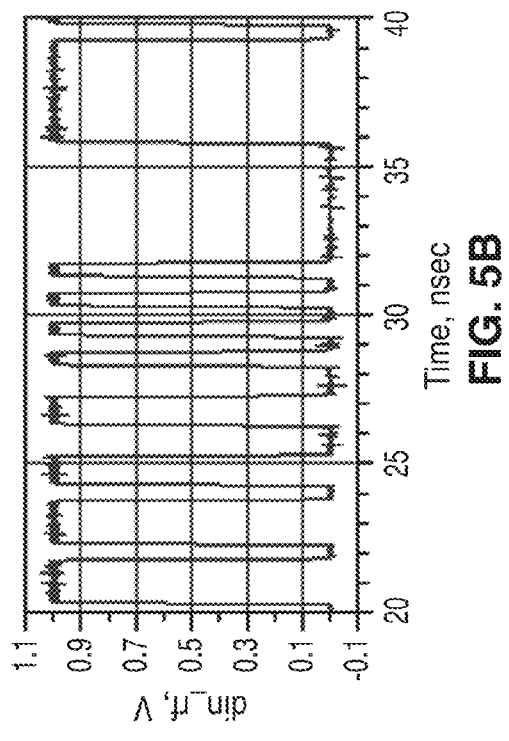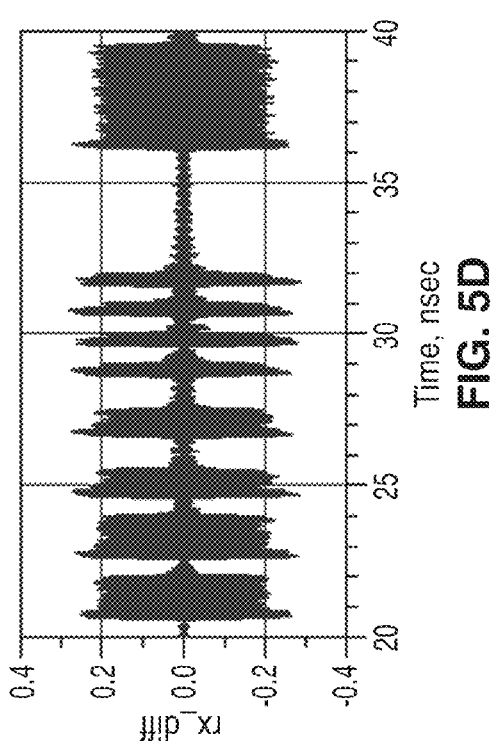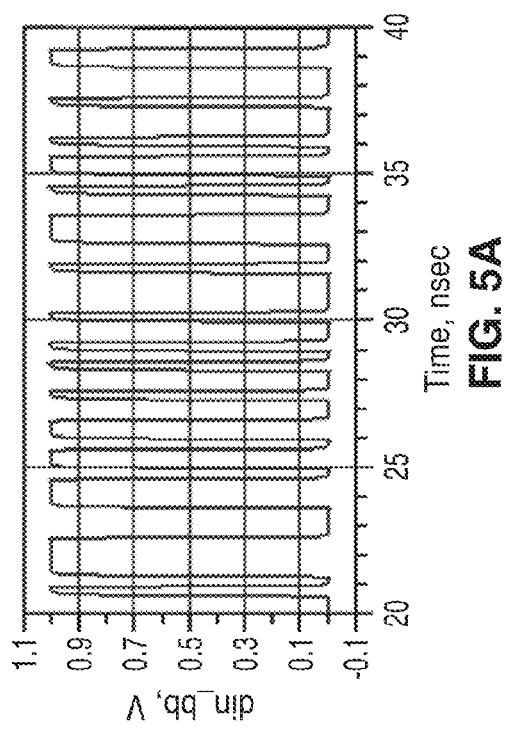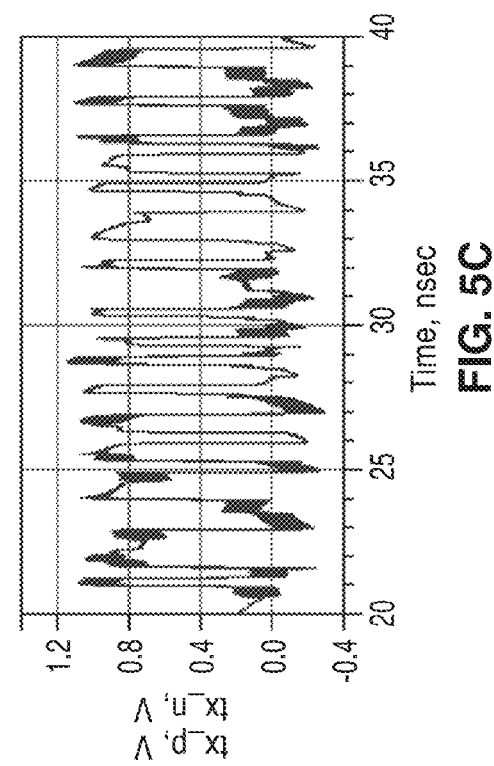
FIG. 5A
FIG. 5B
FIG. 5C
FIG. 5D

MULTI-BAND INTERCONNECT FOR INTER-CHIP AND INTRA-CHIP COMMUNICATIONS

CROSS-REFERENCE TO RELATED APPLICATIONS

This application is a 35 U.S.C. §111(a) continuation of PCT international application number PCT/US2012/02132 filed on Feb. 14, 2012, incorporated herein by reference in its entirety, which is a nonprovisional of U.S. provisional patent application Ser. No. 61/442,557 filed on Feb. 14, 2011, incorporated herein by reference in its entirety, a nonprovisional of U.S. provisional patent application Ser. No. 61/443,154 filed on Feb. 15, 2011, incorporated herein by reference in its entirety, and a nonprovisional of U.S. provisional patent application Ser. No. 61/53/732 filed on Aug. 1, 2011, incorporated herein by reference in its entirety. Priority is claimed to each of the foregoing applications.

The above-referenced PCT international application was published as PCT International Publication No. WO 2012/112618 on Aug. 1, 2011, which publication is incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to chip interconnection, and more particularly to a multi-band RF-interconnect transceiver as an advanced high-speed interface.

2. Description of Related Art

Chip-to-chip RF (radio-frequency) communication has become increasingly important to support exponential chip development advances with high pin counts and high complexity, that are increasingly difficult to distribute over traditional wired connections. In response to these interconnection problems, a number of solutions have been advanced for establishing RF chip-to-chip interconnections. One recent type of interconnection is directed at using a frequency-division multiple access interconnect (FDMA-I) transceiver for transmission line based multiple-band chip-to-chip communications.

However, although this interconnection mechanism provides a number of advantages, it suffers from power intensive phase and frequency synchronizations to demodulate binary phase-shift keying (BPSK) at the receiver, which increases transceiver architectural complexity, while requiring a large circuit area and a high overall power consumption. Consequently, this form of interconnection is not scalable and is not particularly well-suited for use in low power off-chip busses, such as those utilized within parallel memory busses.

Power and bandwidth requirements for dynamic random access memories (DRAMs) have continued becoming increasingly stringent. This is not surprising, in view of devices, such as mobile devices (e.g., smart phones) relying more intensively on graphics. The inputs and outputs (I/Os) of current double data rate (DDR) memory devices operate at approximately 5 Gb/s with a power efficiency of about 17.4 mW/Gb/s (i.e., 17.4 pJ/b). High-speed serial links provide an increased power efficiency of around 1 mW/Gb/s, which would be favorable for use in mobile memory I/O interfaces.

However, serial links typically suffer from the need of long initialization time, such as on the order of 1000 clock cycles, and do not meet mobile DRAM I/O requirements for fast switching between active, stand-by, self-refresh and power-down operating modes. In addition, traditional baseband-only (or BB-only) signaling tends to consume power super-linearly for extended bandwidth due to the need of power intensive pre-emphasis and equalization circuits.

Accordingly, the present invention provides apparatus and methods for overcoming wireless RF chip-to-chip interconnection issues with regard to power consumption, speed and circuit area, while being particularly well-suited for use in DRAM memory systems.

BRIEF SUMMARY OF THE INVENTION

Multi-band signaling is described for providing inter-chip (chip-to-chip) and intra-chip interconnection. The invention provides numerous benefits and is particularly well-suited for use interconnecting with, or between, memory devices, such as from microprocessors, memory control circuits, or other memory modules and/or individual memory devices. The invention is configured for simultaneously communicating baseband and RF signals across a shared transmission line, preferably a differential transmission line. Various embodiments are described, which provide different numbers of channels, directions of transmission (e.g., baseband and RF signals in same direction, opposing directions, or combinations with multiple RF signal channels).

According to one simple case, a baseband transmitter connects as a common mode signal to a differential off-chip transmission line, while an RF band transmitter performs differential amplitude shift keying (ASK) of a carrier frequency over the same transmission line. Accordingly, multiple bands are simultaneously communicated between a CPU (or memory controller, DIMM, or other control circuit) and memory devices (e.g., memory modules, DIMMs, DRAM chips and so forth). In other embodiments, multiple RF bands are communicated over the same transmission line shared with the baseband signal.

The present invention provides a number of beneficial elements which can be implemented either separately or in any desired combination without departing from the present teachings.

Further aspects and embodiments of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 5A through FIG. 5F are simulated waveforms showing input data streams of BB (FIG. 5A), RF (FIG. 5B), transmitted 2 level BB signal (FIG. 5C), ASK modulated RF carrier (FIG. 5D), and recovered data streams of BB (FIG. 5E), and RF (FIG. 5F), according to elements of the present invention.

DETAILED DESCRIPTION OF THE INVENTION

The present invention provides apparatus and methods for increasing speed and efficiency for inter-chip (chip-to-chip) and intra-chip interconnections. Embodiments are described in which control circuits (e.g., processor, memory control chips, and so forth) are interconnected to memory chips (e.g., individual DRAM chips or modules), while other embodiments describe interconnecting between a memory control chip and memory chips within a dual in-line memory module (DIMM). It will also be appreciated that any of these inventive communications aspects can also be implemented between portions of a single chip as an intra-chip interconnection mechanism.

One aspect of the invention is an off-chip multi-band RF interconnect (OMRF-I) for increasing aggregate data rate, and reducing energy/bit for chip-to-chip communication, such as between a microprocessor, or other device accessing memory, such as a memory controller, and DRAM memory devices. By sharing the same physical transmission line between the traditional baseband and multiple (by a factor of N) RF-bands to provide an ultra-high speed advanced memory I/O bus.

By way of example, and not of limitation, one embodiment of the invention provides a technique based on OMRF-I with an amplitude shift keying (ASK) (de)modulation scheme with novel pseudo-differential signal mixing utilized for off-chip ultra-high speed wire-line communications. More particularly, an aspect of the invention utilizes OMRF-I transceiver architecture to provide an ultra-high data rate parallel memory interface.

Figure 1:
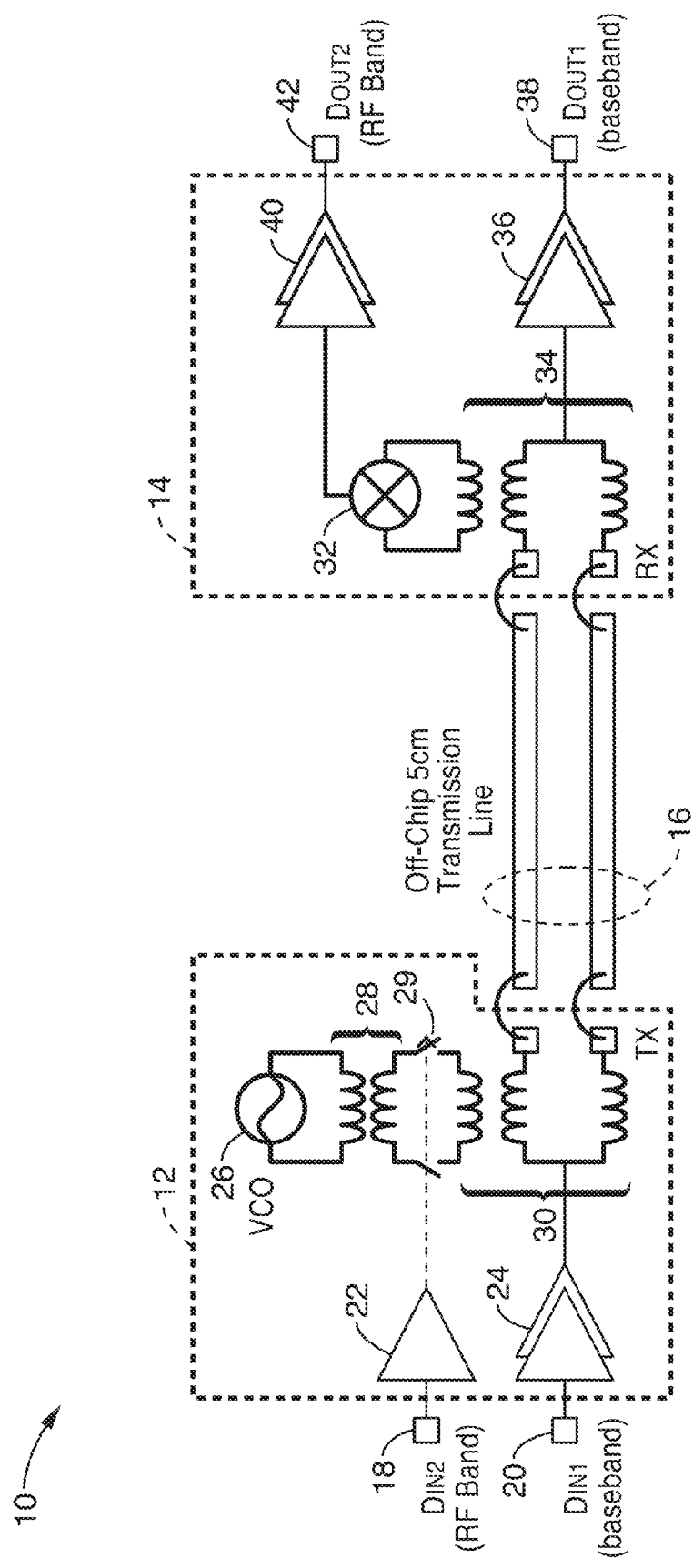
FIG. 1 is a schematic of an off-chip multi-band RF-interconnect (OMRF-I) according to an embodiment of the present invention.

FIG. 1 illustrates an example embodiment 10 of an OMRF-I interface architecture which is implemented by combining baseband (BB) and multi-RF (MRF) band transceivers to enable simultaneous communications over a shared parallel bus or a point-to-point link. For instance, the baseband and RF-band transceivers can communicate concurrently between CPU and memories along shared transmission lines, which results in enhanced channel concurrency and increased aggregate data bandwidth (i.e., aggregate data rate 10 Gb/s/pin=BB 5 Gb/s/pin+RF 5×N Gb/s/pin). Moreover, in response to real-time software control, the OMRF-I bus can be reconfigured to facilitate flexible I/O bus architecture.

An interconnection is shown in the figure between a transmitting chip 12 and receiving chip 14 through off-chip transmission lines 16. RF ($D_{IN2}$) and baseband ($D_{IN1}$) inputs are received 18, 20 into buffers 22, 24 and connected to respective transformers 28, 30. It should be appreciated that as the loading of the baseband output is typically very high (e.g., received by numerous chip inputs), a cascade or multiple buffers are depicted for driving the baseband output. The transformer for the RF band is driven by a voltage controlled oscillator (VCO) creating a carrier frequency. The RF band data stream is shown for switching on and off the transformer portion 29 coupled to the baseband transformer. Thus, the RF band is differentially coupled through the upper portion 29 of transformer 30 into off-chip transmission line 16, exemplified as a 5 cm transmission line.

On the receiver side, a transformer 34 is shown coupled to buffers 36 whose output ($D_{OUT1}$) is a baseband signal 38. One winding of transformer 36 is shown coupled to a mixer 32 generating an RF output to buffers 40 having output ($D_{OUT2}$) 42 in the RF band.

It should be appreciated that the different functions within this circuit, and the other circuits shown and described herein, can be implemented with numerous variations, as will be known to one of ordinary skill in the art, without departing from the teachings of the invention.

Figure 2A:
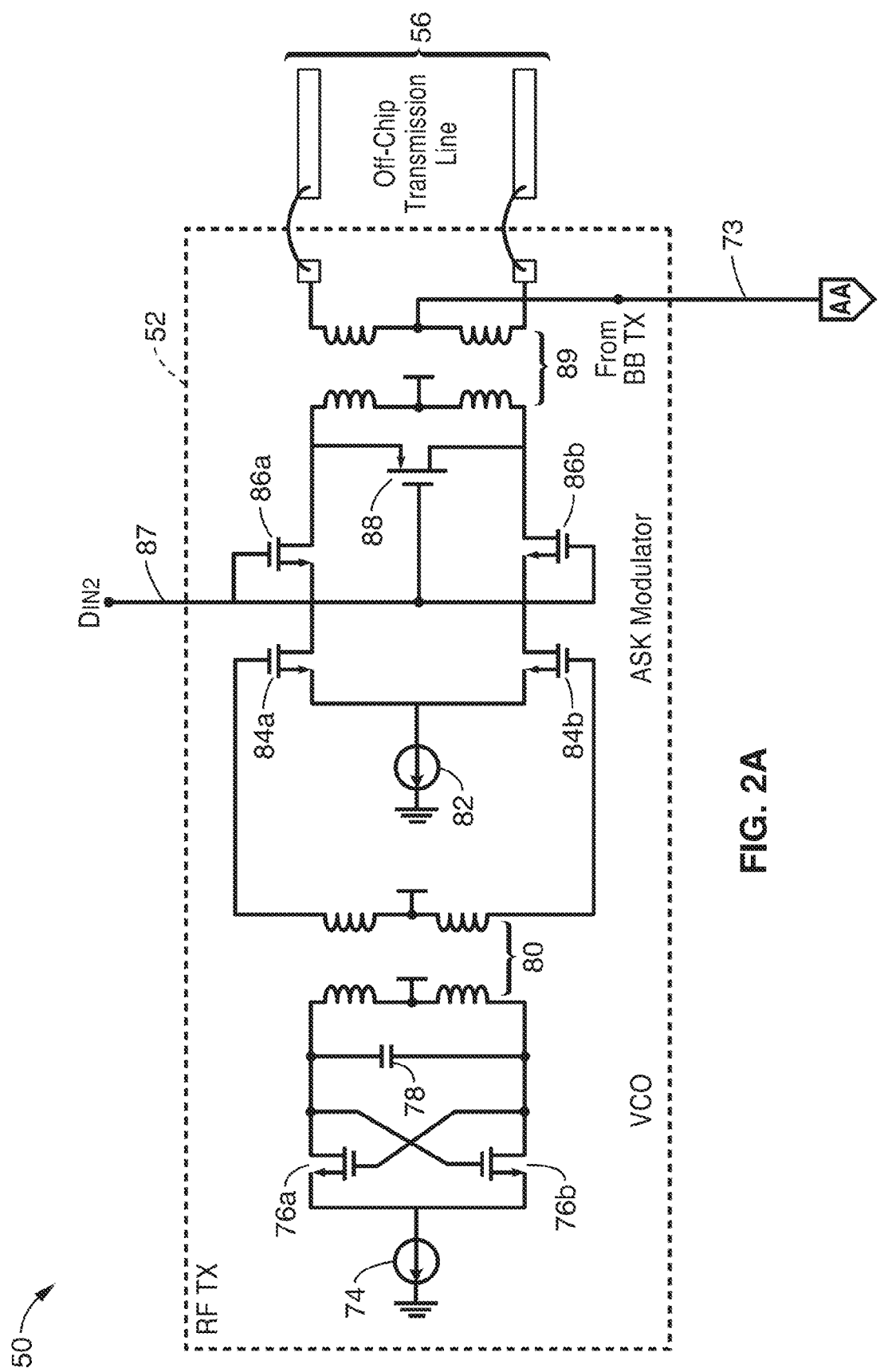
FIG. 2A through FIG. 2B is a schematic of a dual-band RF/BB transmitter with ASK modulator and BB digital impedance control according to an embodiment of the present invention.
Figure 2B:
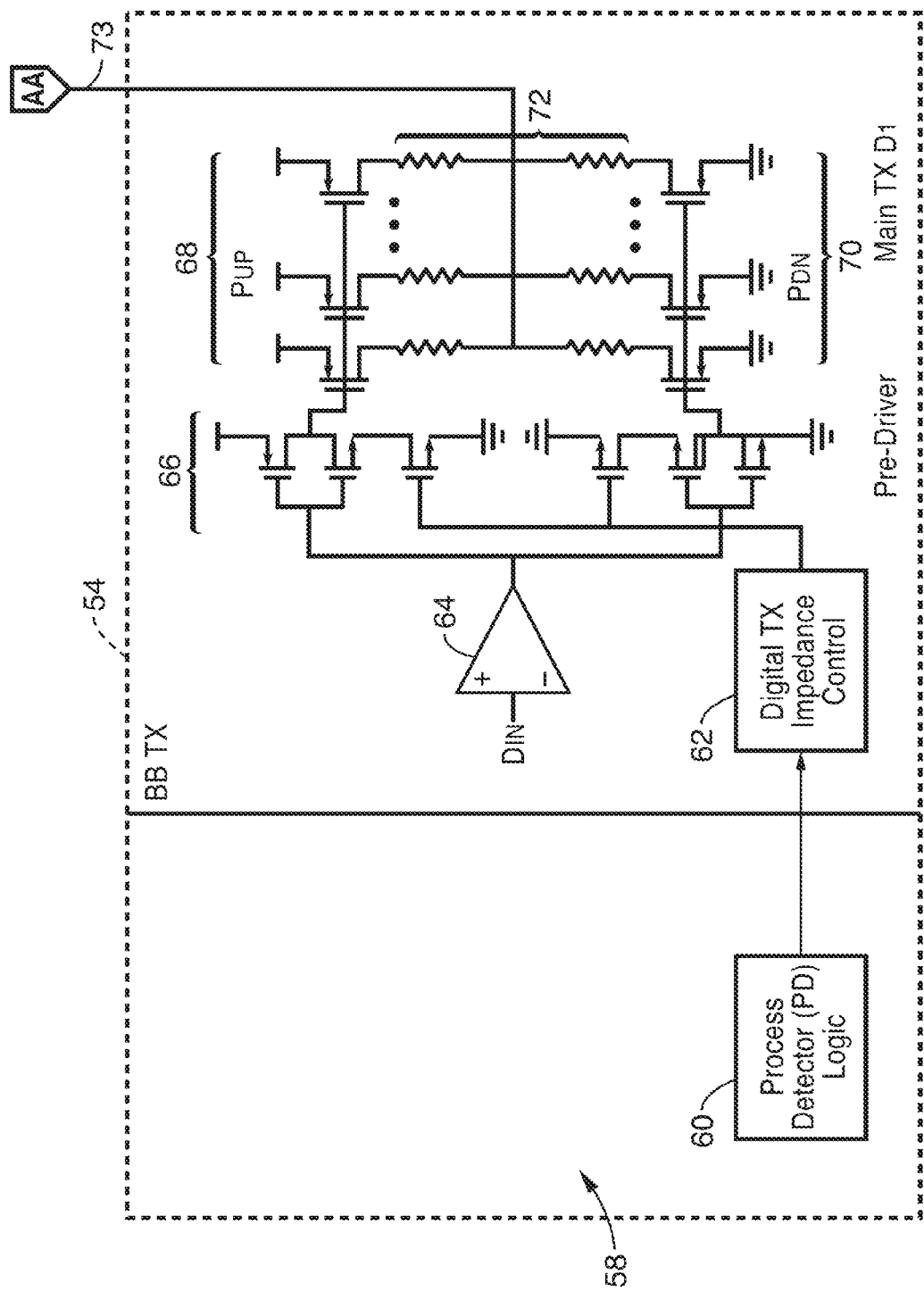

FIG. 2A through FIG. 2B illustrate an example embodiment 50 of a dual-band RF transmitter 52 and BB transmitter 54 with amplitude shift keyed (ASK) modulator and BB digital impedance control calibration 62 based on process variation detection (PD) logic.

The BB transmitter (BBTX) 54 circuit comprises a digital section 58 with output from the on-die CMOS process variation detector logic 60 input to a digital transmitter impedance control 62 which detects process variations and feeds back corner information to an impedance control calibrator which corrects for the process variation. A low common mode push-pull output driver is shown with amplifier 64 outputting to a pre-driver 66 having a pair of complementary transistors at the source and sink, and another transistor in the source and sink of the pre-driver gated by the digital impedance control circuit 62. Output from pre-driver 66 is directed through a main transmit driver gating a series of pull-up 68 and pull-down 70 transistors, between each pair of which are a resistive divider network 72, with signal 73 (shown as connector AA) being output to the output transformer 89, seen here on a portion of the RF transmitter 52. It will be noted that the resistive dividers operate to control output impedance to overcome process variation, while providing a single BB TX output. The n-bit digitally calibrated BB output driver can overcome the on-chip process variation and reduce the impedance mismatch of active devices and the characteristic mismatch of off-chip transmission line (i.e., micro-strip on printed circuit board, PCB).

The RF transmitter (RFTX) circuit consists of an LC tank VCO having an oscillator with current source 74 and transistors 76a, 76b, capacitor 78 and inductors within on-chip transformer 80. The VCO generates an RF carrier (LO=20 GHz) and is inductively coupled to the ASK modulator section through 2:1 ratio on-chip transformer. The ASK modulator comprises a current source 82, first transistors 84a, 84b gated by transformer 80, second transistors 86a, 86b gated by $D_{IN2}$ 87, and third transistor 88 also gated by $D_{IN2}$. Clearly, the transistors 86a, 86b and 88 operate to modulate the signal from transistors 84a, 84b, prior to receipt by transformer 89 and output through off-chip transmission line (TL) 56. It will be noted that the input data stream (DIN2) is up-converted with an RF carrier by current mode logic (CML) ASK NMOS switches and then the frequency selective transformer transmits the modulated signal into the TL by inductive coupling.

This dual RF/BB transmitter can transmit the two-level baseband signal and the ASK modulated RF signal simultaneously and achieve beneficial signal integrity against severe impedance discontinuity of the off-chip multi-drop memory bus. Unlike circuits utilizing a BPSK (de)modulation scheme, the present ASK RF transceiver eliminates the need of carrier regeneration at the receiver (i.e., quadrature voltage controlled oscillator (QVCO)) for demodulating binary phase signals (I/Q, 0/90 degree), which automatically eliminates process-induced carrier (re)generation variations between the TX and RX.

Figure 3:
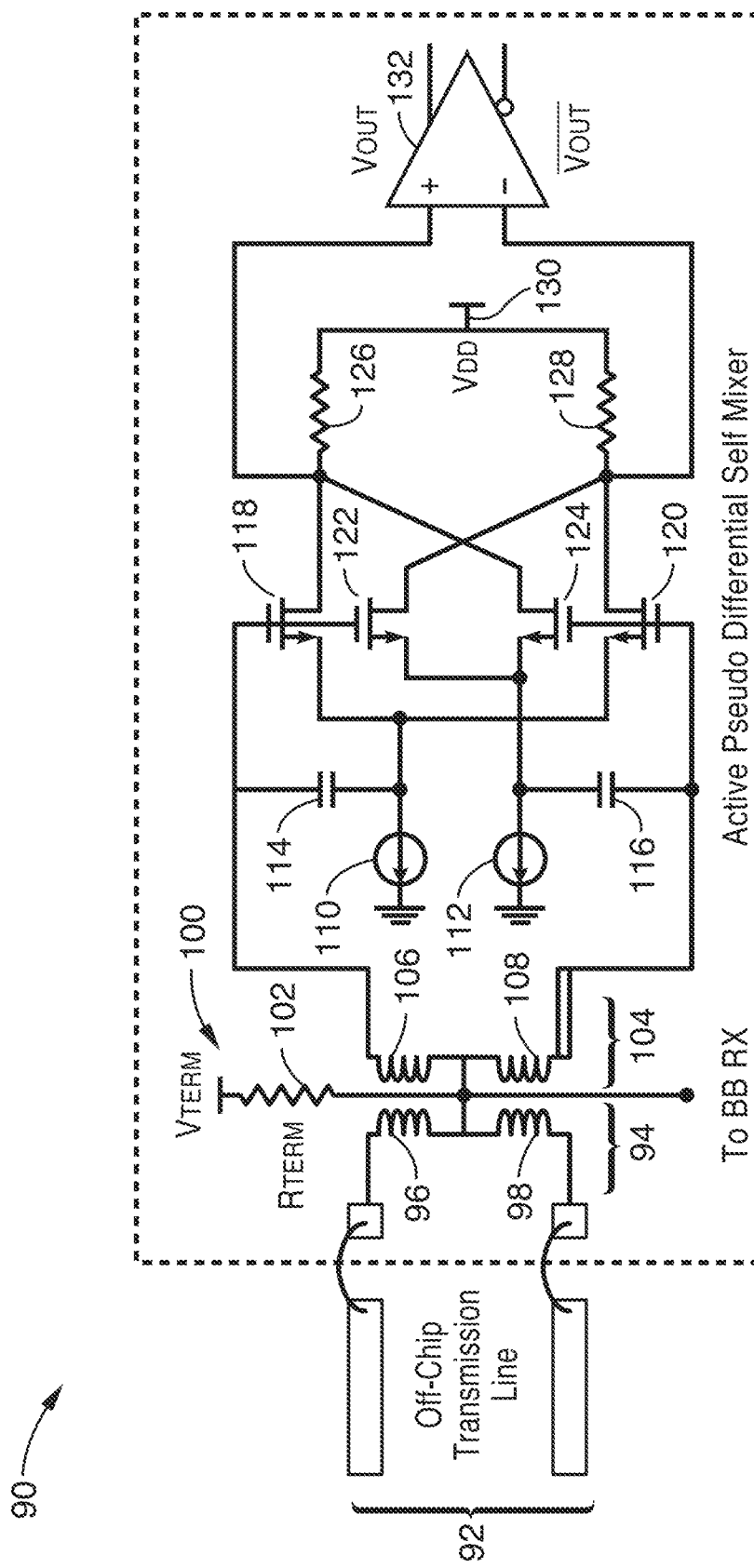
FIG. 3 is a schematic of an RF-band receiver (RFRX) architecture according to an embodiment of the present invention, showing a band-selection transformer configured for rejecting the baseband signal, and a pseudo-differential mixer for amplifying the incoming RF signal from the off-chip transmission line.

FIG. 3 illustrates an example embodiment 90 of an RF-band receiver (RFRX) architecture. Signals from the off-chip transmission line 92 are received 96, 98 at a band-selective transformer having primary windings 94 with coils 96 and 98, and secondary windings 104 with coils 106, 108. The center-taps of the primary and secondary provide a signal to the baseband receiver (BBRX) and is terminated with a voltage termination 100 through resistor 102. RFRX 90 rejects the BB data stream by using an on-chip frequency-selective transformer, shown with inductive elements 96, 98, 106, 108. The bandpass filtered RF-band data stream is then injected into the receiver differential mutual-mixer which is composed of a self mixer having bias current sources 110, 112 coupled through DC blocking capacitors 114, 116 to the gates of a self-mixer cross-coupled core comprising transistors 118, 120, 122, and 124. Output of sources 110, 112 is connected to the inputs of transistors 118, 120, 122 and 124, whose outputs are connected to pull-up resistors 126, 128 connected to VDD 130, and to amplifier 132, the combination forming a resistor-feedback amplifier, whose output down-converts the input signal back to an RF data signal.

The band-selection transformer is designed to reject the baseband signal and the pseudo-differential mixer is designed to amplify the incoming RF signal. In contrast to this, the use of conventional single-ended passive mixers suffer from substantial signal losses in microwave frequencies which are sensitive to supply noise coupling. In contrast, the pseudo-differential active mixer of the present invention amplifies and down-converts the modulated RF carriers by feeding ASK modulated signals to differential gates and drains. This active differential-signal mixing scheme with subsequent differential amplifier generates differential outputs to the baseband output driver. Consequently, ultra wide bandwidth with enhanced RF signaling and compact area is achieved by eliminating inductors in the low-noise amplifier (LNA) and eliminating phase/frequency locked loops (PLL and FLL) completely.

Figure 4B:
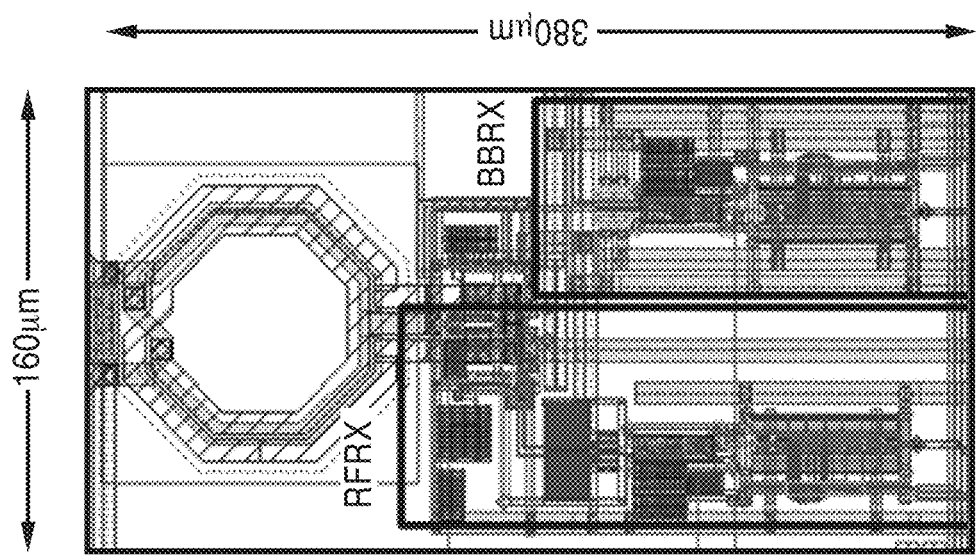
FIG. 4A through FIG. 4B are line drawings of chip layouts for a dual transmitter and dual receiver, respectively, according to an embodiment of the present invention.
Figure 4A:
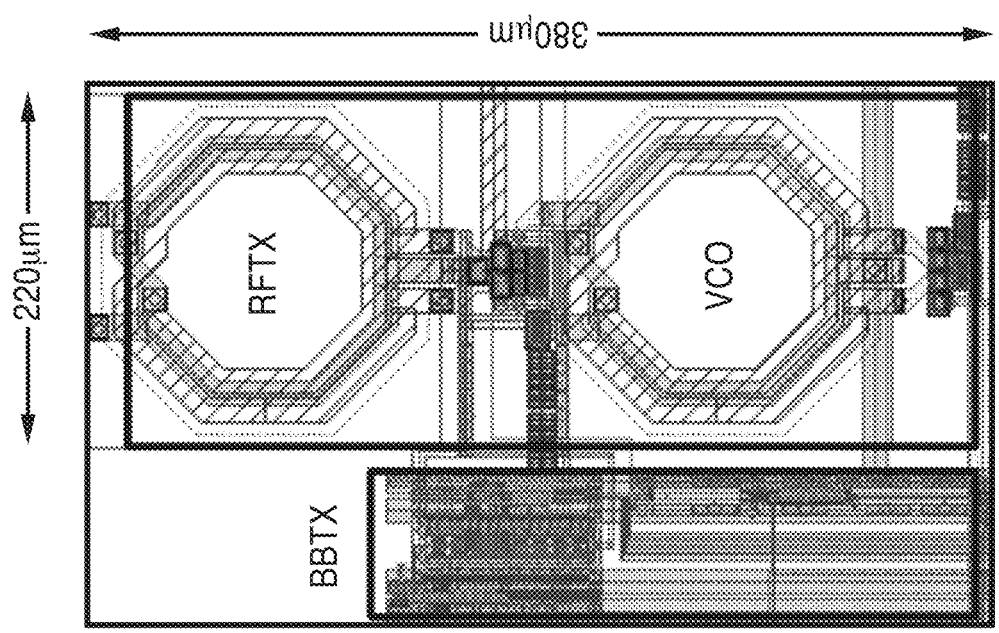

FIGS. 4A and 4B illustrate example embodiments of OMRF-I dual transceiver layouts shown in a Taiwan Semiconductor Manufacturing Company® (TSMC) 65 nm process with a die area of 0.08 $mm^2$ and 0.06 $mm^2$, respectively. The dual transmitter, having VCO, BB TX, and RF TX, has dimensions of 220 um by 380 um, while provided the dual receiver, having mixer, BB RX, and RF RX, has dimensions of 160 um by 380 um. It should be appreciated that all sizing and dimensions described herein are given by way of example and not limitation.

Figure 5F:
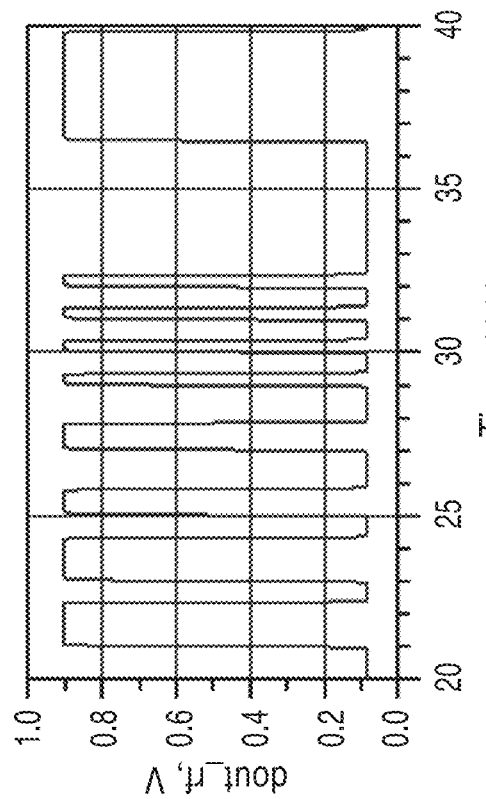
Figure 5E:
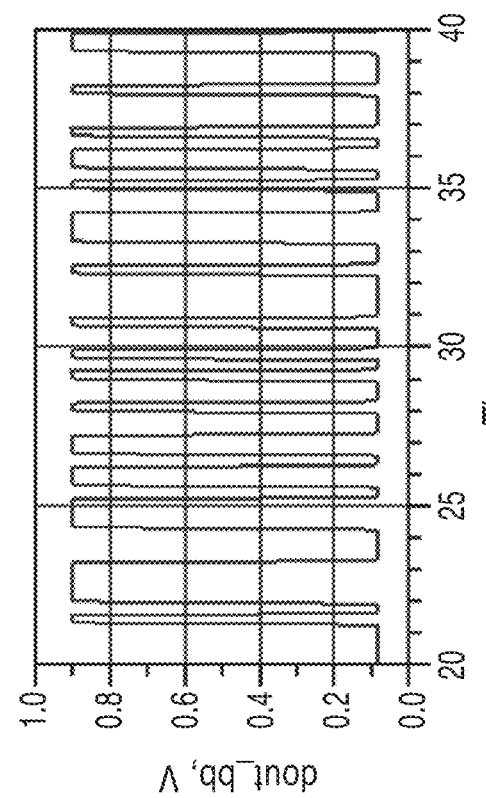

FIG. 5A through FIG. 5F show simulated simultaneous OMRF-I dual-band communication signals according to the present invention. FIG. 5A through FIG. 5B depicts input data streams for BB and RF bands, respectively. FIG. 5C through FIG. 5D depict transmitted two-level BB signal and ASK modulated RF carrier, respectively, as registered on the shared off-chip transmission line. FIG. 5E through FIG. 5F depict recovered data streams of the BB and RF bands, respectively.

Figure 6:
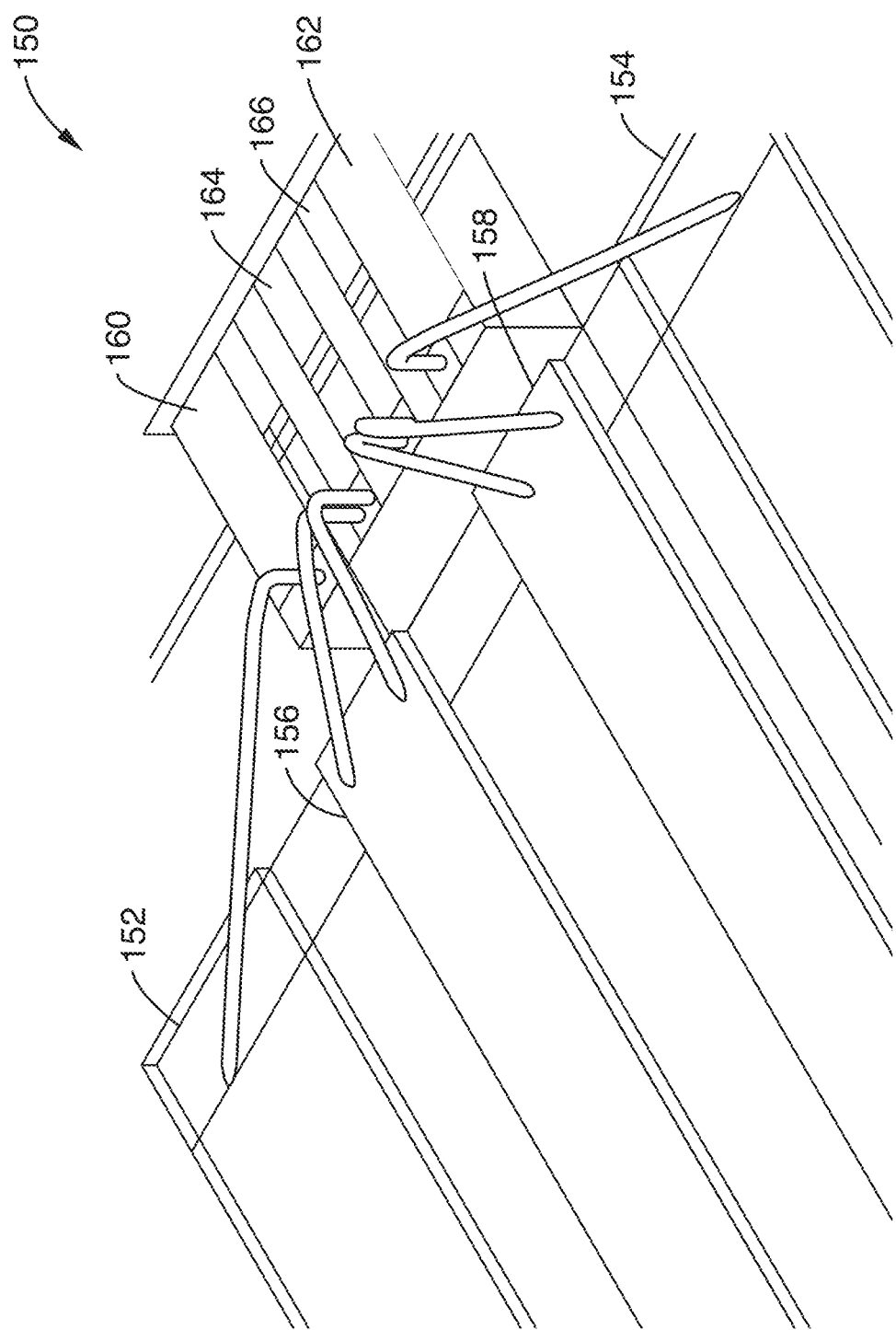
FIG. 6 is an isometric view of connection to an off-chip transmission line according to an embodiment of the present invention.

FIG. 6 illustrates an example embodiment 150 of an off-chip transmission line coupling, and more particularly an OMRF-I transmission packaging model. On-chip OMRF-I differential output pads contain grounds 160, 162, and signals 164, 166, shown coupled to transmission line elements on an example printed circuit board with ground lines 152, 154, and signal lines 156, 158.

Figure 7:
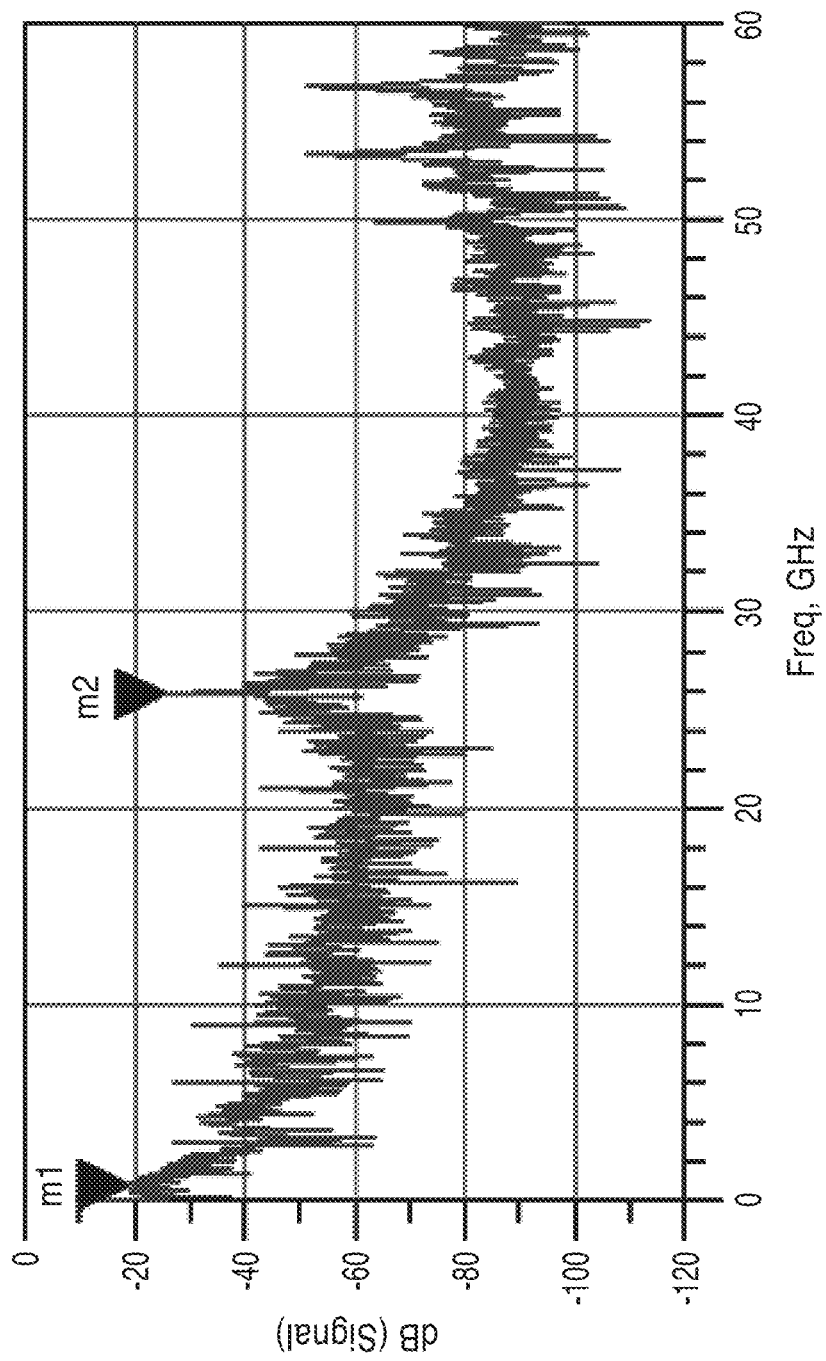
FIG. 7 is a graph of signal strength over frequency showing shared dual band signaling for an off-chip interconnection according to an embodiment of the present invention.

FIG. 7 shows dual-band signaling in BB (common mode) and RF (differential mode). Signal peaks are seen for the baseband signal m1, and at the RF carrier frequency m2 (23 GHz).

Figure 8A:
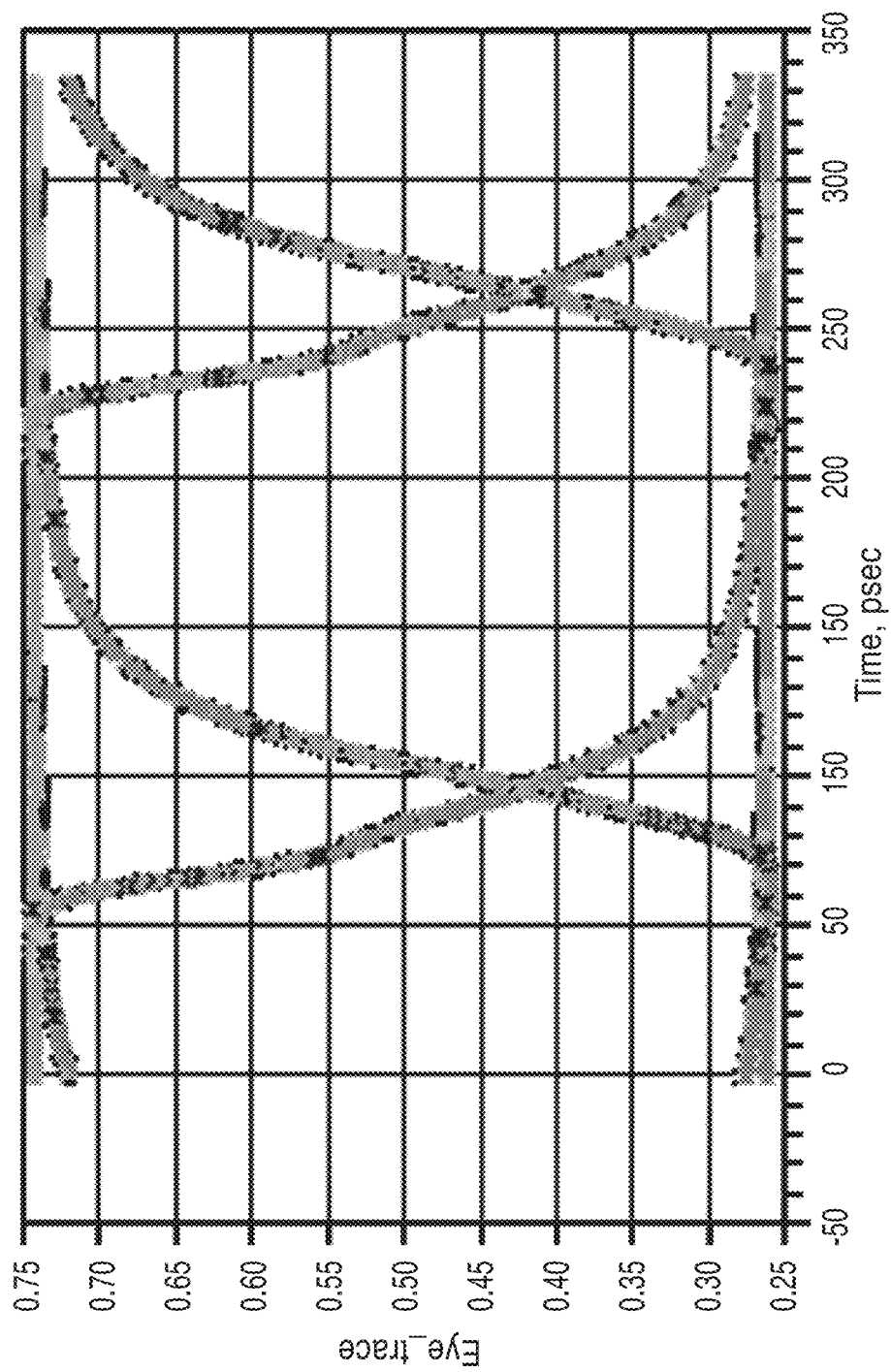
FIG. 8A through FIG. 8B are simulated eye diagrams of the baseband (BB) and radio frequency (RF) signals, respectively, according to an embodiment of the present invention.
Figure 8B:
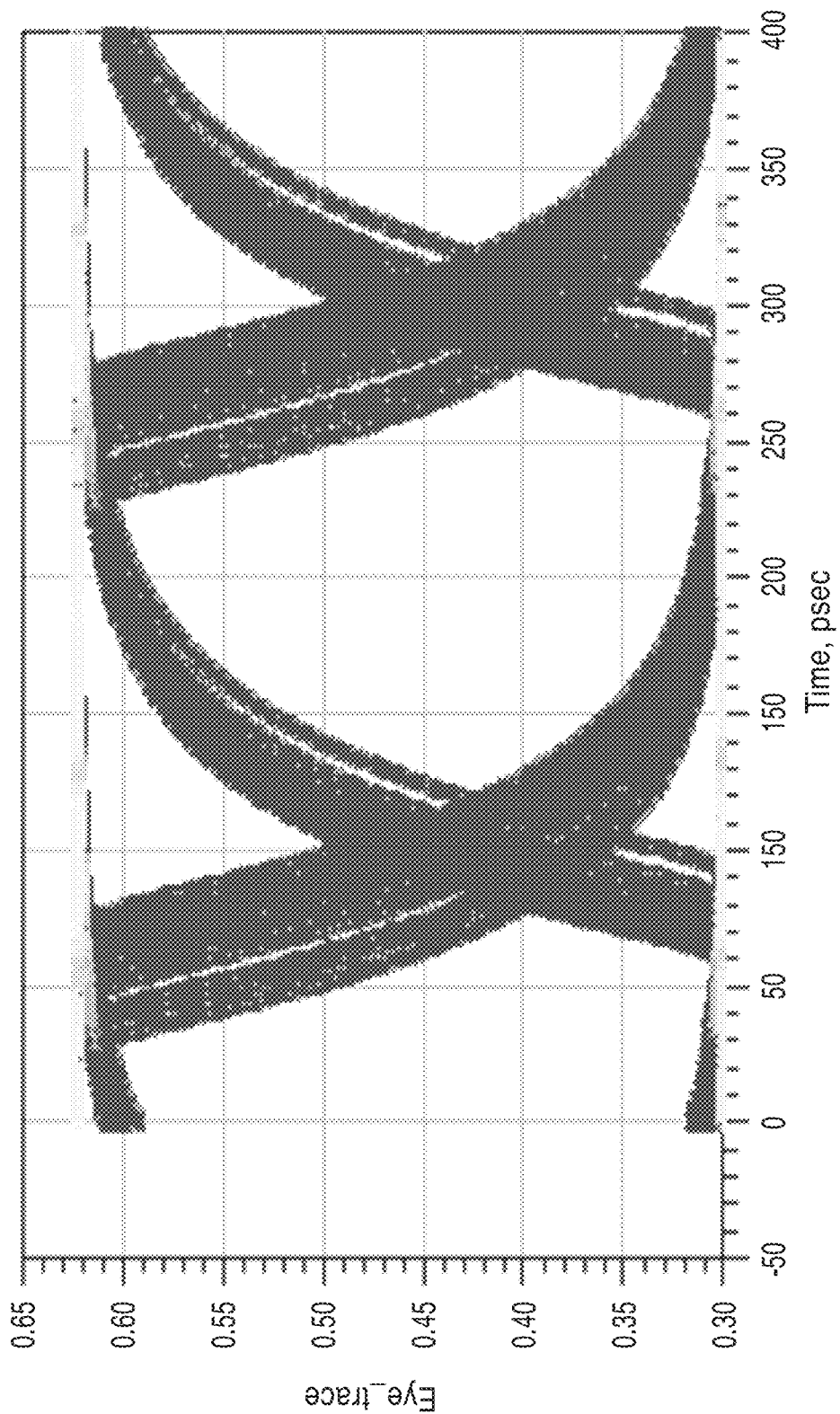

FIG. 8A through 8B depicts both BB and RF data eye diagrams, respectively. The pseudo-differential signal mixer of the present invention clearly enhances signal integrity and reduces transceiver sensitivity to external noise source such as supply and ground bouncing and coupling noises.

The OMRF-I interconnection circuits were fabricated in 65 nm CMOS technology to demonstrate simultaneous and reconfigurable multi-chip access capability.

Figure 9:
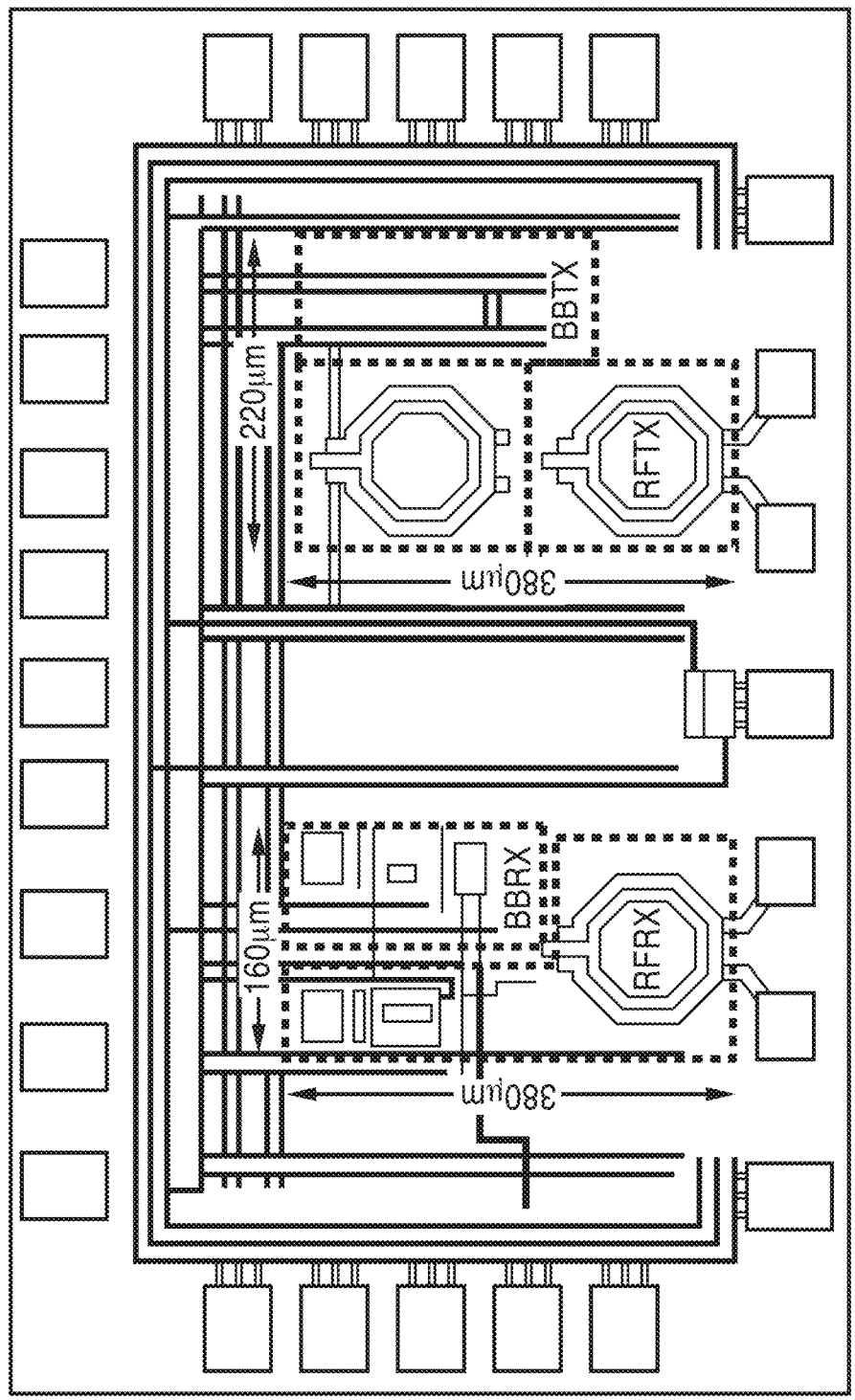
FIG. 9 is a line drawing of a microphotograph of a fabricated OMRF-I transceiver die according to an embodiment of the present invention.

FIG. 9 illustrates a prototype OMRF-I dual transceiver fabricated in 65 nm CMOS technology having a die which occupies 0.14 $mm^2$, and showing BBTX, RFTX, BBRX, RFRX along with the other necessary circuits and connections. The small transceiver area is particularly promising with respect to application in a parallel memory bus, such as applied to a 64 bit parallel memory bus.

Figure 10:
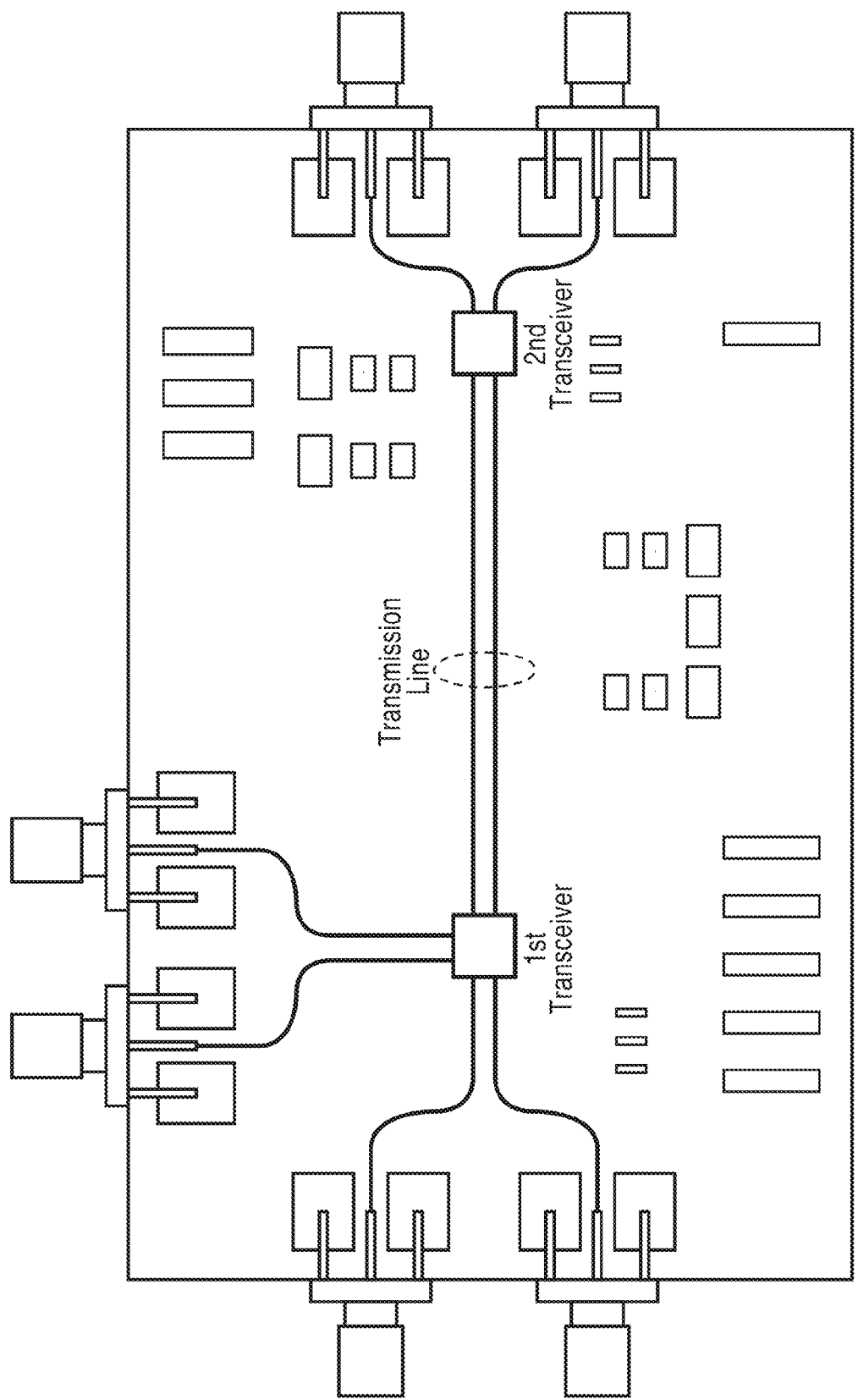
FIG. 10 is an image of a printed circuit board (PCB) showing dual transceivers and off chip channels according to an embodiment of the present invention.

FIG. 10 illustrates an embodied implementation of off-chip OMRF-I printed circuit board (PCB) showing first and second dual-band transceivers placed between both ends of the off-chip transmission line.

Figure 11:
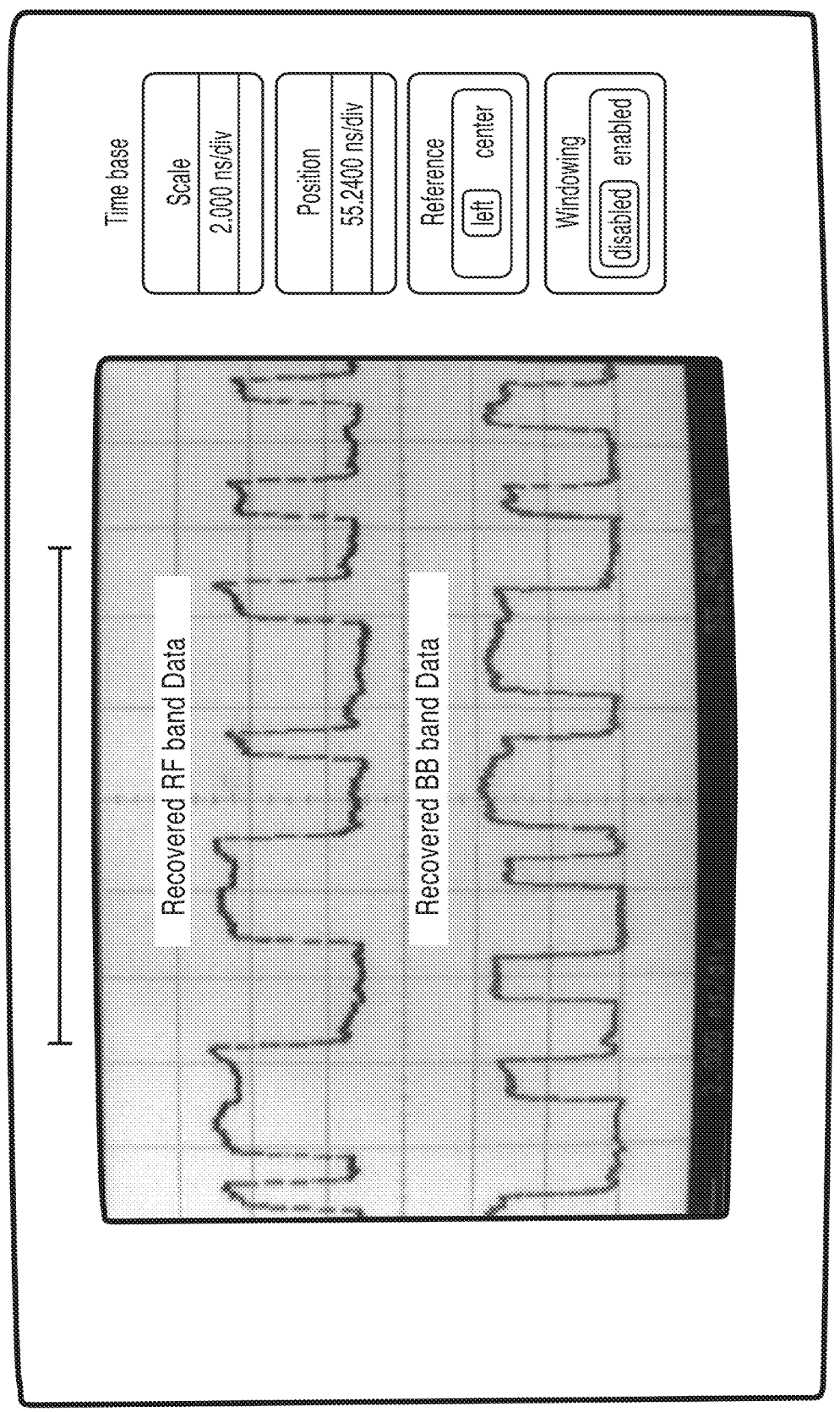
FIG. 11 is a graph of recovered simultaneous radio frequency (RF) and baseband (BB) signaling according to an embodiment of the present invention.

FIG. 11 depicts recovered RF band data in the upper signal and recovered BB data in the lower signal from the circuit shown in FIG. 10.

Figure 12A:
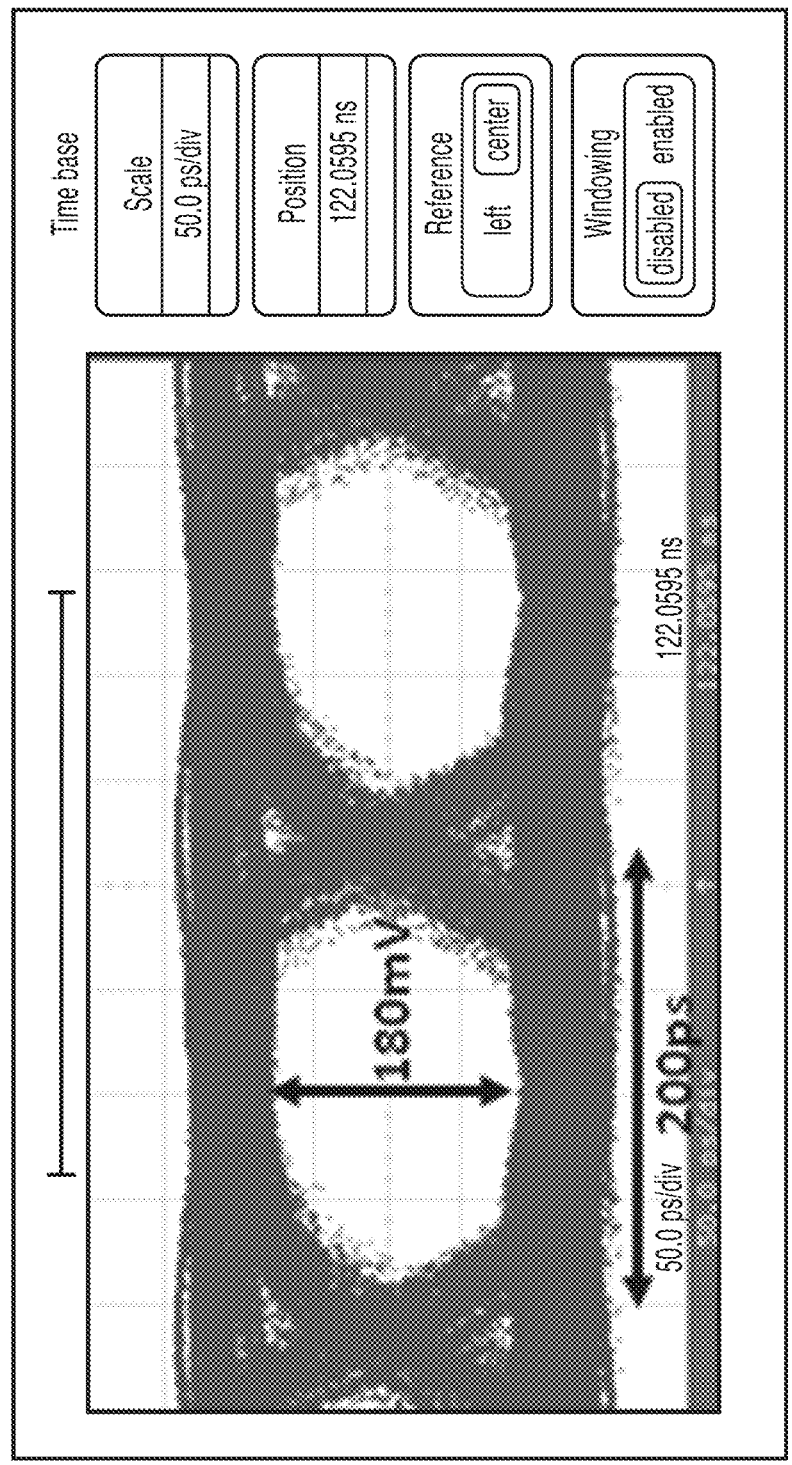
FIG. 12A through FIG. 12B are eye diagrams of baseband (BB) and radio frequency (RF) signaling according to an embodiment of the present invention.
Figure 12B:
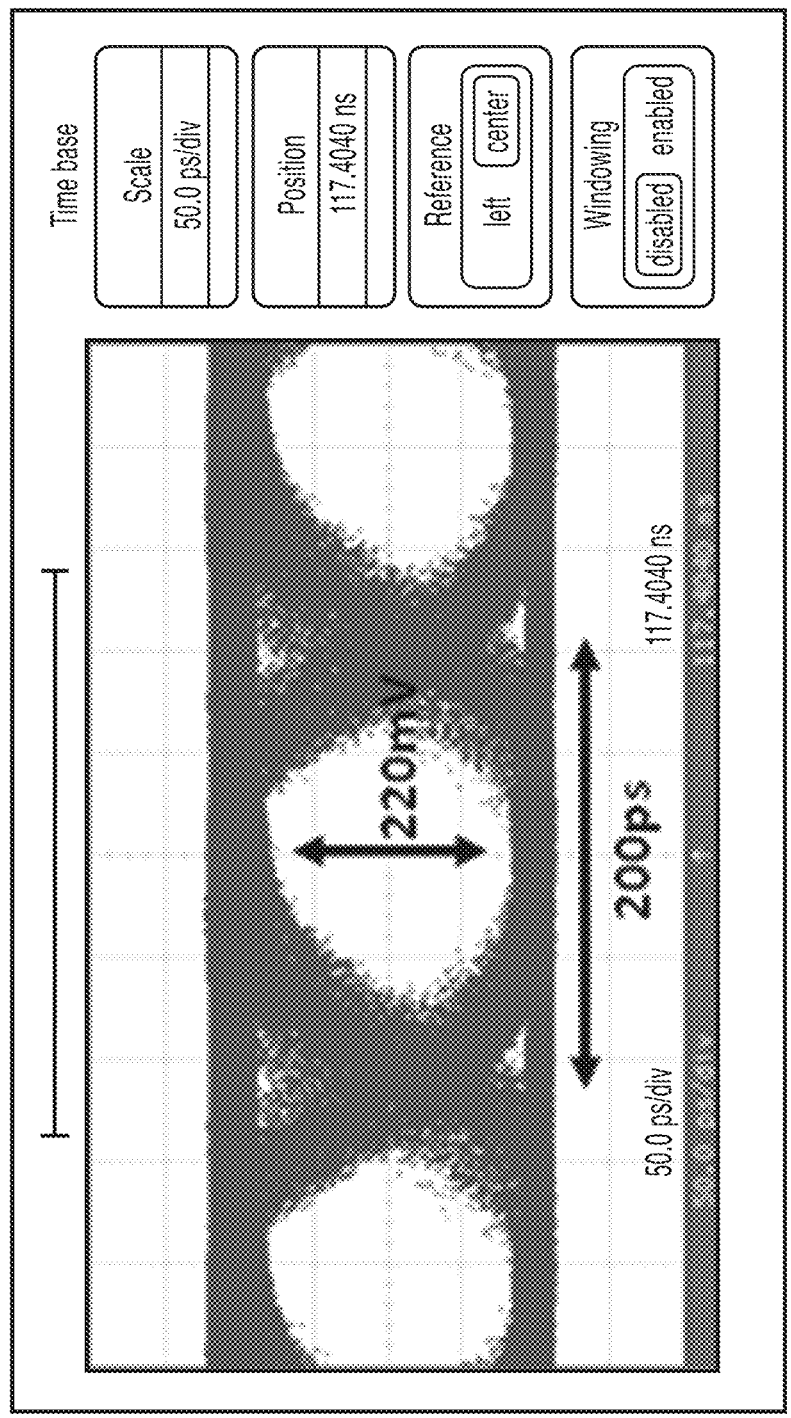

FIG. 12A through FIG. 12B depict measured 10 Gb/s/pin eye diagrams for BB in FIG. 12A and RF in FIG. 12B associated with the circuit shown in FIG. 10.

This invention is compatible with existing fabrication processes, as demonstrated by the embodiments described being realized in a 65 nm commercial CMOS process. The dual-band transceiver can be inserted between a microprocessor (or a memory controller, or other control circuit) and DRAMs, such as based on a DDR memory interface platform.

Potential advantages of the above aspects of the present invention include, but are not limited to: (1) ultra-high data rate, (2) overall power reduction, (3) Pad/pin/die/package size reductions, (4) increased signal integrity, (5) reconfigurable data communication, and (6) scalability.

The ultra-high data rate (1) is achieved in response to increasing aggregate data rate by a factor of N for chip-to-chip communications. The overall power reduction (2) is achieved in response to reducing the number of parallel high-speed channels by using simultaneous multi-channel data transactions through a shared off-chip transmission line to achieve overall cost reductions. The reductions in size and pads/pins (3) is achieved by reducing the number of data, address and command channels. The increased signal integrity (4) is provided in response to reducing noise sources (e.g., channel crosstalk) by reducing the number of parallel high-speed PCB lines, and power supply noise by reducing overall memory I/O interface power consumption. The configurability (5) of this data communication system is achieved as simultaneous multi-band data communications are enabled between a microprocessor and memories by shared off-chip transmission lines in contrast to use of conventional fixed chip-to-chip communication. The scalability (6) benefits are achieved because as CMOS technology continues to scale, the scalable OMRF-I transceiver can boost data rates of next generation DDR interfaces by inserting more RF bands above the baseband.

This aspect of the invention is advantageous because it offers scalable and CMOS compatible solutions to Double Data Rate (DDR) memory products, including state-of-the-art DDR3, next generation DDR4 prototypes, ultra high speed GDDR5 memories, next generation GDDR6, and other memory device technologies. Use of current state-of-the-art DDR I/O interfaces toward achieving 10 Gb/s/pin data rate of multipoint (or multi-drop) memory busses, would result in high operating power caused by pre-emphasis and equalization in transceivers, while lowering production yield caused by dramatically increased noises from crosstalk and power supplies of parallel bus. The present invention potentially alleviates all of these issues with an energy efficient solution.

One aspect of the present invention increases aggregate data rate by a factor of N while reducing energy-per-bit of an off-chip memory interface between a microprocessor, or other circuit such as a memory controller, and DRAMs by sharing the same physical transmission line between the traditional baseband and multiple RF-bands (N RF bands) within an ultra-high speed advanced memory I/O bus.

By way of example, and not of limitation, an embodiment of a dual (base+RF)-band interconnect (DBI) is described which enables a high throughput data rate with low power consumption operation in a DRAM I/O interface, such as in a portable DRAM based device. Unlike conventional baseband (BB) only signaling, the inventive DBI signaling utilizes both BB and RF bands for simultaneous dual data stream communications, but shares the common transmission line (T-Line). Instead of limiting the baseband operation within its linear-power-consumption region versus bandwidth, the interface bandwidth can be doubled by using DBI while still maintaining a linear power-consumption versus bandwidth curve for each of the dual bands.

Additionally, forwarded clocking is preferably incorporated within the source synchronous circuit, whereby the transmitter (TX) and receiver (RX) are all synchronized without the need of additional clock data recovery circuits. The inclusion of forward clocking in the DBI circuit enables bidirectional data links, while only necessitating a small increase in overhead. It should be appreciated that a memory controller (or microprocessor) contains an on-chip internal clock generator, such as a delay-locked-loop (DLL) or phase-locked-loop (PLL). An example of the clock generator is a reference clock of the DLL which can be forwarded directly to the memory side coupled to the memory controller (or microprocessor). The memory can directly utilize this clock for sampling the read/write data without the need of incorporating an on-chip DLL or PLL on the memory side. In applying these links to DRAM I/O data (DO) and command/address (C/A), DRAM access time can be greatly reduced by requesting DRAM read/write-operations simultaneously. Consequently, bi-directional DRAM I/Os can be performed with a significantly higher aggregate data rate (e.g., up to 10 Gb/s) while benefiting from lower operating power (e.g., approximately 2.5 mW/Gb/s).

Figure 13:
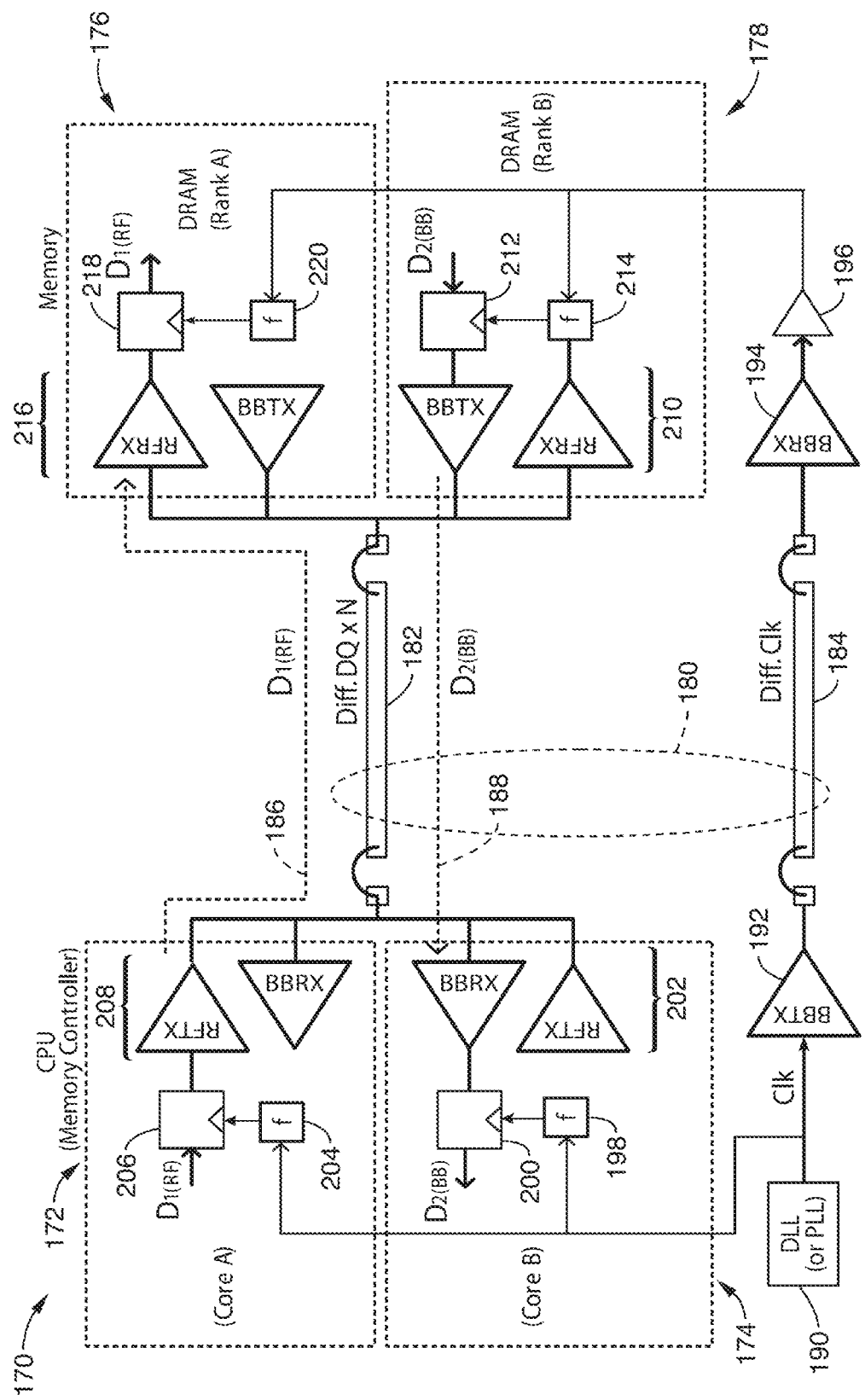
FIG. 13 is a schematic of a dual (base+RF)-band interconnect (DBI) based memory I/O interface according to an embodiment of the present invention, showing a forwarded clock utilized for simultaneous and bi-directional signaling.

FIG. 13 illustrates an example embodiment 170 of the dual band interconnect (DBI) showing Core A 172 and Core B 174 on the memory controller side which interface with DRAM Rank A 176 and Rank B 178 on the memory side through a physical chip-to-chip interconnection 180 comprising lines 182, 184. Logical data flow is represented with $D_{1(RF)}$ 186 and $D_{2(BB)}$ 188 shown directed in opposing directions. On the microprocessor, or controller, side is depicted a DLL or PLL 190 which is transmitted by BBTX 192 over transmission line 184 to BBRX 194 and buffer 196 for use in the memory devices 176, 178. It will be noted that this clock signal is shown utilized for clocking the input and output data via circuits 198, 204, 214, and 220 operating on D-flip flops 200, 206, 212 and 218.

Core B is shown with transceiver 202 having RFTX and BBRX, while Core A is shown with transceiver 208 also having RFTX and BBRX. On the memory side, Rank B is shown with transceiver 210 with BBTX and RFRX, while Rank A is shown with transceiver 216 having BBTX and RFRX. Both of these transceivers are shown coupled to N differential transmission lines 182.

Figure 14B:
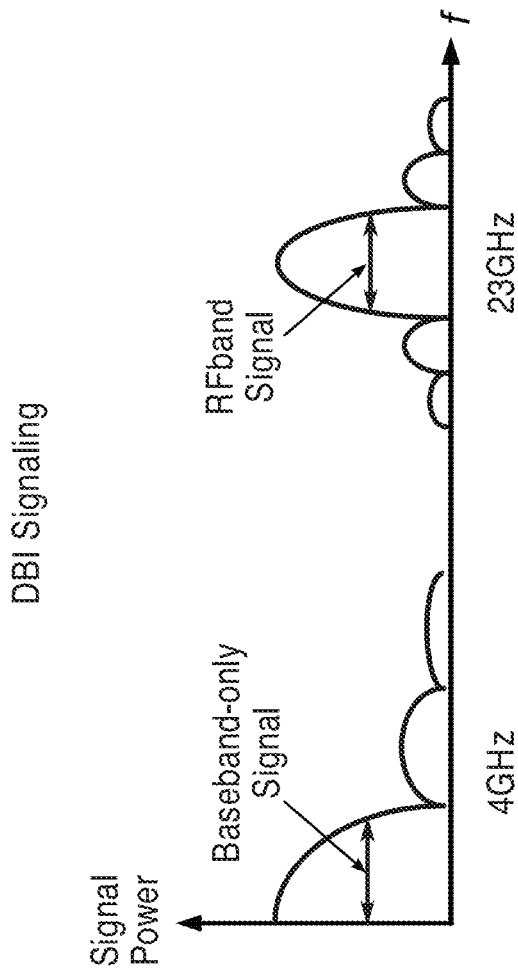
FIG. 14A through FIG. 14B are graphs of a baseband only signal in FIG. 14A, compared with dual (base+RF)-band Interconnect (DBI) showing both baseband (BB) and radio frequency (RF) signaling, according to an embodiment of the present invention.
Figure 14A:
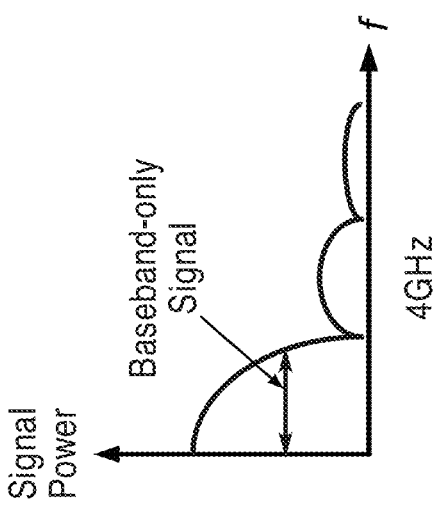

FIG. 14A through FIG. 14B illustrate a comparison between conventional baseband interconnection signaling in FIG. 14A, and a dual band interface in FIG. 14B according to an aspect of the present invention. The DBI circuit is capable of increasing data throughput in response to adding RF band signaling exemplified by the frequency envelope shown on the right side of FIG. 14B.

Figure 15A:
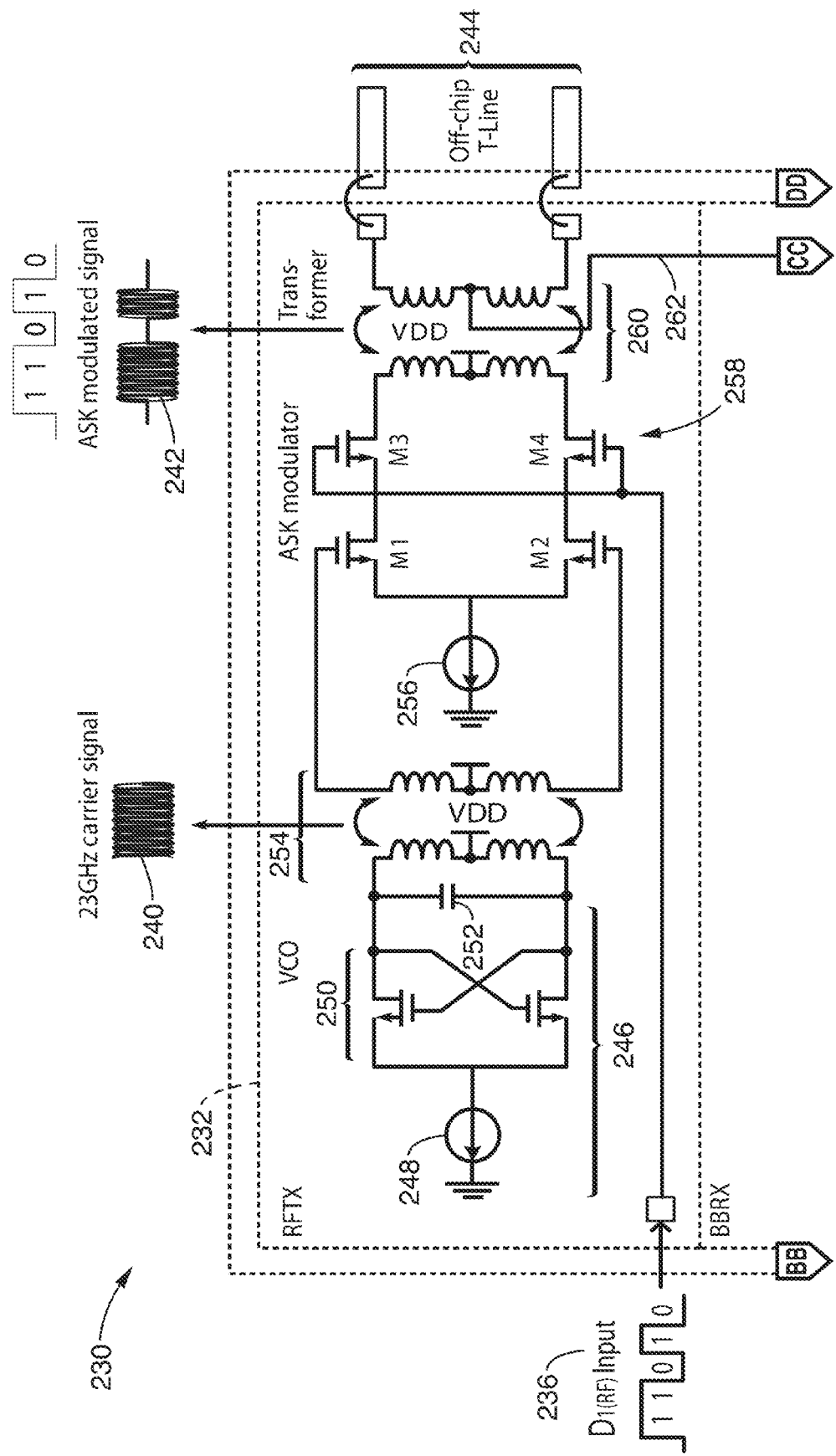
FIG. 15A through FIG. 15B is a schematic of a memory controller according to an embodiment of the present invention, showing a radio frequency (RF) transmitter and baseband (BB) receiver coupled to an off-chip transmission line.
Figure 15B:
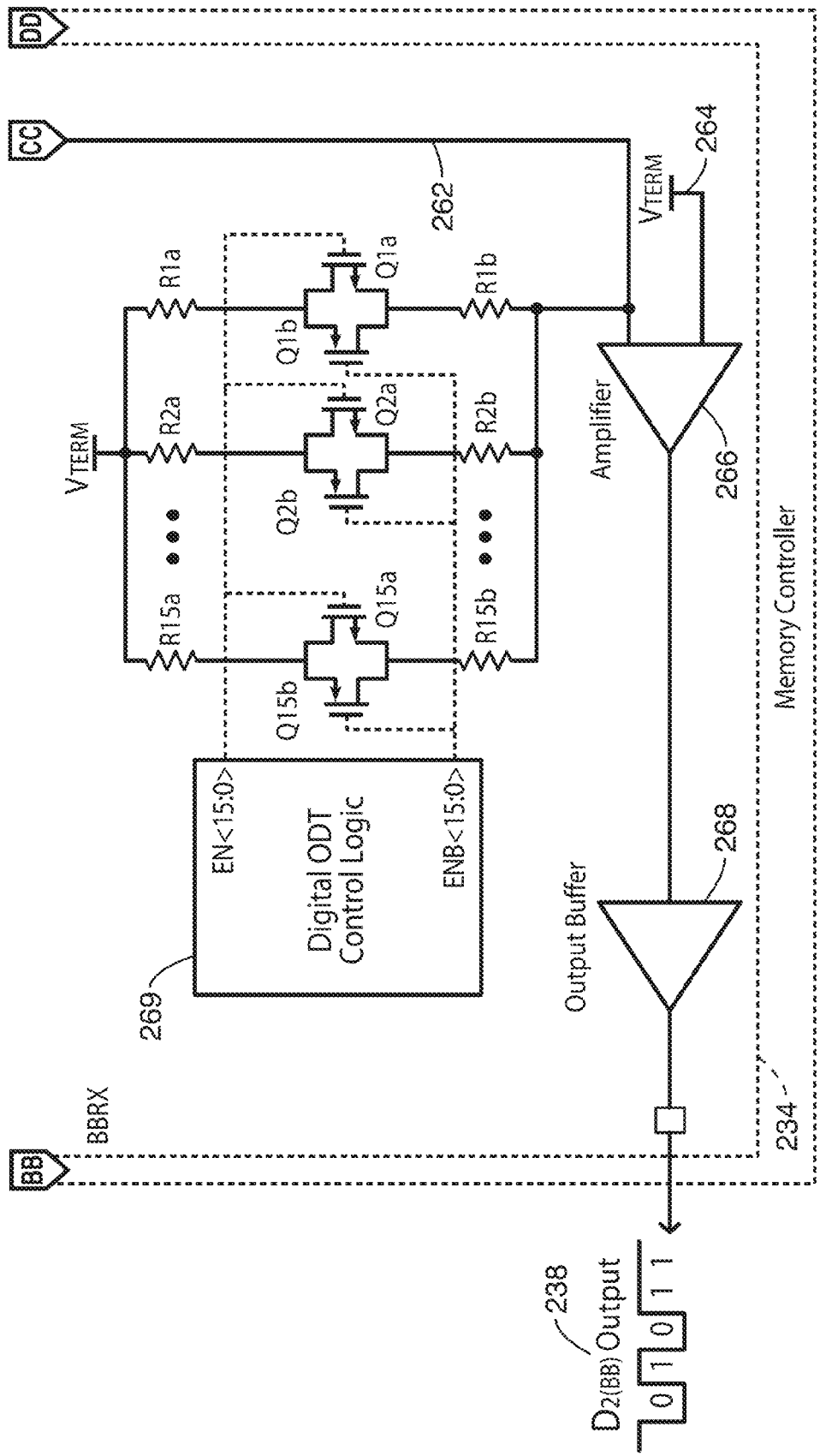

FIG. 15A through FIG. 15B illustrate an example embodiment 230 of a DBI transceiver on a memory controller side, showing an RF-band transmitter (RFTX) 232 and a baseband receiver (BBRX) 234. The DBI transceiver receives a data input $D_{1(RF)}$ 236, outputs a data output $D_{2(BB)}$ 238, utilizing intermediate RF carrier signal 240 which is amplitude shift keyed 242 and is output through off-chip transmission line 244.

The RFTX 232 comprises an LC tank VCO 246 shown with current source 248, oscillator circuit 250 of cross coupled transistors, capacitance 252 and inductance within transformer 254. Output from the VCO is modulated in response to amplitude-shift keying (ASK) and a frequency-selective transformer. In RFTX, the VCO first generates RF carrier at f2 (i.e., 23 GHz) 240 and continuously modulates transistors M1 and M2, whose output is then switched in response to data stream $D_{1(RF)}$ 236 through transistors M3 and M4, within transistor modulator section 258 that is fed by current source 256, and which outputs through frequency selective transformer 260 to generate ASK communication inductively coupled into off-chip T-Line 244. In one example implementation a frequency selective transformer may comprise two inductors of the transformer coupled to each other in a narrow band.

The BBRX section 234 amplifies the incoming data stream $D_{2(BB)}$, from transformer 260 with center tap signal 262, using buffers 266, 268. Buffer/amplifier 266 is shown with a reference $V_{TERM}$ (Voltage Termination) input 264, and coupled to an on die termination (ODT) to set the common mode voltage at the transformer center tap and remove the impedance mismatch. The ODT circuit is shown with digital OCT control logic 269 coupled to a series of transistor pairs Q1a, Q1b, Q2a, Q2b, through Q15a, Q15b with source/drain resistor pairs R1a through R15b coupled respectively to $V_{TERM}$ and one amplifier input.

Consequently, the DBI circuit transmits and receives $D_{1(RF)}$ and $D_{2(BB)}$ data streams concurrently under both differential (RF-band) and common (BB) modes. It should be appreciated that any inter-band interference generated in response to the simultaneous transmission of the dual band streams can be suppressed utilizing spectral separation and the orthogonal property between the differential and common mode signaling.

Figure 16A:
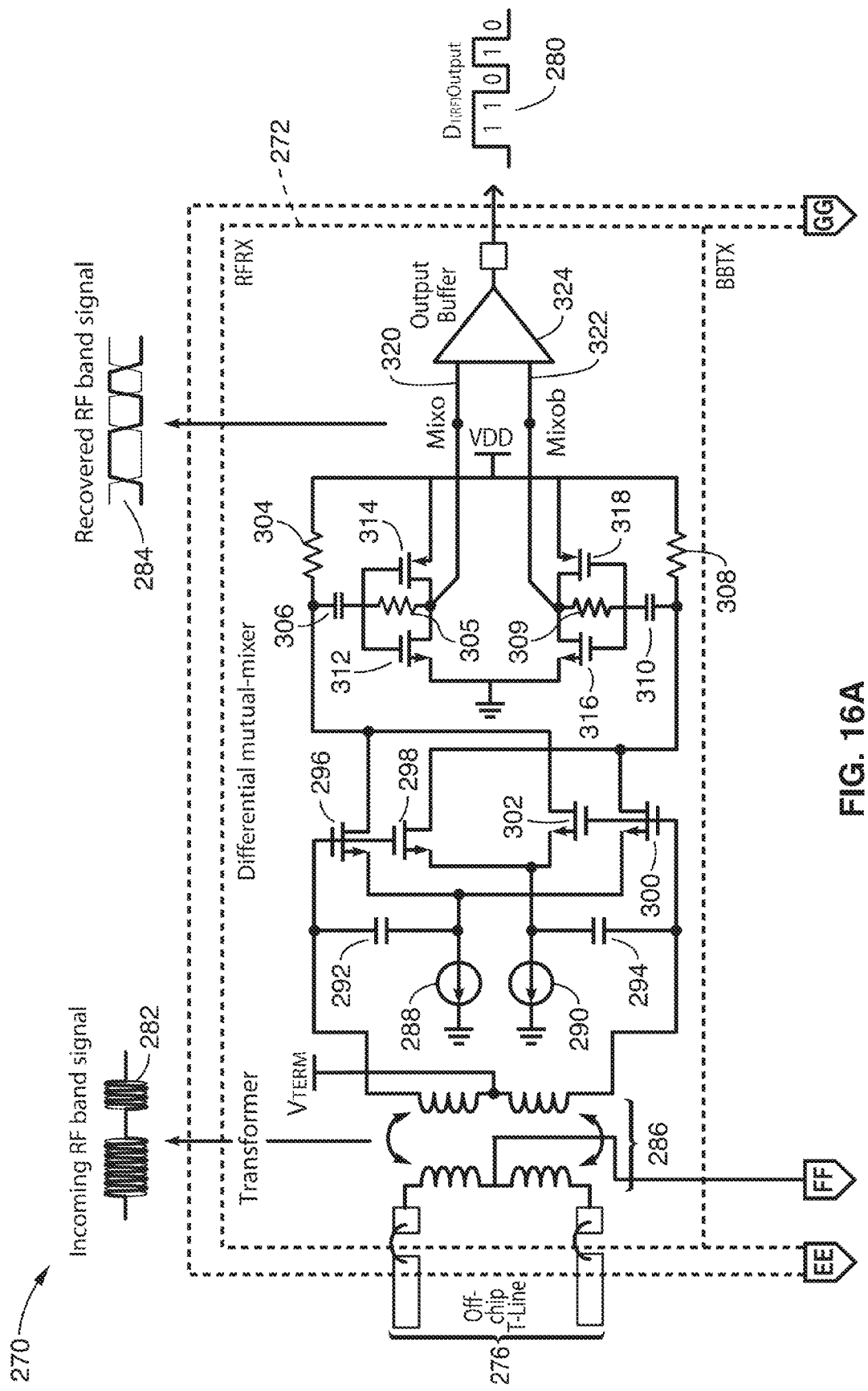
FIG. 16A through FIG. 16B is a schematic of a dual-band interconnect transceiver according to an embodiment of the present invention, showing a digital off-chip driver (OCD) impedance control logic.
Figure 16B:
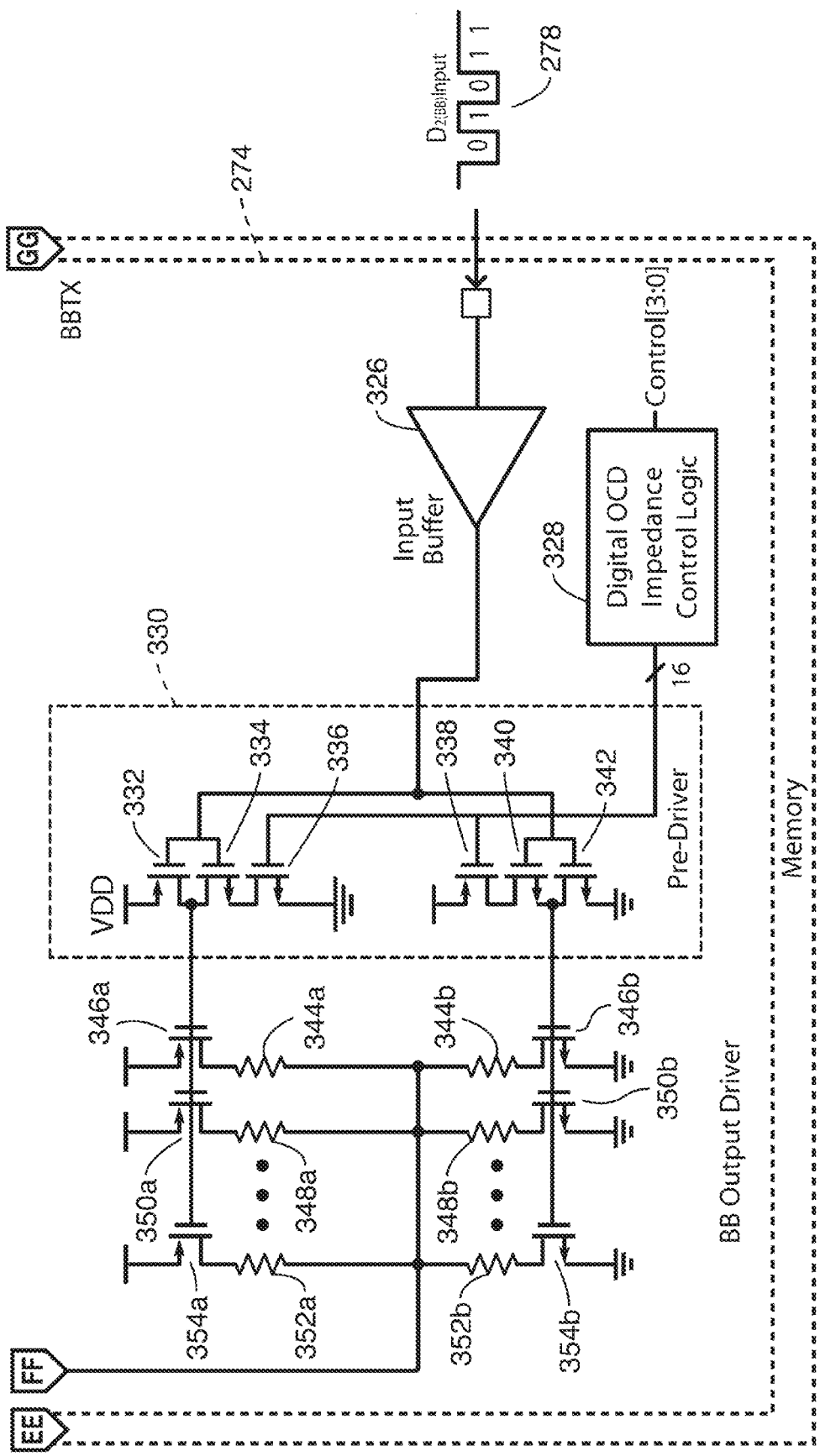

FIG. 16A through FIG. 16B illustrate an example DBI transceiver embodiment 270 on the DRAM memory side showing an RF-band receiver (RFRX) 272 and a baseband transmitter (BBTX) 274. The RFRX is connected to off-chip transmission line 276 over which it receives the data streams. The data streams are split into the BB and incoming RF-band signal 282 in response to the operation of an on-chip frequency-selective transformer 286, with center taps connecting to a terminating voltage $V_{TERM}$ and coupled to the baseband output driver circuits. The band-pass filtered RF-band data stream is then injected to the receiver differential mutual-mixer composed of a self mixer having bias current sources 288, 290 coupled through DC blocking capacitors 292, 294 to the gates of a self-mixer cross-coupled core comprising transistors 296, 298, 300 and 302, coupled to another stage through resistors 304, 305, 308, 309, capacitors 306, 310 and transistors 312, 314, 316, 318, whose recovered RF band signal 284, comprising output signals Mixo 320, Mixob 322, are connected to an output buffer 324 generating $D_{1(RF)}$ output 280. The termination voltage and the tail source current determine the operating point of the mixer. It will be noted that the above circuit utilizes a pair of resistor loaded switching devices and a class-AB amplifier with resistive feedback to further filter out the residue of the RF carrier with a sufficient gain (over the signal loss of a T-Line). By taking both active device and passive component parasitics into account, the mixer can be implemented with high signal integrity and high immunity to supply noise without the need of an extensive phase/frequency synchronization circuit.

The BBTX 274 receives the $D_{2(BB)}$ signal 278 by input buffer 326, the output of which is received, along with signals from digital OCD impedance control logic 328 by a pre-driver 330 of transistors 332, 334, 336, 338, 340 and 342 which outputs to a BB output driver. The on-chip driver (OCD) is based on impedance control logic to overcome impedance mismatch and reduce sensitivity to PVT variations. In the meantime, the BB output driver couples the data stream $D_{2(BB)}$ via the common mode (i.e., the center tap of the differential transformer) to the off-chip T-Line. By way of example the BB output stage is shown comprising a series of transistor-resistor push-pull pairs, exemplified as resistors 344a, 344b, 348a, 348b, and transistors 346a, 346b, 350a, 350b, continuing on to resistors 352a, 352b, and transistors 354a, 354b, with output connecting to the transformer 286 in FIG. 16A.

Since the RF-band in the DBI circuit can readily be applied to a high microwave frequency carrier to minimize inter-band interference, its signal bandwidth to carrier ratio becomes relatively small, whereby equalization is generally unnecessary. It should be appreciated that this dual (BB+RF) band circuit can be further extended to Base+Multiple-RF bands, wherein multiple data streams can be simultaneously transmitted through a shared memory I/O interface transmission line (T-Line), insofar as a multi-band coupling scheme is utilized. Furthermore, as the receiver mixer with differential input signals only senses amplitude of the incoming signal, frequency and phase synchronizations between RFTX and RX are not required. This greatly simplifies the overall memory I/O interface design. For the same reason, the bit error rate (BER) is expected to be less than that which is provided in response to the use of phase sensitive modulation schemes.

Figure 17A:
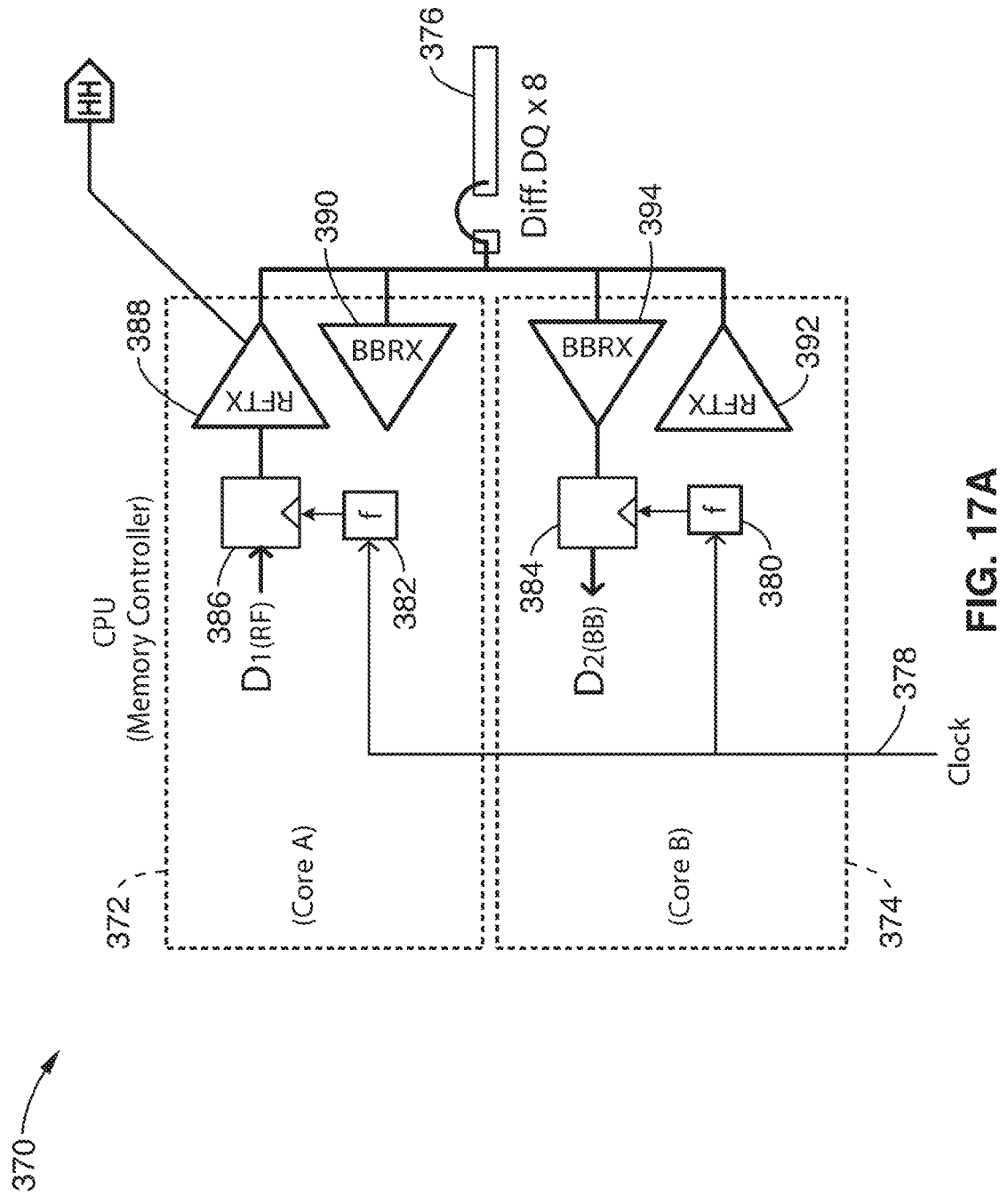
FIG. 17A through FIG. 17B are schematics of a dual-band interconnect and RF transmitter, respectively, according to an embodiment of the present invention.

FIG. 17A illustrates an example embodiment 370 of an 8 bit area-efficient DBI RF-band transmitter on the memory controller side having core A 372 and core B 374 coupled to eight off-chip differential transmission lines 376. In response to the inventive use of a single shared VCO driving eight ASK modulators, the overall area of byte-group DQ transmitters of a RFTX can be significantly reduced, making the approach particularly well-suited for use in memory I/O interfaces, such as memory I/O within portable systems. A clock is seen coupled through flip-flops 380, 382 to control D flip flops 384, 386 to synchronize data on a first transceiver in core A comprising RFTX 388 and BBRX 390, and a second transceiver in core B comprising RFTX 392 and BBRX 394.

Figure 17B:
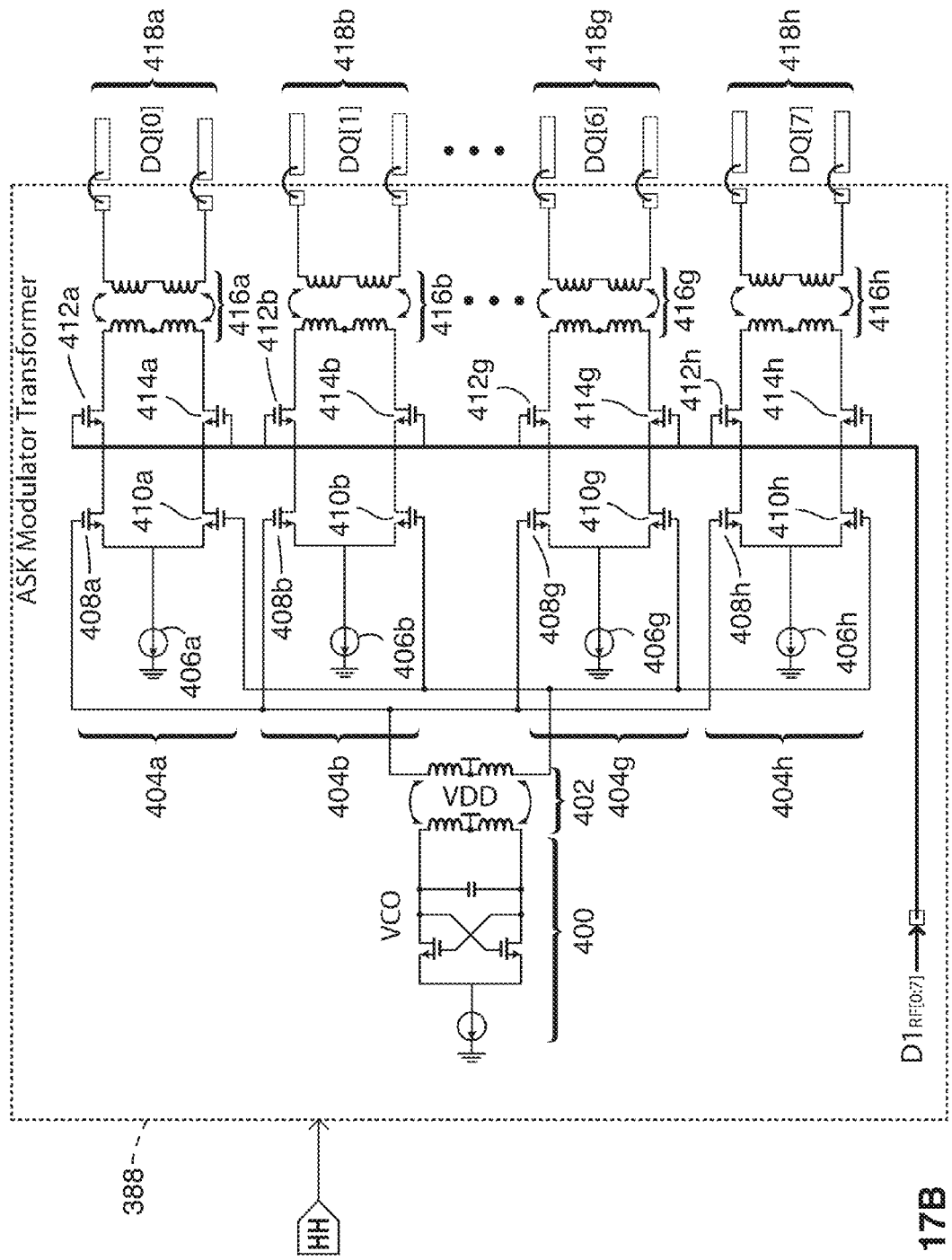

FIG. 17B illustrates an example embodiment 388 of the RFTX shown in FIG. 17A. A carrier frequency is generated by VCO 400, shown comprising a current source, two transistors, a capacitor, and the inductors of transformer 402 as previously described in FIG. 2A. A series of eight ASK modulation circuits (404a, 404b through 404g, 404h) are shown each comprising a source current (406a, 406b, through 406g, 406h), pass transistors (408a, 410a, 408b, 410b through 408g, 410g, 408h, 410h), output from which are modulated by the data $D_{1(RF)}$ signal driving the switching of push-pull transistors (412a, 414a, 412b, 414b through 412g, 414g, 412h, 414h), coupled through respective transformers (416a, 416b, through 416g, 416h) to respective transmission line output pairs (418a, 418b, through 418g, 418h) as data lines DQ[0] through DQ[7]. It will be noted that for a byte group (8 bit data=8 DQs), one shared VCO can drive an 'ASK' transmitter for ultra-low power operation.

FIG. 18A-18K depict simultaneous and bi-directional waveforms and frequency responses when the DBI transceiver circuits described in FIG. 15 and FIG. 16 are coupled on either end (controller side and memory side) of the off-chip transmission line. FIG. 18A through FIG. 18D are shown for the controller side with RF transmitter (RFTX) and baseband receiver (BBRX), while FIG. 18E through FIG. 18K are shown for the memory side having an RF receiver (RFRX) and baseband transmitter (BBTX).

Figure 18A:
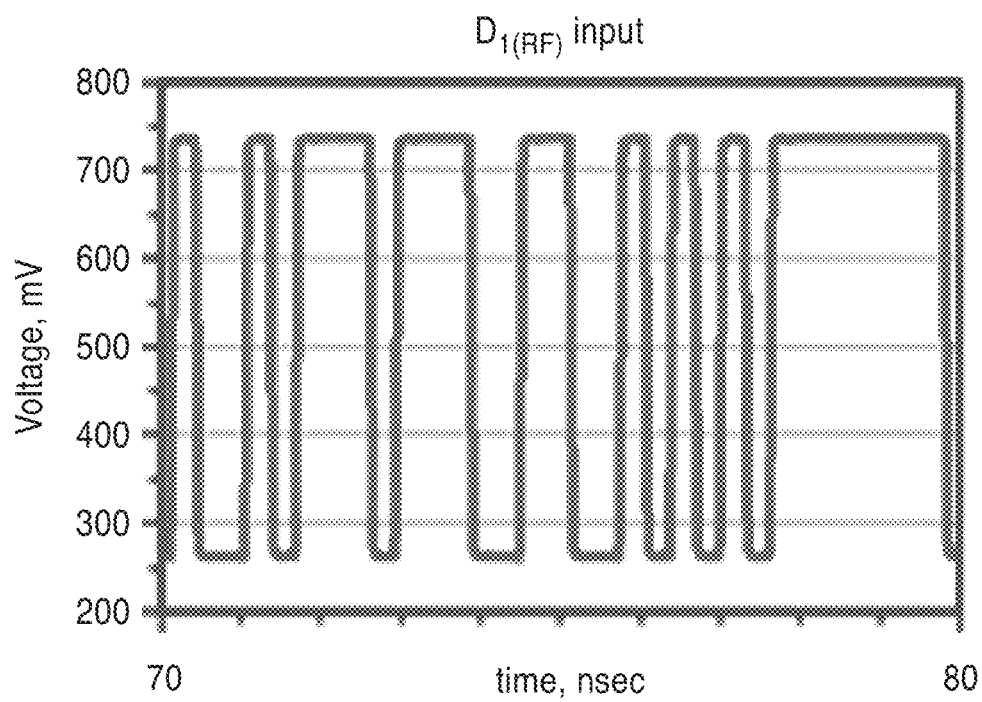
FIG. 18A through FIG. 18K are waveforms for signals on a DBI transceiver system according to an embodiment of the present invention.
Figure 18B:
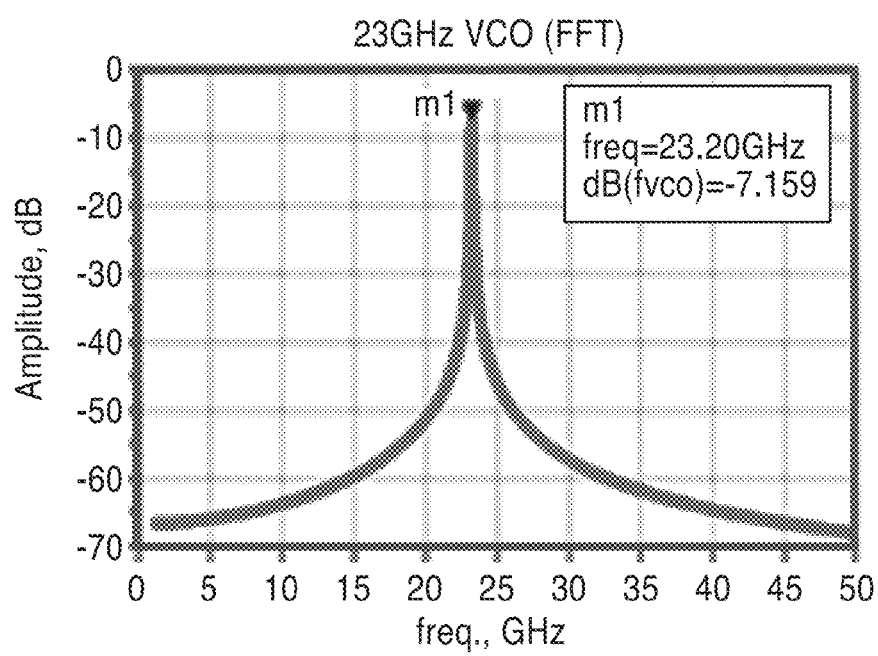
Figure 18C:
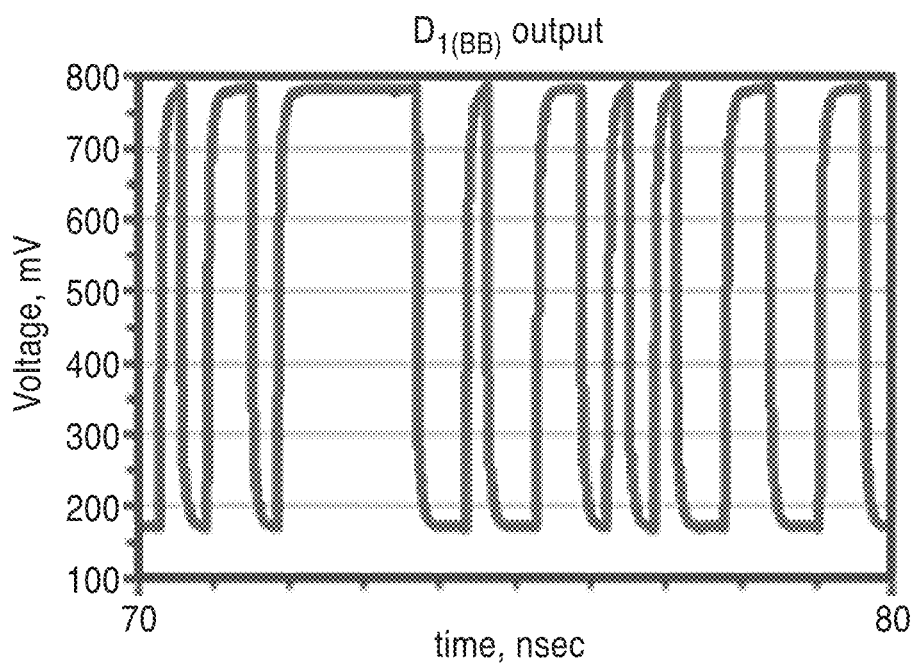
Figure 18D:
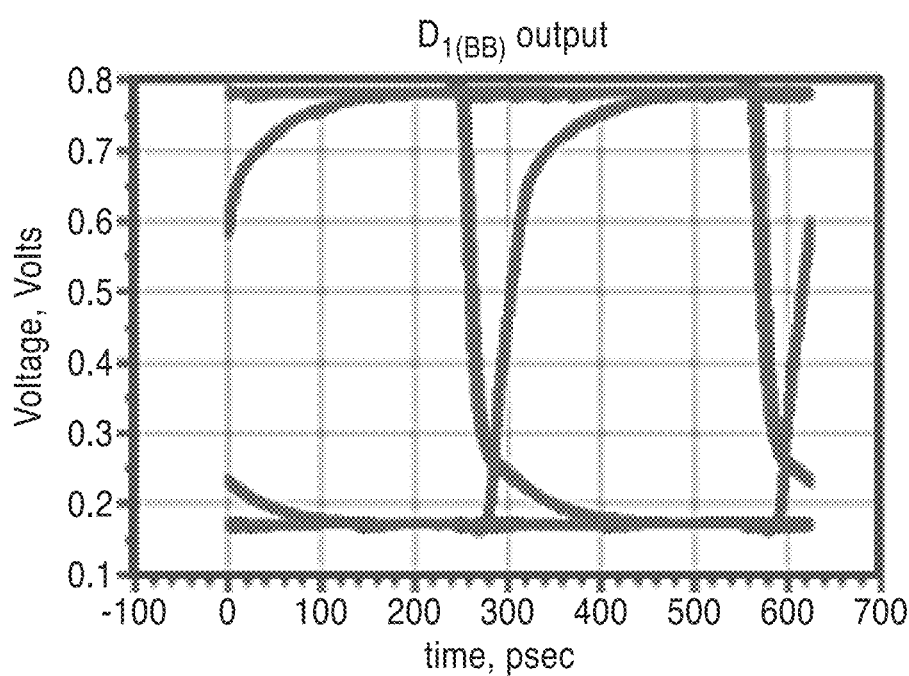

FIG. 18A depicts the RF data signal ($D_{1(RF)}$) input to RF transmitter, which as shown as input 236 in FIG. 15. FIG. 18B depicts the power spectrum of the VCO which generates the f2 RF carrier, exemplified as 23 GHz measured at transformer 254 of FIG. 15. FIG. 18C depicts the baseband data signal ($D_{1(BB)}$) output as binary data shown as signal 238 in FIG. 15, while FIG. 18D is an eye diagram of the same baseband data output.

Figure 18E:
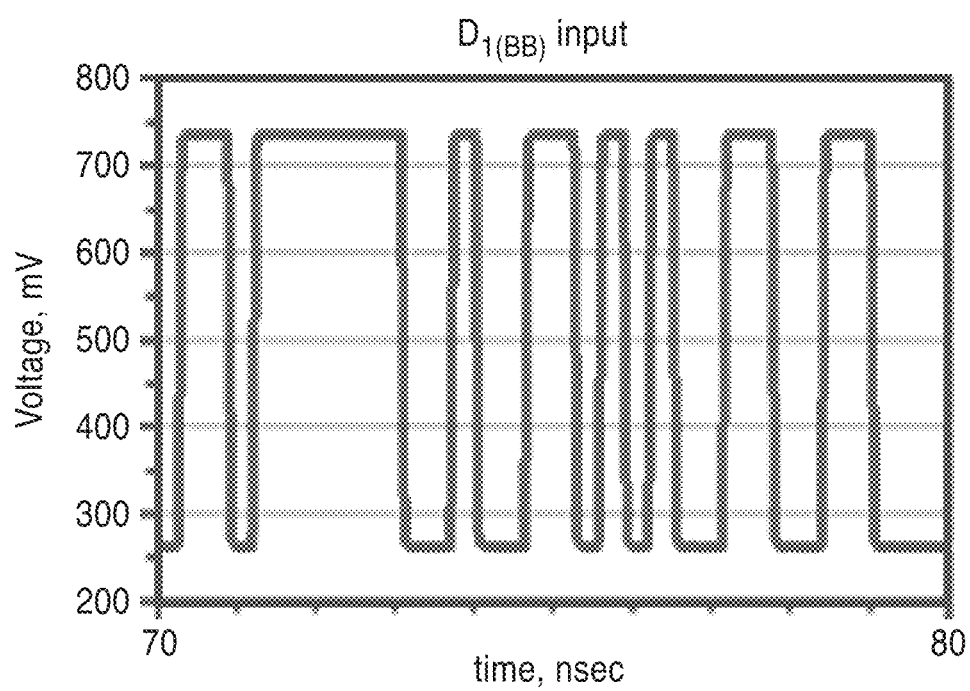
Figure 18F:
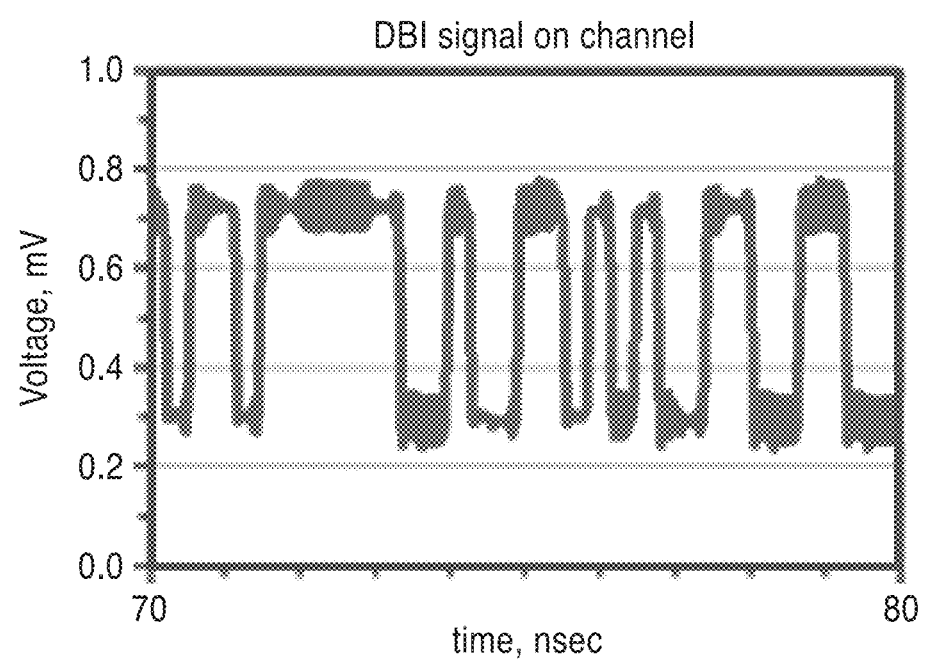
Figure 18G:
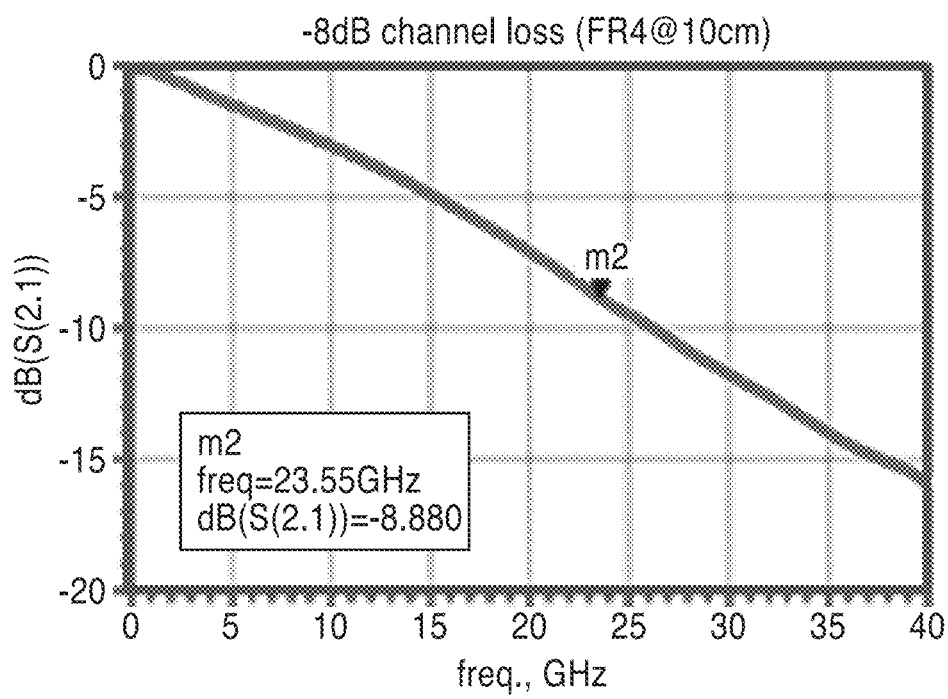
Figure 18H:
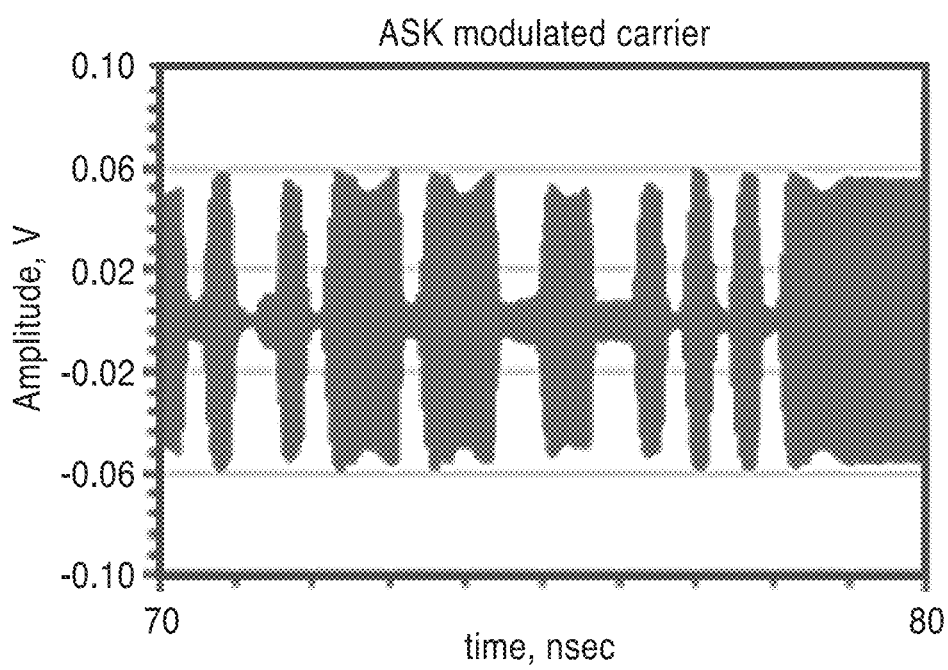
Figure 18I:
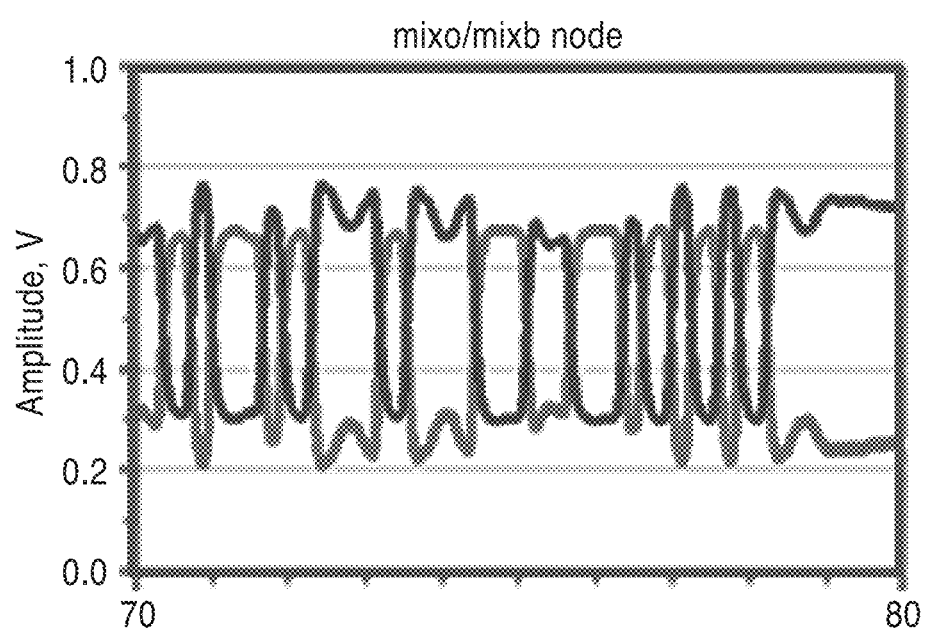
Figure 18J:
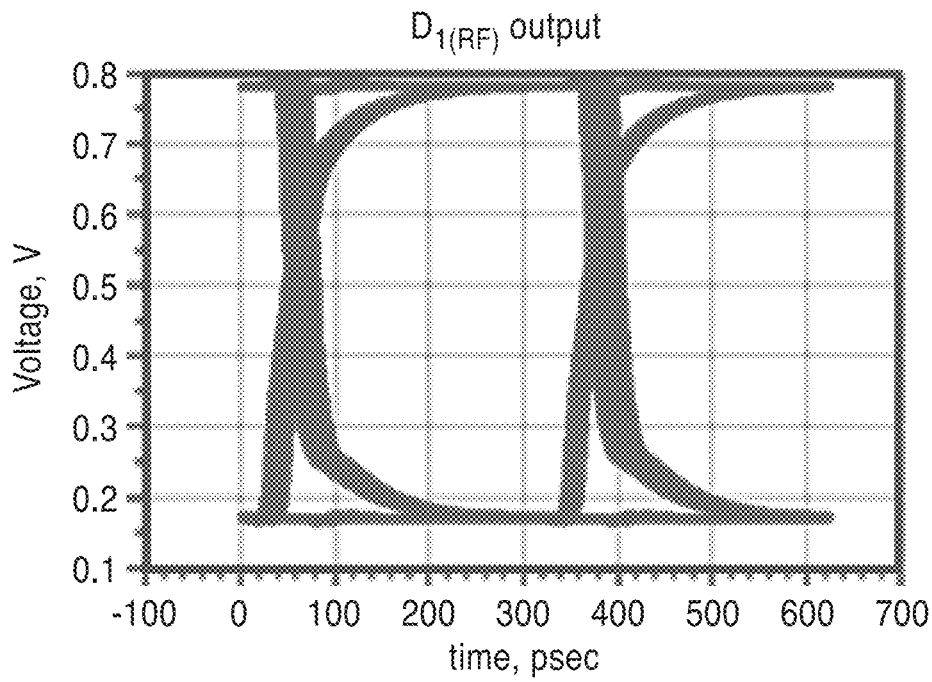
Figure 18K:
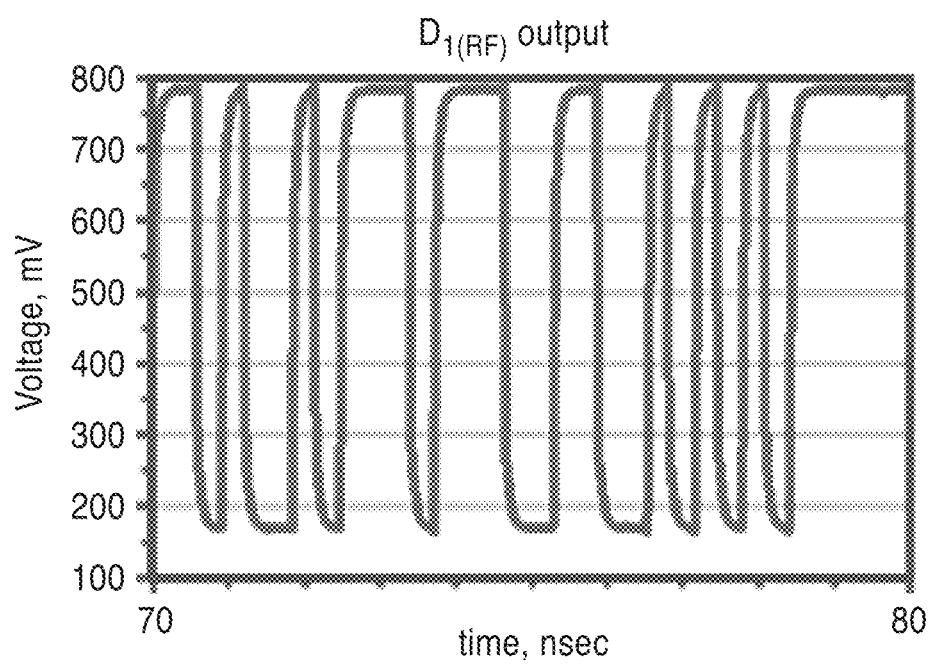

On the memory side FIG. 18E depicts baseband data signal ($D_{1(BB)}$) binary input. FIG. 18F and FIG. 18G show the signal on the off-chip transmission line (244 in FIGS. 15 and 276 in FIG. 16), representing the waveform with respect to time, and channel loss, respectively. It will be noted that the level of signal loss of an FR4 10 cm physical wire is −8.8 dB and the modulated RF signal is recovered to baseband data through the proposed differential mutual-mixer with a 12.7 dB gain. FIG. 18H depicts the amplitude shift keyed (ASK) modulated carrier as seen at transformer 286 in FIG. 16. FIG. 18I depicts output of the differential mutual mixer, as would be seen between signal lines 320, 322 of FIG. 16. FIG. 18J and FIG. 18K illustrate the RF output ($D_{1(RF)}$), showing an eye diagram and waveform respectively, as would be measured at output 280 in FIG. 16.

Figure 19A:
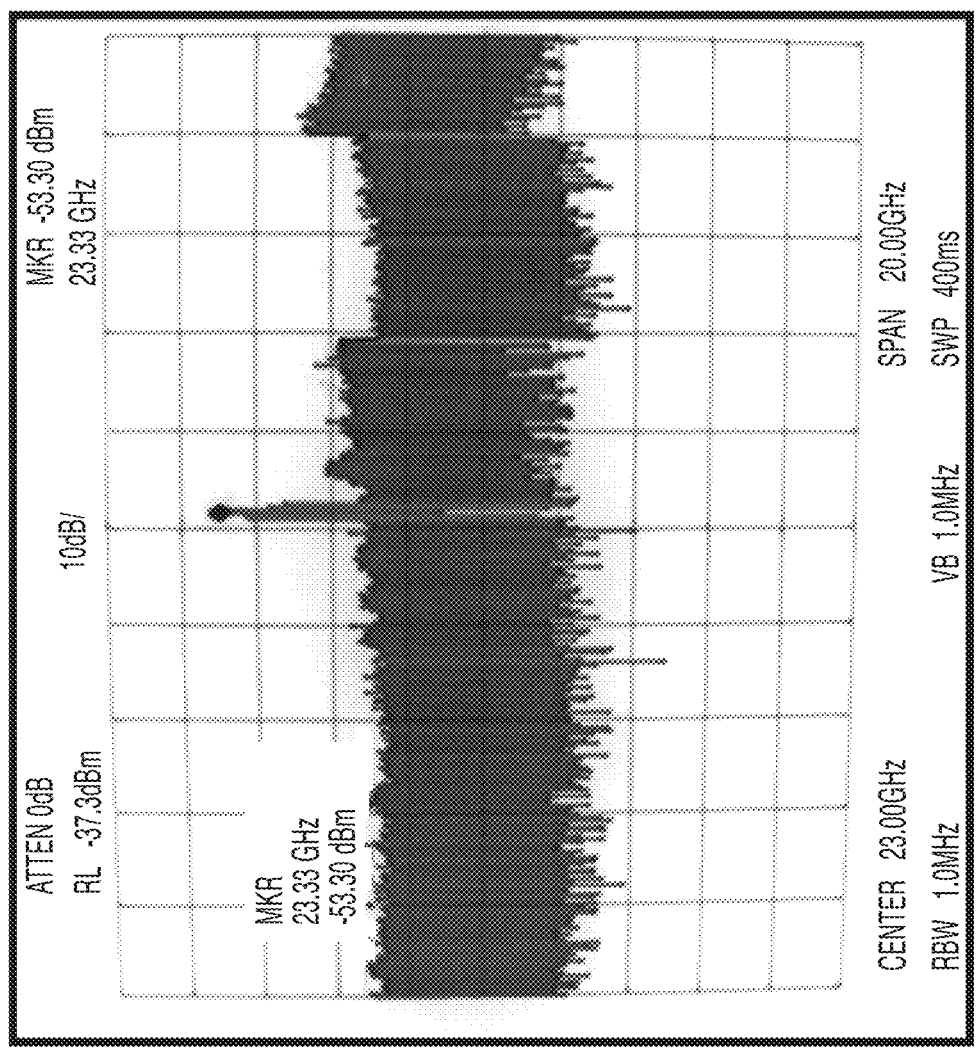
FIG. 19A through FIG. 19B are waveform images showing measured RF-band carrier and dual-band waveforms as generated, according to an embodiment of the present invention.
Figure 19B:
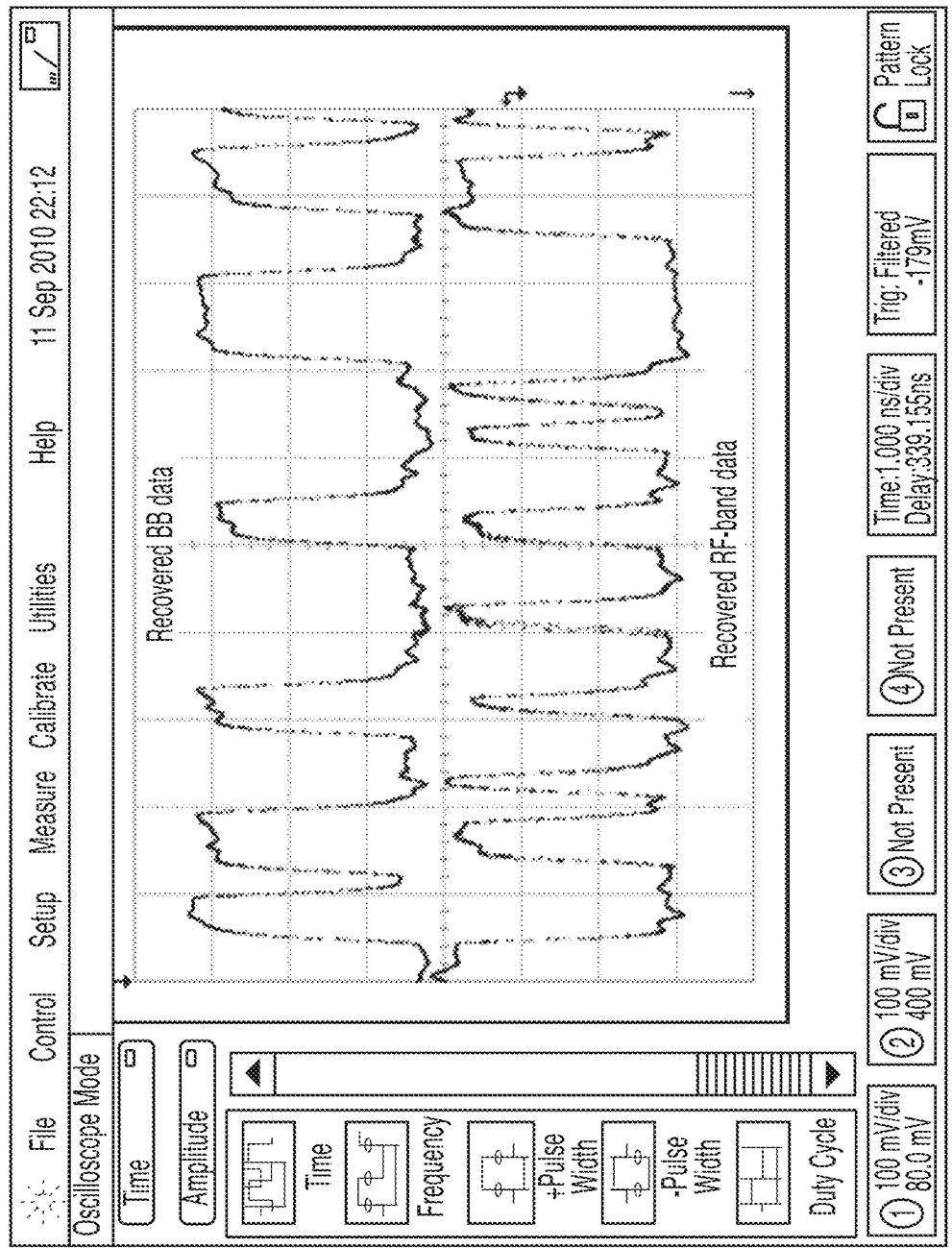

FIG. 19A through FIG. 19B illustrate measured waveforms for DBI showing frequency spectrum of the RF data at a carrier frequency f2 (23 GHz) in FIG. 19A, and recovered BB data stream (upper waveform) and RF data stream (lower waveforms) in FIG. 19B.

Figure 20B:
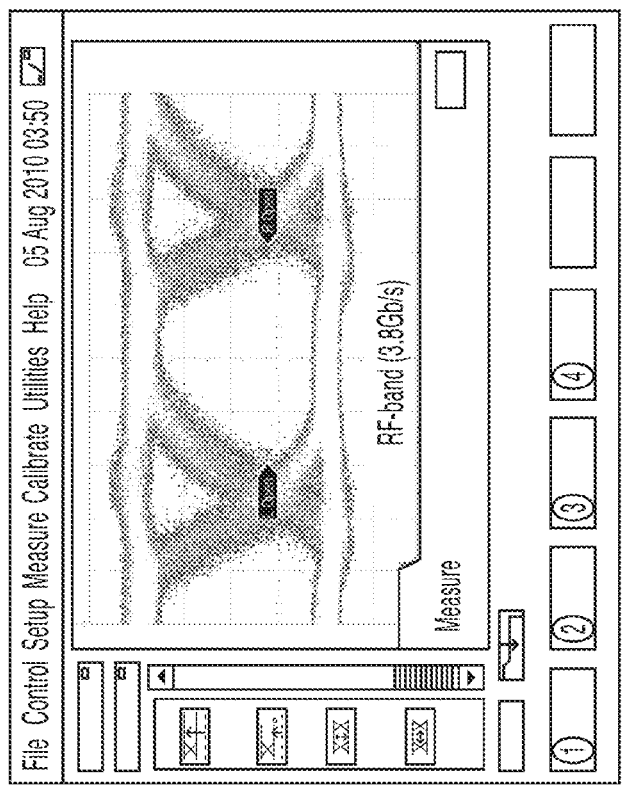
FIG. 20A through FIG. 20D are eye diagrams of two measured aggregate data rates for two different printed circuits operating according to an embodiment of the present invention.
Figure 20A:
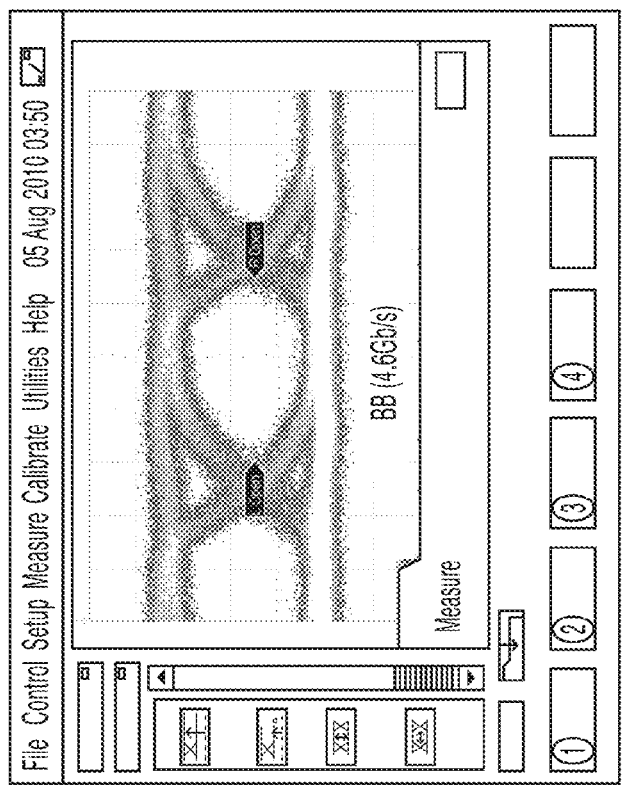

FIG. 20A through FIG. 20B depict measured eye diagrams of aggregate 8.4 Gbps (4.6 Gbps BB+3.8 Gbps RF-band) data throughput over a 10 cm T-Line on a FR4 board, showing baseband and RF-band, respectively.

Figure 20D:
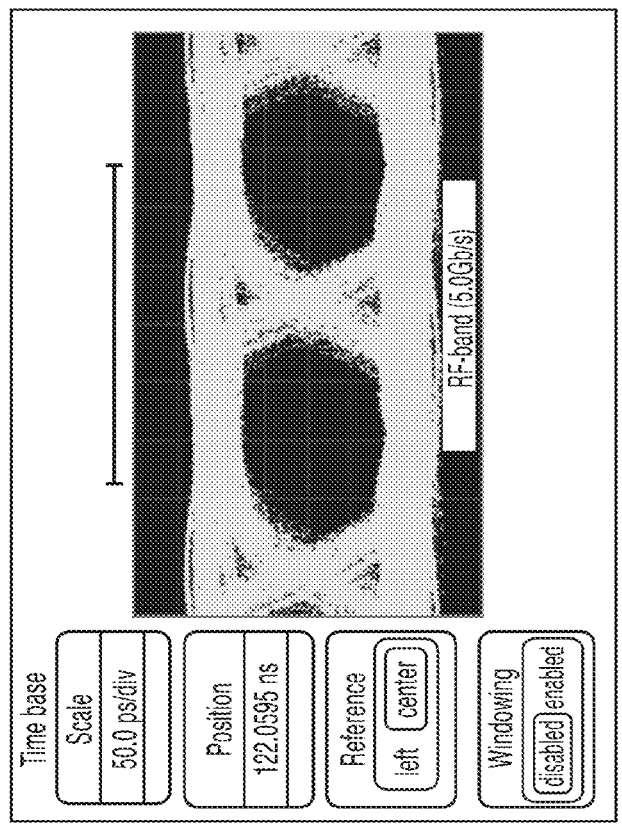
Figure 20C:
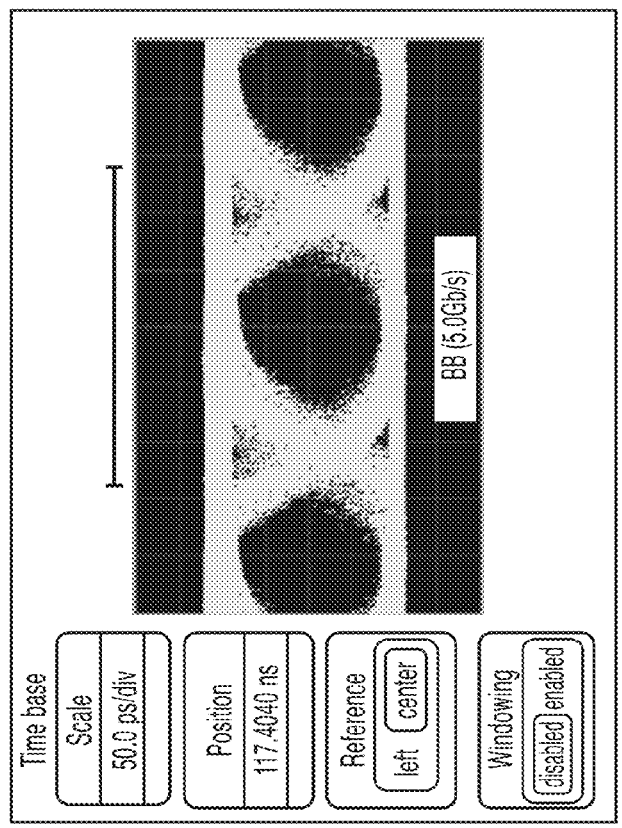

FIG. 20C through FIG. 20D depict measured eye diagrams of aggregate 10 Gb/s (5 Gb/s BB+5 Gb/s RF-band) over the same distance T-Line on a Roger 4003C board, showing baseband and RF-band, respectively. It should be noted that both of these waveforms are subject to a jitter performance which is less than 14 ps.

The dual-band transceiver can be inserted between microprocessor (or memory controller) and DRAMs to provide a DDR memory interface platform. It is seen that the fabricated DBI is particularly well-suited for this DRAM I/O interface, such as in portable devices, although it can be utilized to interface other chip devices which require high bandwidth interconnection. The example illustrates fabrication in a 65 nm CMOS commercial process, from which an aggregate data throughput of 8.4 Gb/s (FR4) and 10 Gb/s (Roger test boards) was obtained, with power consumptions of 21 mW and 25 mW, respectively. The bit-error-rates (BERs) for both of these test boards were measured at less than $1 \times 10^{-15}$ by using $2^{23}-1$ PRBS from the Agilent-70843C. The DBI exhibits the highest aggregate data throughput, best energy efficiency (~2.5 pJ/b) and smallest active die area. Table 6 compares DBI performance with that of previous memory devices.

Potential advantages of the above aspects of the present invention include, but are not limited to: (1) ultra-high data rate, (2) simultaneous and bi-directional mobile memory I/O interface, (3) reduced overall power consumption, (4) scalability, and (5) forward clocking for synchronous communication.

The ultra-high data rate (1) is achieved in response to increasing aggregate data rate by a factor of N for future mobile memory I/O interface. The simultaneous and bi-directional mobile memory I/O interface (2) operates in which DBI transceivers can reduce DRAM access time by requesting DRAM read/write operation concurrently. Overall power consumption is reduced (3) in response to the DBI circuit eliminating the need for power intensive pre-emphasis and equalization circuits. The DBI of this aspect of the invention is scalable (4) as it allows boosting data rate of next generation mobile memory I/O interface by inserting more RF bands above the baseband, and can be scaled to even high frequency operations. The forward clocking scheme (5) for the synchronous DBI communication, (a) eliminates the need for any phase (or delay) locked loop (PLL or DLL) on the memory side by simply buffering a forwarded clock to synchronize the DRAM TX, RX clocks; while it also (b) allows for quick DRAM power state transitions with low idle power consumption (on the DRAMs), which is suitable for ultra high speed memory I/O interfaces.

This aspect of the invention is advantageous because it offers scalable and CMOS compatible solutions to interfacing with ultra-high speed memory products, such as mobile memory systems. Toward achieving 10 Gb/s/pin data rate for multipoint (or multi-drop) memory busses, conventional state-of-the-art mobile memory I/O interfaces suffer from high operating power caused by pre-emphasis and equalization in transceivers, and slow DRAM power state transitions. The present invention overcomes these issues in an energy efficient solution.

This aspect of the invention describes a novel DIMM architecture with a multiband RF interface to provide high bandwidth, scalability, and low power.

Demand for off-chip bandwidth DRAM interconnections continue to grow as more memory cores are integrated onto a die. Traditional RC interconnects have numerous shortcomings and are thus insufficient to meet these demands. Emerging alternative interconnects, such as multiband radio frequency interconnect (MRF-I) described in previous sections, have the potential to provide sufficient bandwidth at a low power consumption to meet the demands of future multiple-core processors. This section details the benefits of using MRF-I for chip-to-DRAM communication in terms of higher throughput, low power, and better scalability to a many-DIMM DRAM system. An apparatus and method are described for reducing power consumption by approximately 60% over a traditional RC interconnect by using MRF-I. In addition, existing DIMM architectures are modified using MRF-I with MRF-DIMM according to the invention which increases throughput by 107% on average (up to 126%) in a 4-DIMM system and provides increased throughput per watt (by an average of 10%). A multiband tree DIMM architecture (MT-DIMM) is also taught that increases scalability, and which utilizes MRF-I in an inventive MT-DIMM that further increases throughput while maintaining low power consumption, and the ability to be scaled to an even larger number of DIMMs. Utilizing the DIMM tree architecture with MT-DIMMs increases throughput by 143% (up to 184%) on an 8-DIMM system with comparable throughput per watt. Scaling was demonstrated in scaling to 256 MT-DIMMs on a single channel with little degradation in throughput.

The "memory wall" problem, in which DRAM system performance has not been able to scale at the same rate as processor performance, has been an ever-increasing problem for micro-architects. This is further complicated with the emergence of chip multi-processors (CMPs). As scaling continues further with additional cores on a chip, a point is reached at which overall system performance cannot increase any further due to the limits of the DRAM system. For desktop and notebook systems, DRAM system performance is limited by DRAM bandwidth. For servers such as main memory database systems and so-called "RAMClouds", which are required to access large amounts of data quickly, DRAM system performance is limited by both DRAM bandwidth and capacity. It has been indicated that with enough capacity, DRAM can be utilized as permanent storage for data, thus eliminating the need for a hard drive while improving throughput and latency for data intensive applications by 100-1000×. Although there have been numerous advances in DRAM bandwidth and capacity over the years, there are significant tradeoffs between bandwidth, capacity and power. The progression of conventional DDRx DIMMs to higher and higher data rates has come at the cost of reduced DRAM system capacity. In response to that, FB-DIMM was created toward providing a high bandwidth, high capacity DRAM system; however, this is achieved at the cost of high power consumption. FB-DIMMs rely on serial links between CPU (memory controller) and memory. However, the power consumption of the buffer is very high on a high capacity DRAM system. To overcome this problem, industry developed novel emerging LR-DIMMs with moderate power increase and the ability to be pushed to higher capacities (up to about 8 to 16 DIMMS at max. Although LR-DIMM can provide improvement over FB-DIMMs they still suffer from inclusion of a limited number of DIMMs. This limitation is particularly troublesome on some system, such as cloud systems, which require using up to 32 or more DIMMs on the channel for the desired ultra-high capacity level.

The present aspect of the invention is a promising solution for providing high bandwidth at low power within a multiband radio frequency interconnect (MRF-I) capable of simultaneous transmission of multiple data streams over a single shared medium. This technology has the capacity to provide significant increases in power efficiency over traditional RC interconnects at high data rates beyond 3 Gbps/pin. However, as existing DRAM technologies operate at much lower data rates where MRF-I is not as power efficient. DDR3-1600 operates at 1.6 Gbps/pin. Therefore, in order to apply MRF-I to existing DRAM technologies, the power efficiency of MRF-I at these lower data rates should be improved. Once MRF-I becomes sufficiently power efficient for use in existing DRAM technologies, it is possible to utilize MRF-I's ability for simultaneous transmission of multiple data streams over a single shared medium to create novel DRAM architectures for high bandwidth and lower power systems.

The following sections describe utilizing MRF-I to create novel DIMM architectures for high throughput, scalability, and low power. The inventive apparatus and methods improve energy per bit of MRF-I at lower data rates required for existing DRAM technologies while providing reduced energy per bit. MRF-I, as described in previous sections, provides a 60% energy per bit reduction achieved over traditional RC interconnects.

The following describes application of MRF-I to a conventional DDR3 DIMM to create a multiband radio frequency interconnect DIMM (MRF-DIMM). MRF-DIMM uses MRF-I to create multiple logical channels over a single physical channel. MRF-DIMM increases throughput by 107% on average (up to 126%) in a 4-DIMM system while increasing throughput/watt by an average of 10%. MRF-DIMM is particularly well-suited for the desktop and notebook markets, where high throughput and low power are important.

A DIMM tree architecture is described consisting of tree DIMMs (T-DIMMs). By arranging the DIMMs as a tree, the number of DIMMs grows exponentially with each level of latency that is added. The DIMM tree architecture allows a DRAM system to scale to much larger capacities without degradation in throughput, which is ideal for servers that need to access large amounts of data quickly. A DIMM tree architecture consisting of the inventive T-DIMMs is able to scale to 64 DIMMs without significant throughput degradation.

This section also describes application of MRF-I to the T-DIMMs, creating MRF-I tree DIMMs, referred to herein as multiband tree DIMMs (MT-DIMMs), for higher throughput, lower power, and higher scalability than T-DIMMs. A DIMM tree architecture using MT-DIMMs is able to increase throughput by 143% (up to 184%) on an 8-DIMM system while increasing throughput/watt by 4% on average, and scaling beyond 256 DIMMs.

Multiband RF-I provides high aggregate bandwidth and power saving over traditional RC interconnects. MRF-I is realized via transmission of electromagnetic waves through multiple carrier channels over a shared transmission line, rather than the transmission of a voltage signal through a single baseband over a wire. In MRF-I, carrier waves are continuously propagated along the transmission line, and data is generated through either the amplitude or phase modulation of the carrier wave. MRF-I can therefore provide simultaneous transmissions of multiple data streams over a shared physical transmission line to improve the aggregate bandwidth and data rates. It should be noted that each data stream is herein referred to as an RF band.

Advanced off-chip MRF-I described in previous sections uses ASK modulation with differential signaling, referred to as ASK MRF-I. Since ASK MRF-I uses differential signaling, it utilizes two lines to propagate a signal. Differential signaling can provide higher signal integrity, leading to the use of higher data rates and a higher number of RF bands per pin overall. Using more RF bands per pair of differential lines also leads to reduced pin counts compared to traditional RC interconnects. ASK MRF-I can support multiple DIMMs (e.g., at least four) on a multi-drop bus operating up to 4 Gbps per RF band with two bands per pin. Work is continuing to further increase the number of RF bands per pin.

The area of the transceivers, including pads, for 8-bit baseband and RF-I transceivers is shown in Table 1 for a 65 nm process technology. The individual transceiver size can be obtained by taking the "area" and dividing by "#transceivers." In one aspect of the present invention, circuit area is reduced by fabricating the passive structures directly over the top of the digital logic circuits. Table 1 shows that as the number of RF bands per pin increases, the area shrinks significantly, and the number of pins is reduced.

Figure 21:
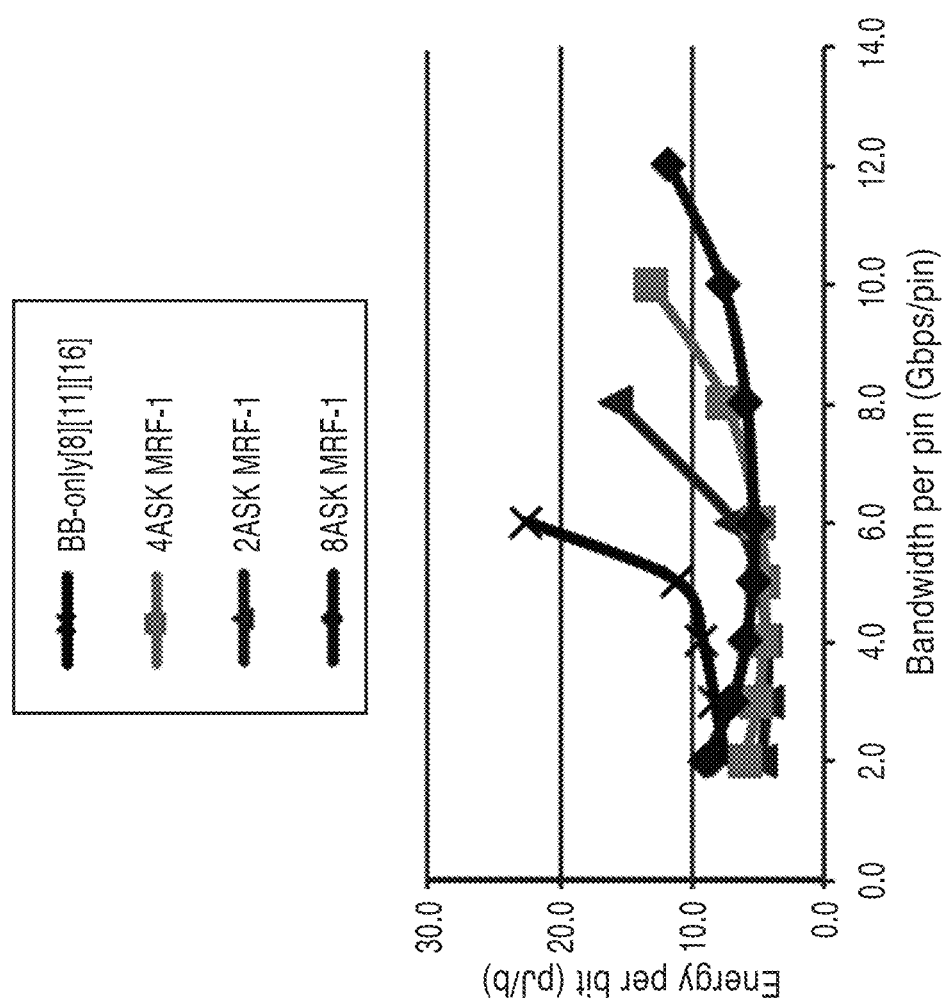
FIG. 21 is a graph of bandwidth and energy per pin for a typical interconnection mechanism.

FIG. 21 depicts energy per bit as bandwidth is increased, showing a comparison between MRF-I in comparison to a traditional RC interconnect, which is labeled as baseband (BB-only). BB is compared against 2, 4, and 8 RF-I bands per set of differential lines which are labeled as 2ASK MRF-I, 4ASK MRF-I, and 8ASK MRF-I, respectively. The power numbers for MRF-I were obtained from a highly accurate simulator, specifically "Spectre". As the baseband approaches 5 Gbps, the signal loss becomes so large that power-intensive circuit techniques of pre-emphasis and equalization must be used to compensate for signal loss, which leads to an exponential increase in energy per bit. By adding RF bands, the point where the power begins to increase exponentially can be extended. Therefore, the aggregate bandwidth can be increased with little reduction in energy efficiency simply by increasing the number of RF bands. This makes ASK RF-I ideal for technologies such as GDDR5 (7 Gbps) and DDR5 where high data rates are required.

While ASK RF-I as described in previous sections is very power efficient at high data rates, it is relatively inefficient at lower data rates required for existing DRAM technology, such as DDR3-1600 (1.6 Gbps). This section describes modifications to reduce power consumption at low data rates. The previously described ASK RF-I devices utilized one voltage-controlled oscillator (VCO) per pair of differential lines in order to produce the RF carrier.

Figure 22:
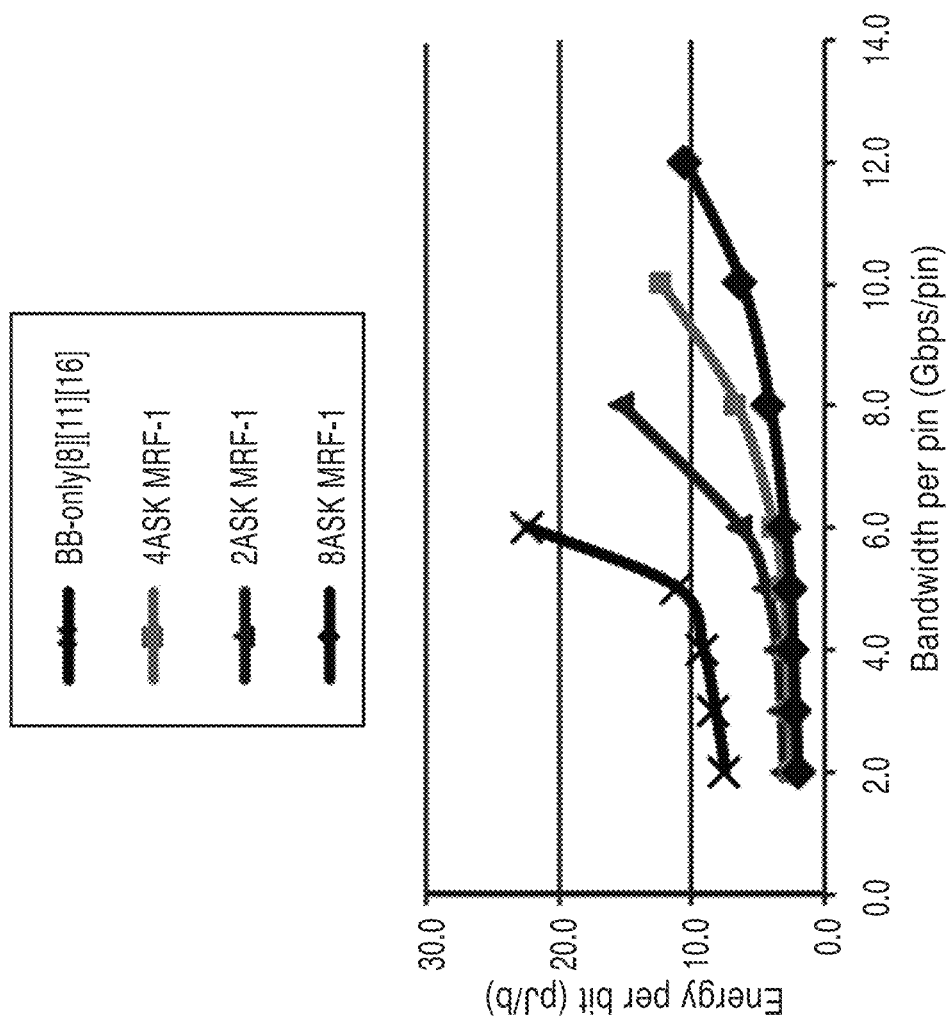
FIG. 22 is a graph of bandwidth and energy per pin for an interconnection mechanism according to an embodiment of the present invention utilizing a reduced number of VCOs.

FIG. 22 illustrates the bandwidth and energy per pin for an aspect of the invention which shares a single VCO among multiple pairs of differential lines. These simulations illustrate that a single VCO can be shared across up to 8 pairs of differential lines. Since a VCO is power intensive, this modification can result in substantial power savings overall, in addition to reducing overall size. The new energy per bit graph of FIG. 22 with this design modification shows that RF-I is far more power efficient than BB, reducing the power by 60% from BB.

Figure 23:
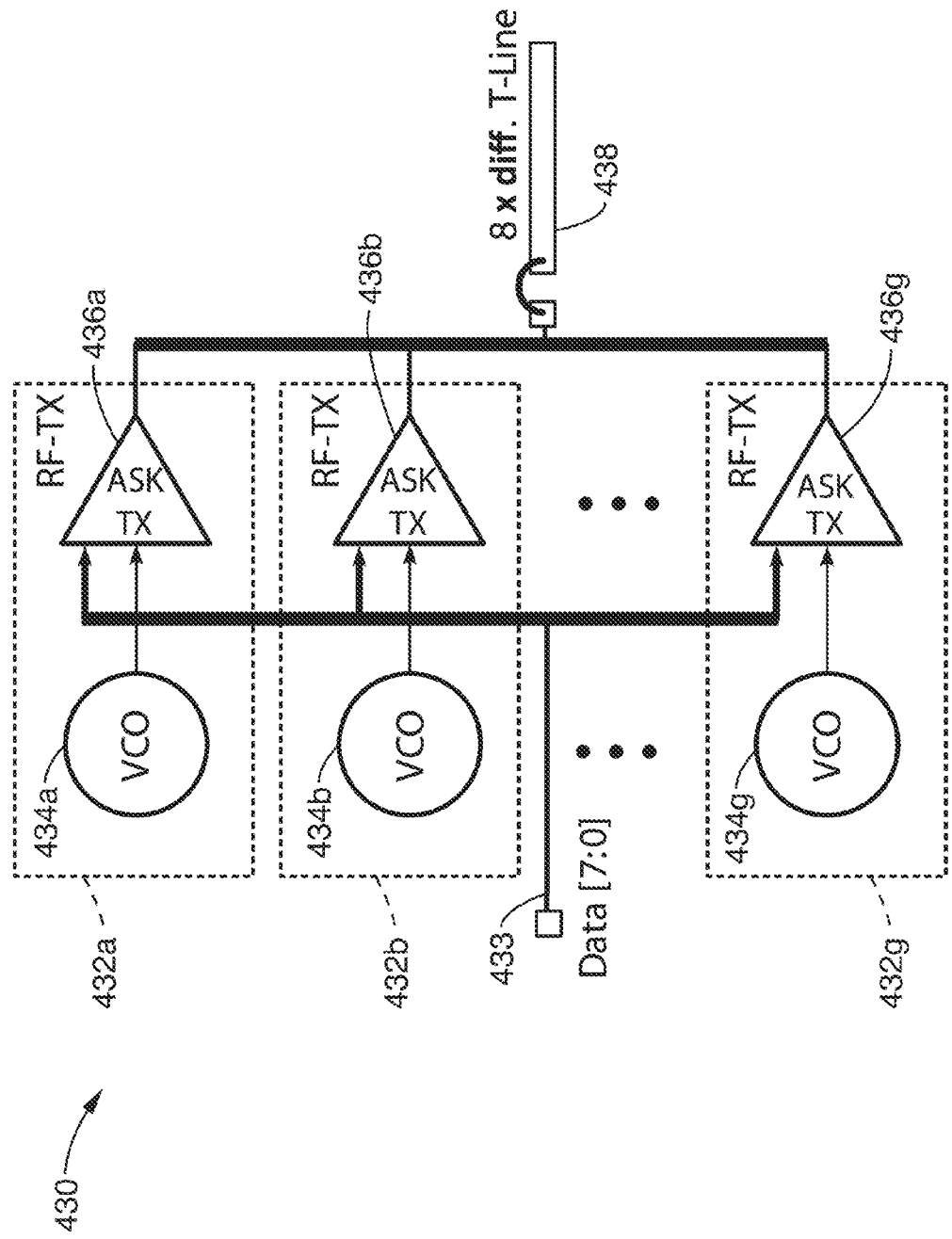
FIG. 23 is a schematic of a conventional off-chip interconnection showing multiple VCOs connected with one VCO per transmitter.

FIG. 23 illustrates an example MRF-I embodiment 430 as described in prior sections, utilizing one VCO (434a through 434g) per RF transmitter (432a, 432b through 432g) within each of which is shown the ASK TX (436a, 436b through 436g) shown for collectively receiving an RF data input 433, and outputting over multiple differential transmission lines 438.

Figure 24:
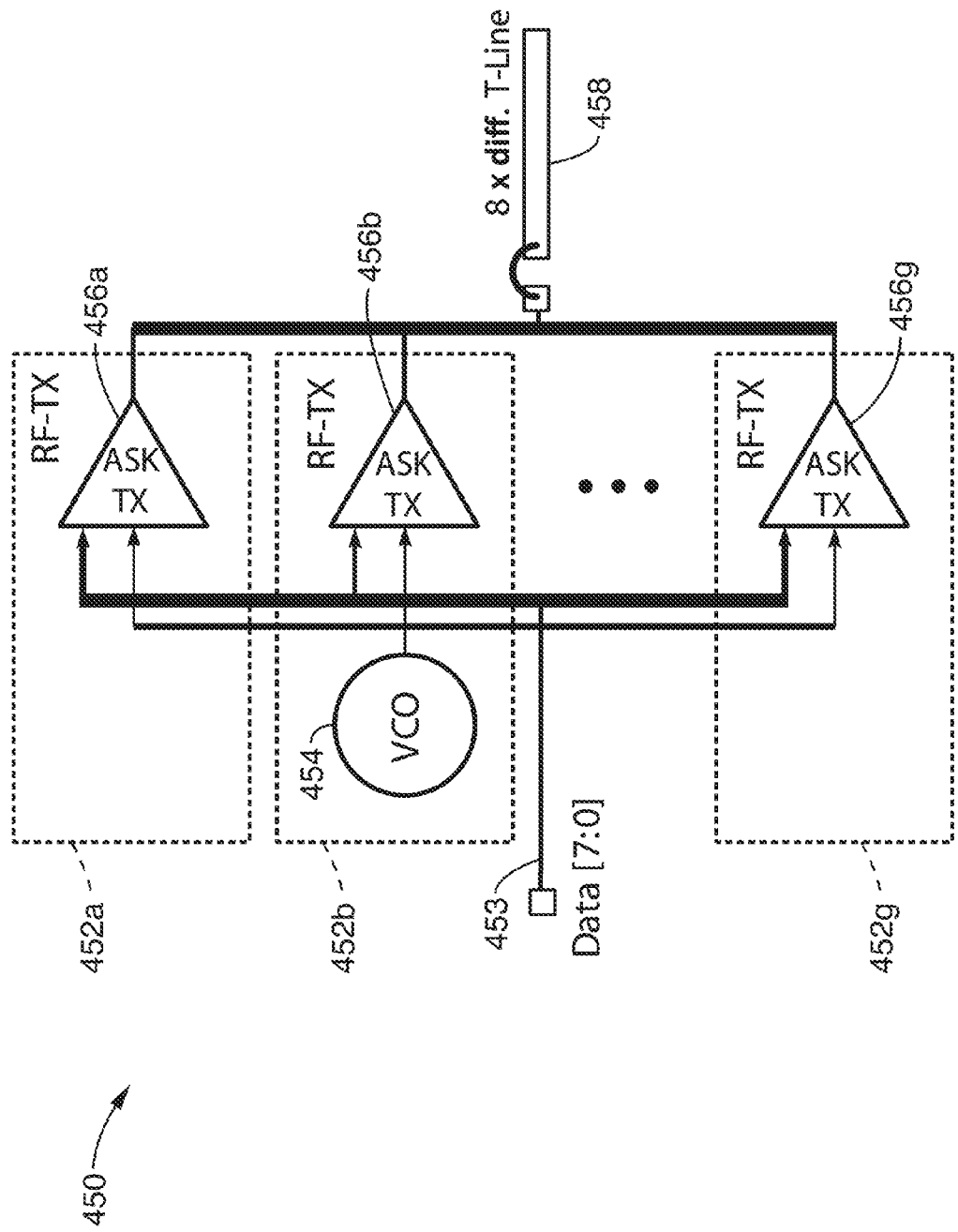
FIG. 24 is a schematic of an off-chip interconnection according to an embodiment of the present invention, showing only one VCO required per multiple transmitters.

FIG. 24 illustrates an example MRF-I embodiment 450 utilizing one VCO 454 shared for all RF transmitter (452a, 452b through 452g) within each of which is shown the ASK TX (456a, 456b through 456g) shown for collectively receiving an RF data input 453, and outputting over multiple differential transmission lines 458.

Following is a brief overview of existing DIMM technologies in order to understand the tradeoffs of MRF-DIMM, T-DIMM, and MT-DIMM.

Figure 25:
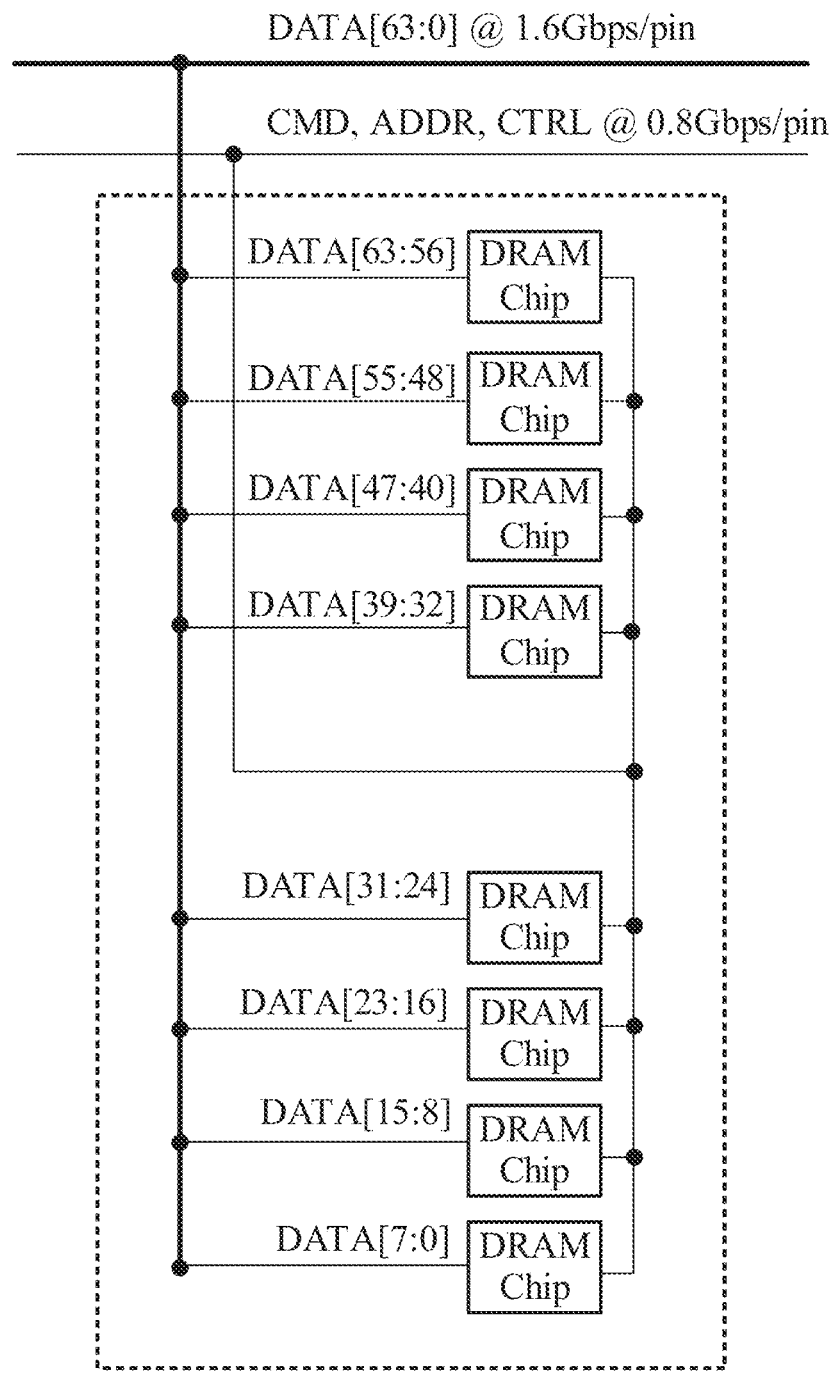
FIG. 25 is a schematic of a typical dual data-rate (DDR) dual in-line memory module (DIMM) showing multiple DRAMs accessed in parallel with an aggregate 64 bit data bus, with command, address and control signals connected to each of the DRAM chips.

FIG. 25 depicts a traditional DDRx DIMM consisting of multiple DRAM chips that are accessed in parallel. Simulations were performed assuming each DIMM contains 8 DRAM chips with each chip containing 8 data pins. A 64-bit data bus was formed by aggregating the data signals from each chip. Since the signals were aggregated from each chip to form the 64-bit data bus, each of the 64 data lines is connected to only one of the DRAM chips. However, each command, address, and control signal is connected to every one of the 8 DRAM chips on the DIMM. Therefore, if there were 4 DIMMs on a single multi-drop bus, then each data line would be connected to 4 DRAM chips, and each command, address, and control signal would be connected to 32 DRAM chips. This demonstrates how quickly the load on a multi-drop bus can increase, thereby degrading signal integrity. A conventional DDR3 DIMM setup can support up to 4 DIMMs on a single multi-drop bus. However, as data rates per pin increase, fewer DIMMs can be supported, since increasing data rate also degrades signal integrity. In this scenario MRF-I can provide significant benefits, since the next-generation DDR4 is supposed to operate at 3.2 Gbps/pin. As mentioned in the previous section, MRF-I can support at least 4 DIMMs on a multi-drop bus even at those higher data rates.

Figure 26:
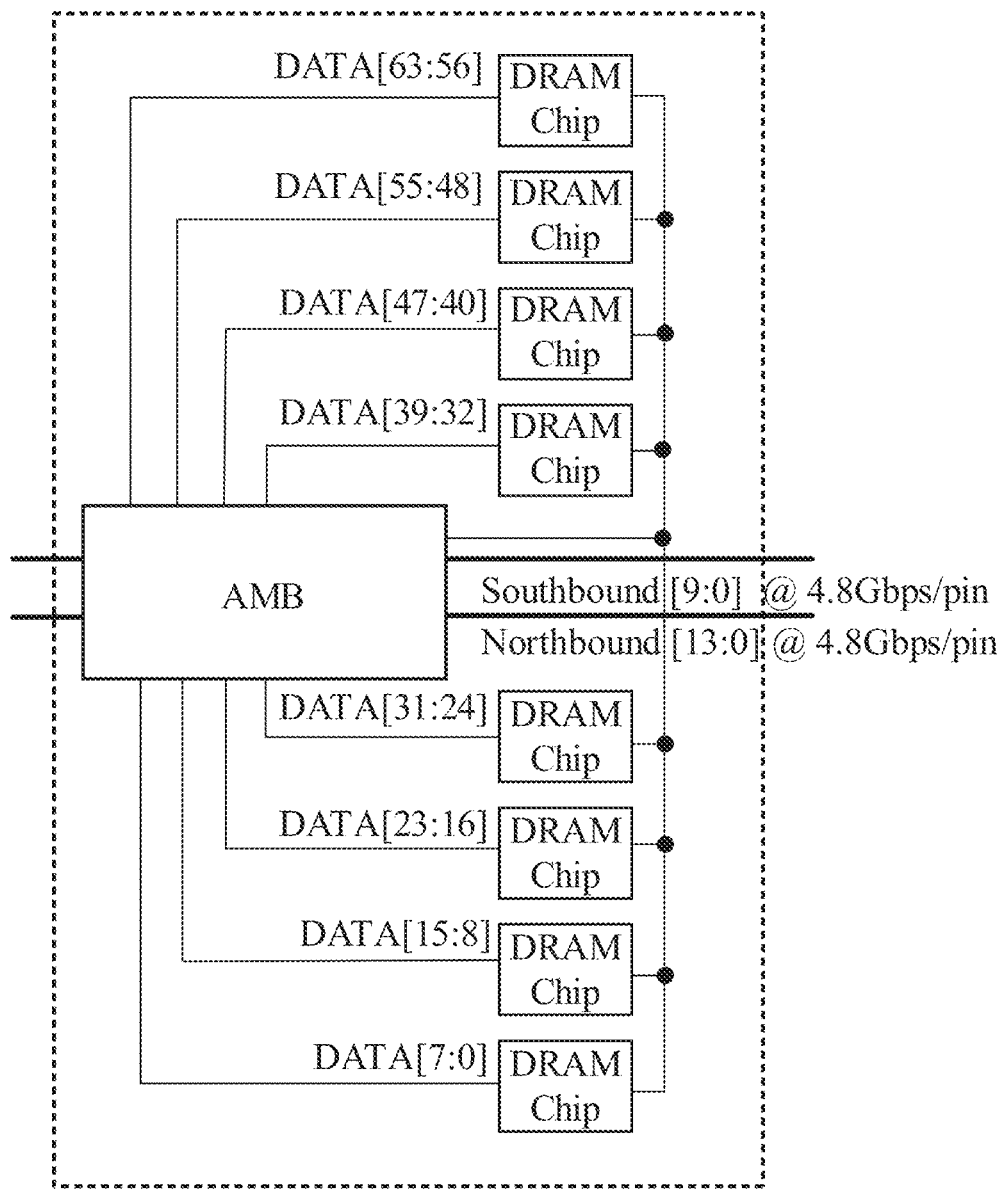
FIG. 26 is a schematic of a fully-buffered (FB) DIMM having an advanced memory buffer (AMB) to connect each FB-DIMM in a point-to-point manner.

FIG. 26 illustrates the organization of a typical fully-buffered DIMM (FB-DIMM). In order to reduce the load, FB-DIMM interfaces all signals through the advanced memory buffer (AMB), encoding everything as packets. The AMB connects each FB-DIMM in a point-to-point manner using a high-speed serial link operating at 6 times the DRAM clock rate. Since the memory controller is only directly connected to one DIMM, then the load for the signals is always constant no matter how many DIMMs there are. However, the AMB adds latency with each DIMM that is added to the system. Therefore, a point is quickly reached where adding more FB-DIMMs will decrease performance due to the added latency, as will be discussed in more detail later. FB-DIMMs also consume significantly more power than a conventional DDRx DIMM due to their high-frequency serial links and power-intensive AMB used to decode, store, forward, and encode packets.

Figure 27:
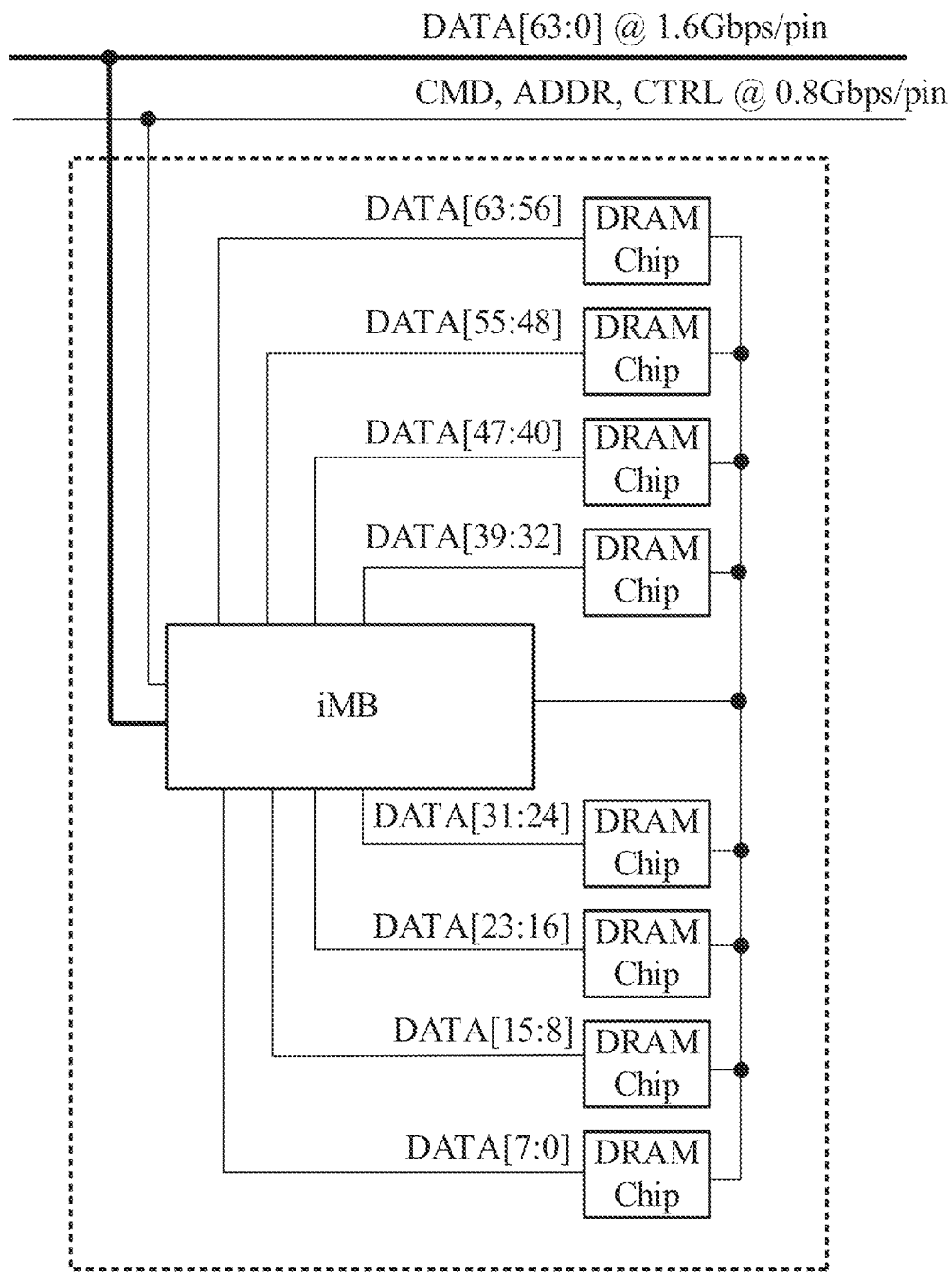
FIG. 27 is a schematic of a load-reduced (LR) Interconnection DIMM having an isolation memory buffer (iMB) for each of the signals.

FIG. 27 shows the organization of a load-reduced DIMM (LR-DIMM). In order to reduce the load, an LR-DIMM adds a buffer for all the signals, called the isolation memory buffer (iMB). However, each LR-DIMM is still connected on a multi-drop bus, with the iMB acting as a signal repeater at each DIMM to improve signal integrity allowing more DIMMs to be supported on the multi-drop bus. Since the signals are just buffered and not encoded as packets, as the AMB in FB-DIMM does, the iMB consumes considerably less power. Accordingly, LR-DIMMs can support additional DIMMs, such as up to about 8 DIMMs, on a single multi-drop bus, having lower power consumption than FB-DIMMs, yet are still subject to significant limitations on the number of DIMMS which can be interconnected.

MRF-DIMM according to the present invention is an MRF-I based architecture designed to increase throughput, but without sacrificing power efficiency. An MRF-DIMM utilizes the capability of supporting multiple RF bands per pin of MRF-I to create multiple logical channels over a single physical channel. This allows an MRF-DIMM to reduce the number of DIMMs contending for a single logical channel, thereby increasing concurrency and throughput. MRF-DIMM provides high bandwidth at low power, which is ideal for desktop and notebook computing systems.

Figure 28A:
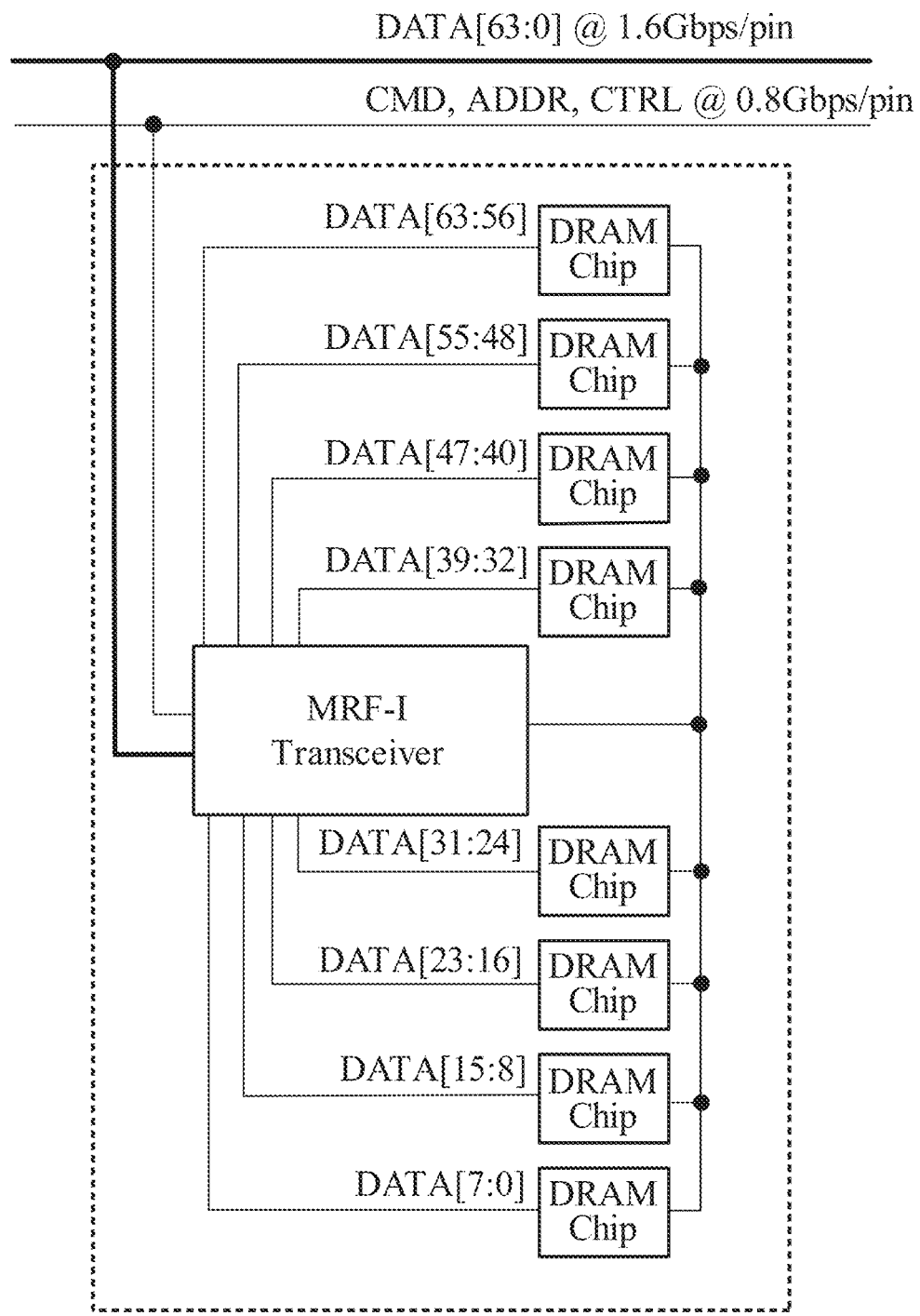
FIG. 28A through FIG. 28B are schematics of multiband radio frequency (MRF) DIMMs in which multiple RF bands are utilized per pin to create multiple logical channels over a single physical channel according to an embodiment of the present invention, showing a single MRF-DIMM and two MRF-DIMMs with two RF bands per pin.

FIG. 28A illustrates an example embodiment of an MRF-DIMM, which incorporates an MRF-I transceiver, as previously described, to a DDRx DIMM, shown in the example coupled to 8 DRAM chips. The resulting layout of MRF-DIMM appears similar to that of an LR-DIMM, although it is significantly different in that it utilizes the multiple RF interconnection (MRF-I) transceiver instead of simply buffering within an iMB. The figure shows 8 DRAM chips coupled to an MRF-I transceiver which receives data and control signals.

Figure 28B:
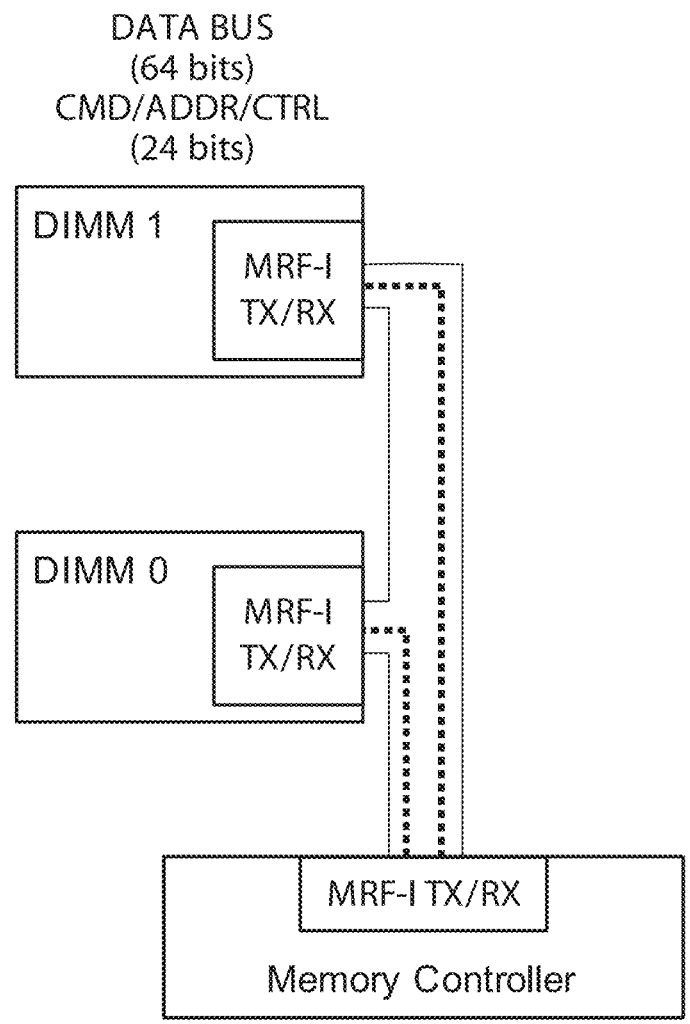

FIG. 28B illustrates an example embodiment of two MRF-DIMMs (DIMM 0 and DIMM 1) connected together on a single physical channel with a memory controller and supporting a 64 bit data bus and 24 lines of CMD, ADDR and CTRL. Interconnection is provided by multiple band transceivers, with MRF-I TX/RX shown in each of the circuit blocks. It should be appreciated that MRF-DIMM utilizes a multi-drop bus, as in conventional wired DDRx DIMMs, however, each DIMM is tuned to a separate RF band (shown as dashed lines), allowing for concurrent transactions across each RF band.

Figure 29A:
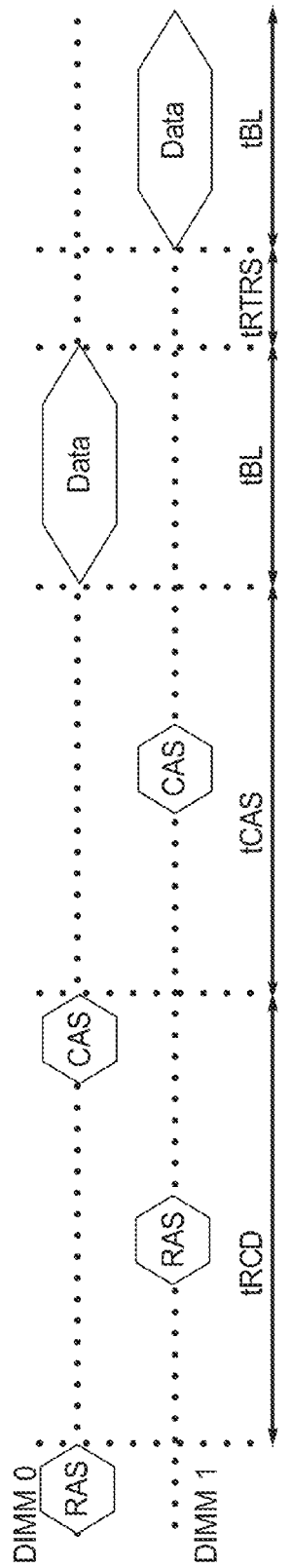
FIG. 29A through FIG. 29C are timing diagrams of memory read timing comparing a typical DDR DIMM and FB-DIMM, with an MRF-DIMM according to an embodiment of the present invention.
Figure 29B:
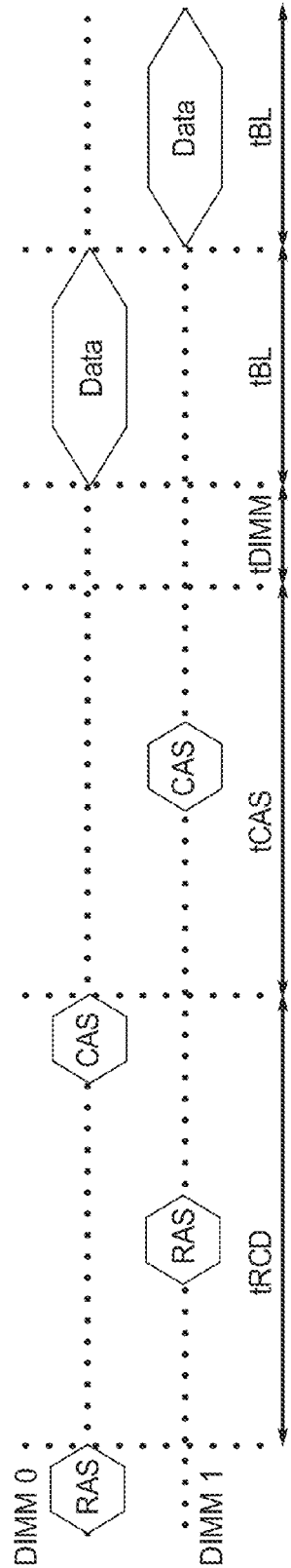
Figure 29C:
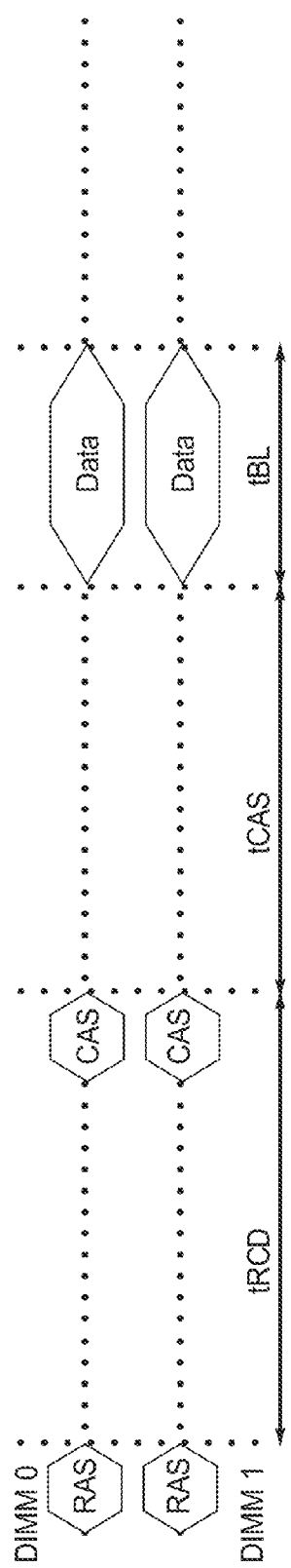

FIG. 29A through FIG. 29C demonstrate potential benefits of MRF-DIMM with a timing diagram for memory read timing of conventional DDRx DIMMs in FIG. 29A, FB-DIMMs in FIG. 29B, and the inventive MRF-DIMM memory system in FIG. 29C.

In a conventional DDRx SDRAM memory system using a multi-drop bus, as seen in FIG. 29A, consecutive read commands to different ranks require the data bus to be idle for some period of time; this is known as the rank-to-rank switch time (tRTRS). This idle period is seen between the data envelopes at the right side of the figure, which is usually one DRAM cycle. It should be understood that a rank is a set of DRAM chips that act in unison to a DRAM command, and that there can be one or more ranks per DIMM. For the sake of simplicity of illustration, the remaining discussions assume 1 rank/DIMM, although the present invention is not limited to 1 rank per DIMM. With 1 rank per DIMM, the rank-to-rank switch time becomes the DIMM-to-DIMM switch time. FB-DIMM does not require a rank-to-rank switch time since the DIMMs do not share a common bus. However, data bursts from each rank must still contend for each point-to-point link and AMB between the memory controller and DIMM with a delay tDIMM seen prior to the upper and lower data envelopes at the right side of FIG. 29B. By contrast to these devices, MRF-DIMMs provide full concurrency between accesses on different RF bands, with no delay periods for rank or obtaining a point to point link. By tuning each DIMM to a separate RF band, each DIMM generally operates as if it were on its own dedicated channel, allowing data from different DIMMs to be transmitted concurrently as seen in FIG. 29C.

The DIMM tree architecture is designed to increase the capacity of a DRAM system without throughput degradation. The DIMM tree architecture creates a tree of DIMMs in order to grow the latency in response to the logarithmic growth in the number of DIMMs, instead of a steeper linear latency increase as the number of DIMMs increases. Accordingly, this architecture allows the memory system to readily scale to a many-DIMM DRAM system. This is accomplished by doubling the pin data rates and halving the number of pins for each DIMM-to-DIMM connection, which allows the support of two DIMM-to-DIMM interfaces on each DIMM without significant pin overhead. The DIMM tree architecture can be implemented without MRF-I, using tree DIMMs (T-DIMMs). However, in response to ongoing DRAM clock rate increases, T-DIMMs are able to support fewer and fewer DIMMs on a multi-drop bus. MRF-I does not share that shortcoming. Therefore, by adopting MRF-I additional improvements in power, throughput, and scalability of DIMMs can be achieved. The DIMM tree architecture is ideal for servers, which requires high capacity in addition to high bandwidth and low power.

Figure 30A:
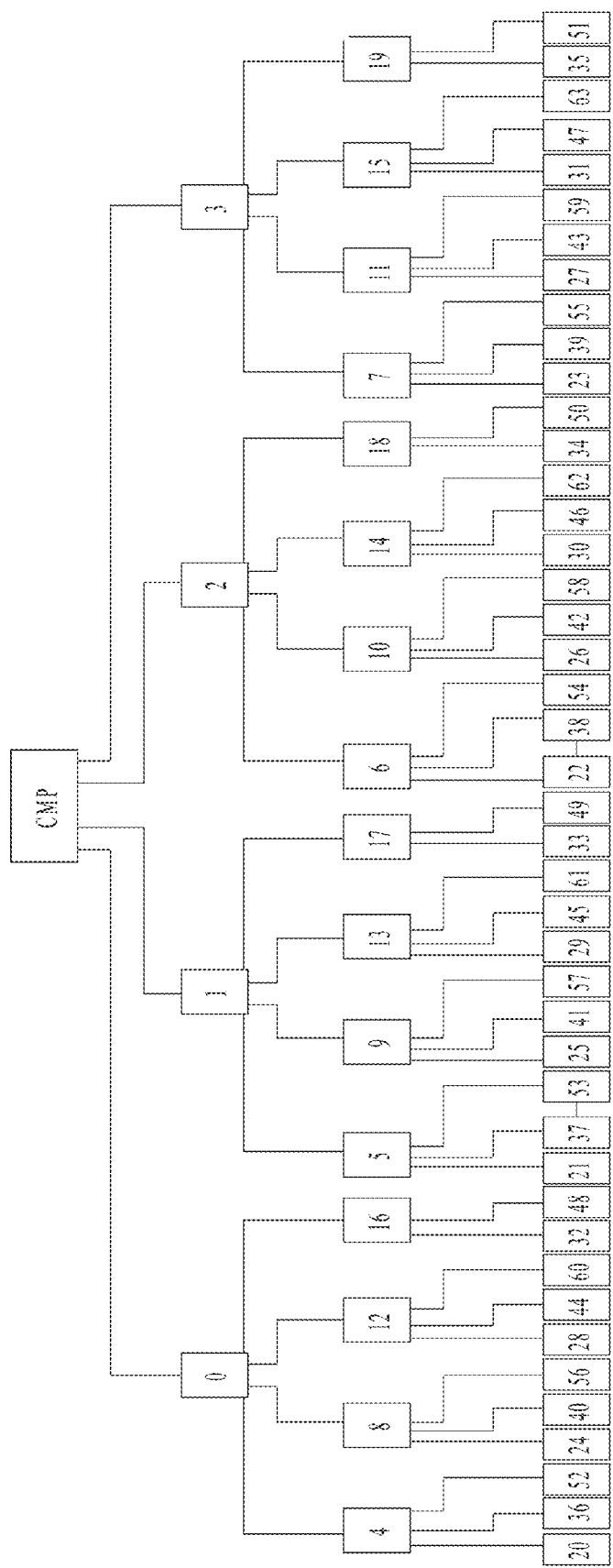
FIG. 30A through FIG. 30B are connection diagrams of architecture and associated physical layout for a quadrary (4-ary) tree of 64 MRF DIMMs according to an embodiment of the present invention.

FIG. 30A illustrates an example DIMM tree architecture consisting of a quadrary (4-ary) tree of 64 DIMMs, showing the hierarchy of DIMMs numbered from 0 through 63.

Figure 30B:
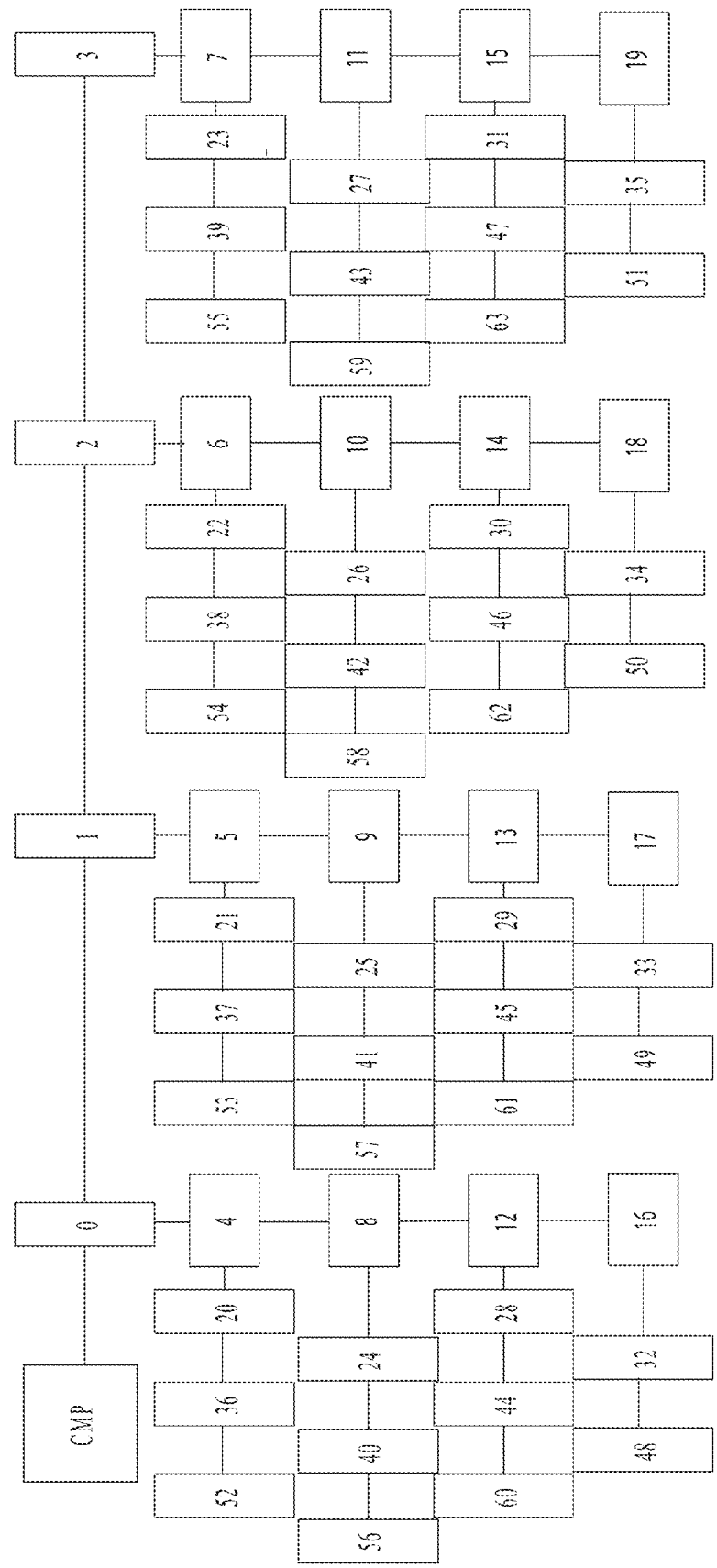

FIG. 30B illustrates an example physical layout of the 64 DIMMs (depicted in FIG. 30A) as they might appear arranged connected on a circuit board. The DIMMs are numbered to form a balanced tree toward balancing the demands on each subtree when mapping the addresses to take advantage of a closed page mode row buffer management policy. Each level of the tree adds one DRAM clock of latency, just as found when interconnecting FB-DIMMs. However, unlike FB-DIMMs, the number of DIMMs increases exponentially with each latency level added, instead of increasing linearly at the same rate when adding FB-DIMMs. All siblings are connected through a multi-drop bus. For example, DIMMs 4, 8, 12, and 16 are all siblings (as shown in 30A) and are all connected together on a multi-drop bus (as shown in FIG. 30B). Since a traditional RC interconnect for the multi-drop bus is utilized in a T-DIMM, there is a rank-to-rank switch time for consecutive reads between siblings. Consecutive reads to a parent and its child, however, do not have a rank-to-rank switch time since they do not share a multi-drop bus. If the RC interconnect is replaced with a multi-drop bus between siblings with MRF-I, then the rank-to-rank switch time can be reduced or even eliminated. This is accomplished by using the MRF-DIMM concept within each set of siblings, creating a multi-level MRF-DIMM. Therefore, with MT-DIMMs, a parent DIMM connected to all its children is analogous to the memory controller connected to all the DIMMs in MRF-DIMM. The rank-to-rank switch time for consecutive reads to siblings on different RF bands is eliminated, just as in MRF-DIMM.

It should be appreciated that the physical layout in FIG. 30B is just one example of possible layout for the system. Preferred layouts attempt to minimize the distance between DIMMs toward limiting the amount of latency. Latencies for the transmitters, receivers, and transmission lines for RF-I versus the baseband are shown in Table 2 for 5 cm and 10 cm. These latencies fall well within the DDR3-1600 cycle time of 1.25 ns, which is utilized as our level-to-level latency in the DIMM tree architecture. One of ordinary skill in the art will appreciate that numerous layout variations can be implemented without departing from the teachings of this invention.

Figure 31:
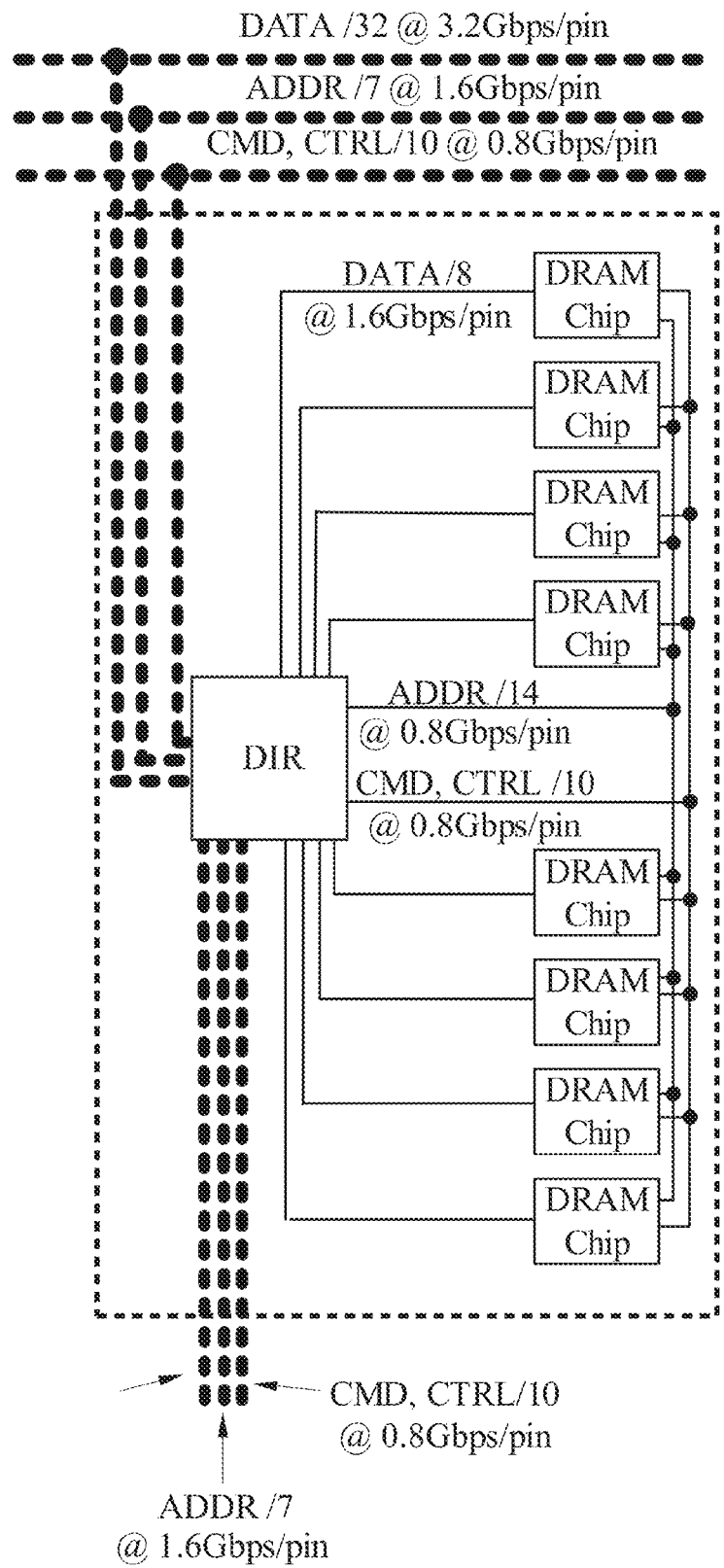
FIG. 31 is a schematic of a multiband tree DIMM (MT-DIMM) using 8-ASK MRF-I according to an embodiment of the present invention.

FIG. 31 illustrates an example embodiment of a single MT-DIMM using 8ASK MRF-I with data rates and number of pins for the data, address, command, and control lines connecting 8 DRAM chips to a DIMM interface router (DIR). All RF-1 lines are shown with dashed lines, and all RC lines connecting from the DIR to the DRAM chips are shown with solid lines. A T-DIMM is organized like a MT-DIMM, except the MRF-1 lines are replaced with traditional RC interconnects, and all the MRF-I transceivers are also replaced with baseband transceivers. The data and address lines connecting from DIMM-to-DIMM operate at 2X the data rate (3.2 Gbps/pin for data, 1.6 Gbps for address) of a conventional DDR3 DIMM (1.6 Gbps/pin for data, 0.8 Gbps for address), while requiring half the number of pins (32 for data, 7 for address). Reducing the pins by doubling the data rate accomplishes two things. First, two DIMM-to-DIMM connections can be supported on the DIMM instead of just one. The number of pins on the DIMM is increased by what amounts to another set of command/control lines plus chip select, which is (10+$\log_2$(number_of_ranks)). The above assumes that logic exists on each DIMM to decode the chip select with "$\log_2$(number of ranks)" lines instead of "number of ranks" lines. Second, the number of pins needed to interface with the memory controller is halved. The command and control lines from DIMM-to-DIMM operate at the same rate as a conventional DDR3 DIMM (0.8 Gbps/pin). All signals to the eight exemplified DRAM chips must go through the DIMM Interface Router (DIR).

Figure 32:
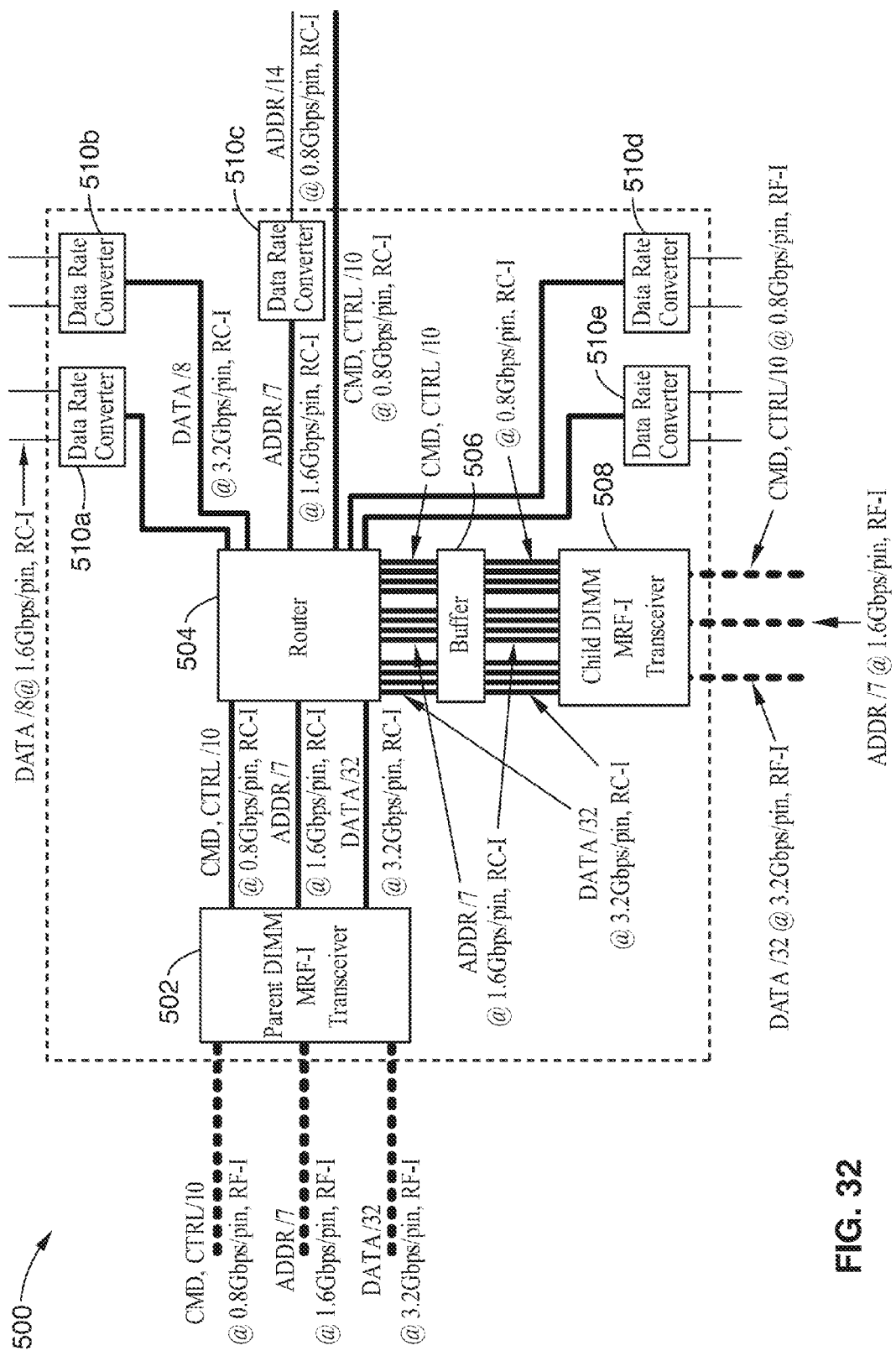
FIG. 32 is a schematic of a DIMM interface router (DIR) according to an embodiment of the present invention, shown containing a parent MRF-I transceiver, router, buffer, child MRF-I transceiver, and multiple data rate converters.

FIG. 32 illustrates example embodiment 500 of a DIMM interface router (DIR), shown in a block diagram. The DIR is shown with a parent DIMM MRF-I transceiver 502, a router 504, a buffer 506, a child DIMM MRF-I transceiver 508, and several data rate converters 510a through 510e. The parent DIMM MRF-I transceiver connects the DIMM to its parent and siblings within the tree hierarchy. In this configuration each parent DIMM MRF-I transceiver can only be tuned to one RF band. However, it will be appreciated that the design can be implemented for support of additional bands. By way of example, the router preferably operates based on a lookup table indexed by the rank number specifying four possible routes: the current DIMM, a descendent of the current DIMM, the parent DIMM, or none of the above. The buffer is used to buffer signals that must go to the next level of the tree (i.e., a descendent of the DIMM). The child DIMM MRF-I transceiver connects the DIMM to its children in the tree hierarchy. The child DIMM MRF-I transceiver then has an MRF-I transceiver for each RF-I band per pin. The memory controller is the root of the tree, so it also contains a child DIMM MRF-I transceiver. MT-DIMM devices are configured for buffering and routing each logical channel from the child. Therefore, a set of command, address, control, and data signals is present for each logical channel between the router, buffer, and child DIMM MRF-I transceiver. As the figure is directed for 8ASK MRF-I, there are 4 logical channels and 4 sets of signals lines shown between the router, buffer, and child DIMM MRF-I transceiver. The data rate converter converts between a data rate of X with Y pins to a data rate of 2X with Y/2 pins and vice versa. This is accomplished by interleaving the values of two signals operating at data rate X onto a single wire at data rate 2X and vice versa.

The operation of the inventive embodiment was evaluated using generated memory transaction traces from a benchmark suite (SPEC CPU 2006), with traces gathered using a dynamic instrumentation tool (called "Pin"), with a 2 MB 8-way set associative L2 cache model with 64B blocks taken from Simplescalar®. The traces were generated by warming up for 1 billion instructions before recording and then running for another 1 billion instructions while recording memory transactions. The traces were captured as input into a detailed memory system simulator, and several trace files mixed together in order to create a multiprogrammed CMP workload that stresses the DRAM system.

Table 3 shows six different mixes of standardized memory testing patterns utilized in evaluating the devices. The mixes are categorized by how much they stress the DRAM system, such as low, medium, and high. Parameters are shown in Table 4 that were utilized for the evaluation simulations. The simulation was modified to provide a per-rank transaction queue instead of a single per channel transaction queue, thereby allowing scheduling transactions from different ranks concurrently insofar as no DRAM timing conflicts arise. Per rank transaction queues were utilized in all the evaluations.

For DRAM chips on the LR-DIMMs, MRF-DIMMs, T-DIMMs, and MT-DIMMs, the timing and power parameters from the Micron® datasheets for DDR3-1600 were utilized as representative. For the DRAM chips on the FB-DIMM, information from the Micron datasheet for DDR2-800 were utilized. FB-DIMM only supports up to DDR2-800, and not DDR3. While the DRAM simulator utilized has a power model for the DRAM chips, it does not model interconnect power. Therefore, an interconnect power model was added to the simulator for baseband and RF-I which also includes transceiver power. The interconnect power numbers and structures not modeled in the simulator were obtained from a highly accurate circuit simulator.

Figure 33A:
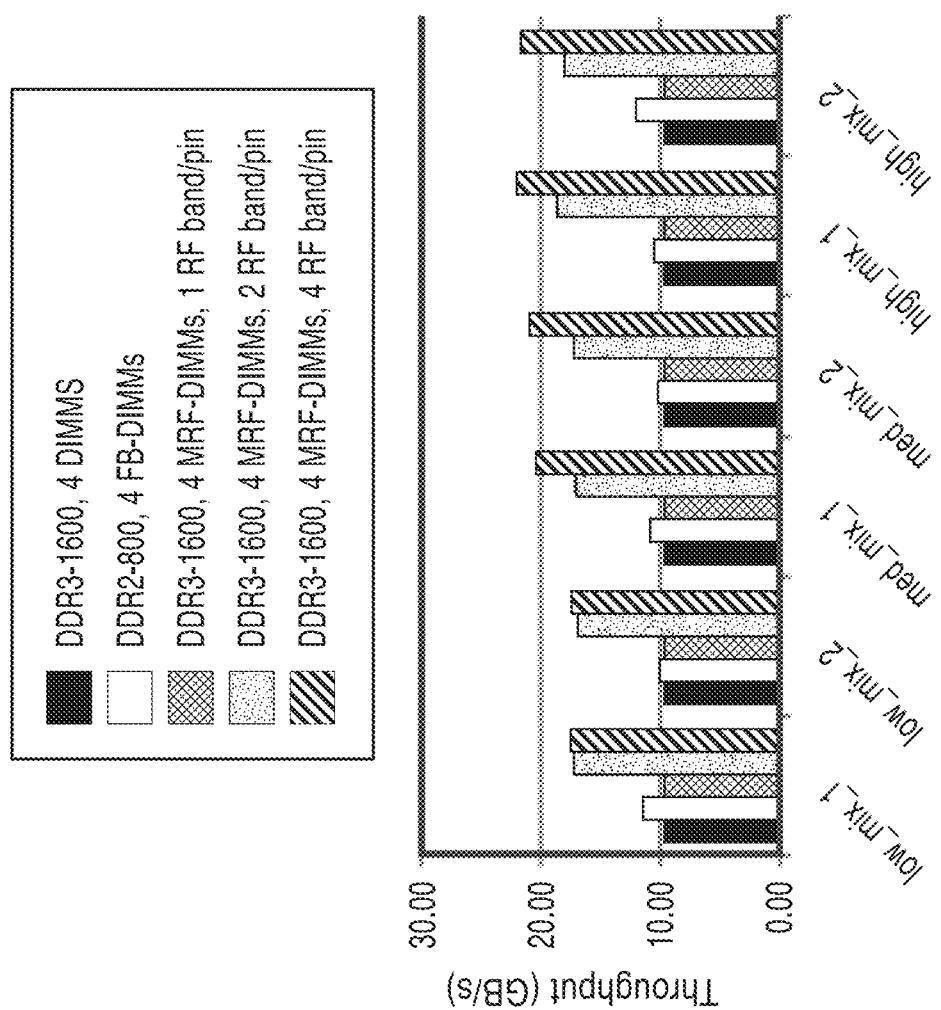
FIG. 33A through FIG. 33B are bar graphs of throughput and power consumption for various MRF-DIMM configurations according to embodiments of the present invention, compared with existing DDR DIMMs and DDR FB-DIMMs.
Figure 33B:
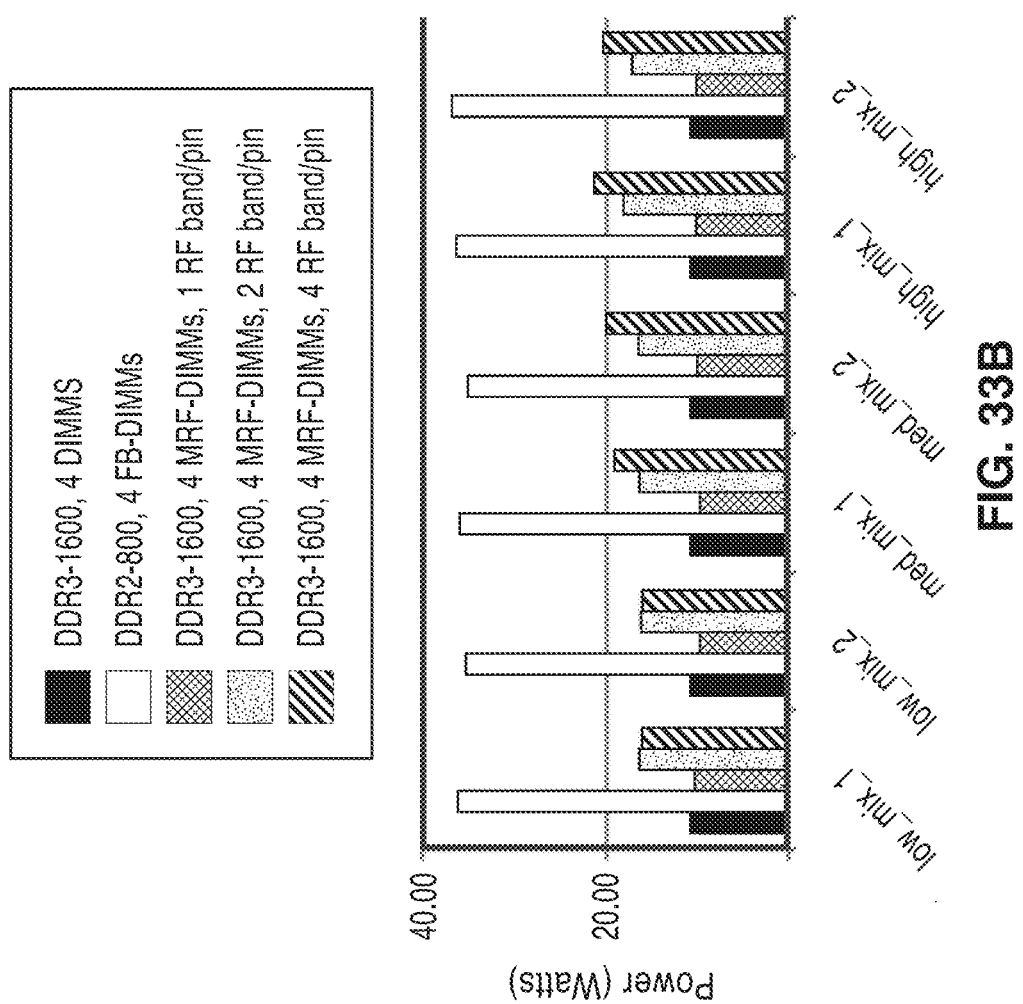

FIG. 33A through FIG. 33B depict the results for throughput and power of a 4-DIMM MRF-DIMM system shown compared against a system of conventional DDR3-1600 DIMMs and DDR2-800 FB-DIMMs. FB-DIMMs only support up to DDR2-800 DRAM chips. These conventional devices were compared against MRF-DIMM with 1, 2, and 4 RF bands per pin. With N RF bands per pin, 4/N DIMMs are allocated to each RF band. For example, with 2 RF bands per pin, 2 DIMM are allocated to each RF band. Considering FIG. 33A it is seen that the throughput of FB-DIMM is on average 12% greater than the throughput of a conventional DDR3 DIMM, with a maximum of 24%. The throughput of MRF-DIMM with 1 band per pin is equivalent to the conventional DDR3, since they are functionally equivalent. The difference between FB and MRF DIMMs is readily seen in power consumption as seen in FIG. 33B. The power for MRF-DIMM with 1 band per pin is slightly lower than the conventional DDR3 DIMM. MRF-DIMM with 2 RF bands per pin, however, has an average increase in throughput of 82%, with a maximum of 92%. MRF-DIMM with 4 RF bands per pin has an average increase in throughput of 107% with a maximum increase of 126%. For MRF-DIMM with 2 and 4 RF bands, even though the overall system power is higher, the power efficiency does not decrease.

Figure 34:
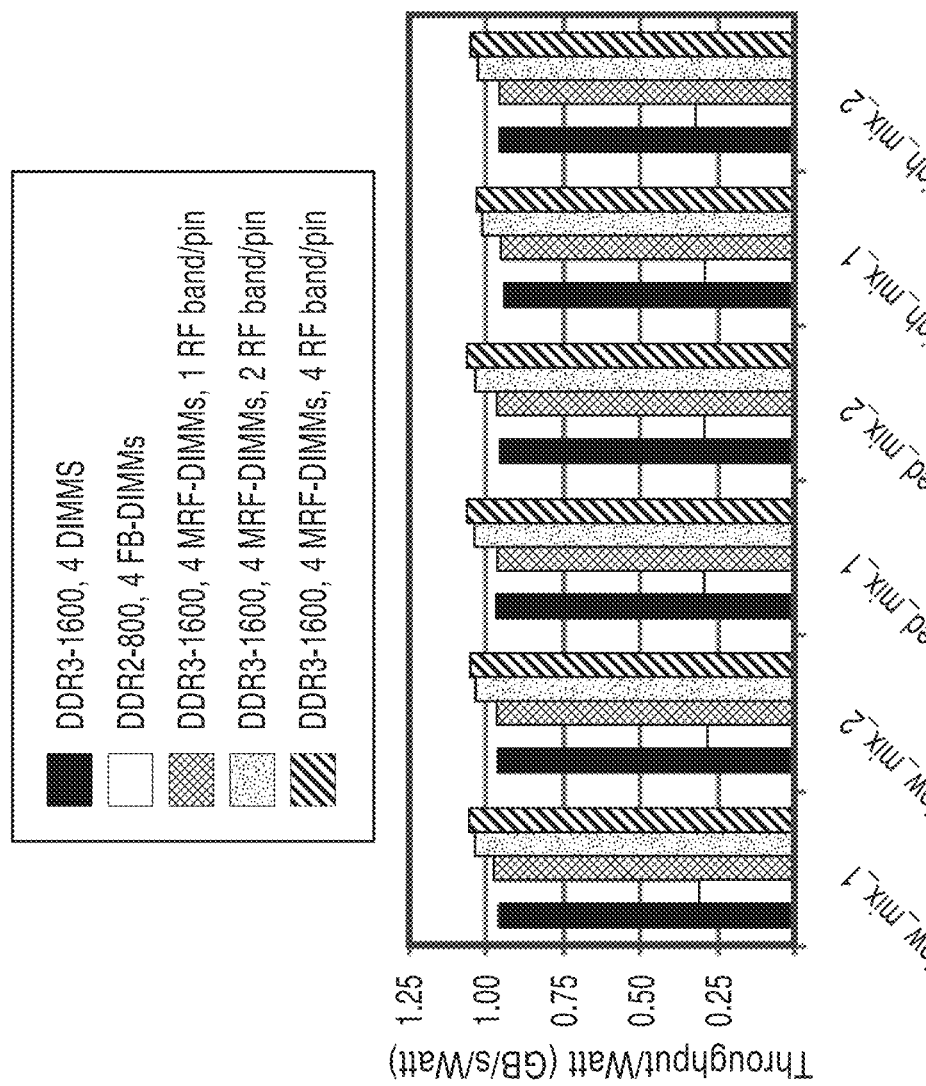
FIG. 34 is a bar graph of throughput per watt for various MRF-DIMM configurations according to embodiments of the present invention, compared with existing DDR DIMMs and DDR FB-DIMMs.

FIG. 34 depicts throughput/watt figure comparisons between conventional and inventive embodiments. The graph shows throughput/watt increases with MRF-DIMM. With 2ASK, throughput/watt increases by 1%, with 4ASK by 8%, and with 8ASK the throughput/watt increases 10%. Therefore, MRF-DIMM is more power efficient than a conventional DDR3 DIMM, and far improved over FB-DIMM which degrades throughput/watt by 69%.

In this section the throughput and power of a DIMM tree architecture using T-DIMMs and MT-DIMMs is compared to DRAM systems using DDR3-1600 LR-DIMMs and DDR2-800 FB-DIMMs. For each DRAM system, one rank per DIMM and 8 DIMMs in the system are assumed. The DIMM tree architectures are configured as quadrary (4-ary) trees (i.e., each DIMM has up to 4 children). The conventional devices are compared with MT-DIMMs using 1, 2, and 4 RF bands per pin.

Figure 35:
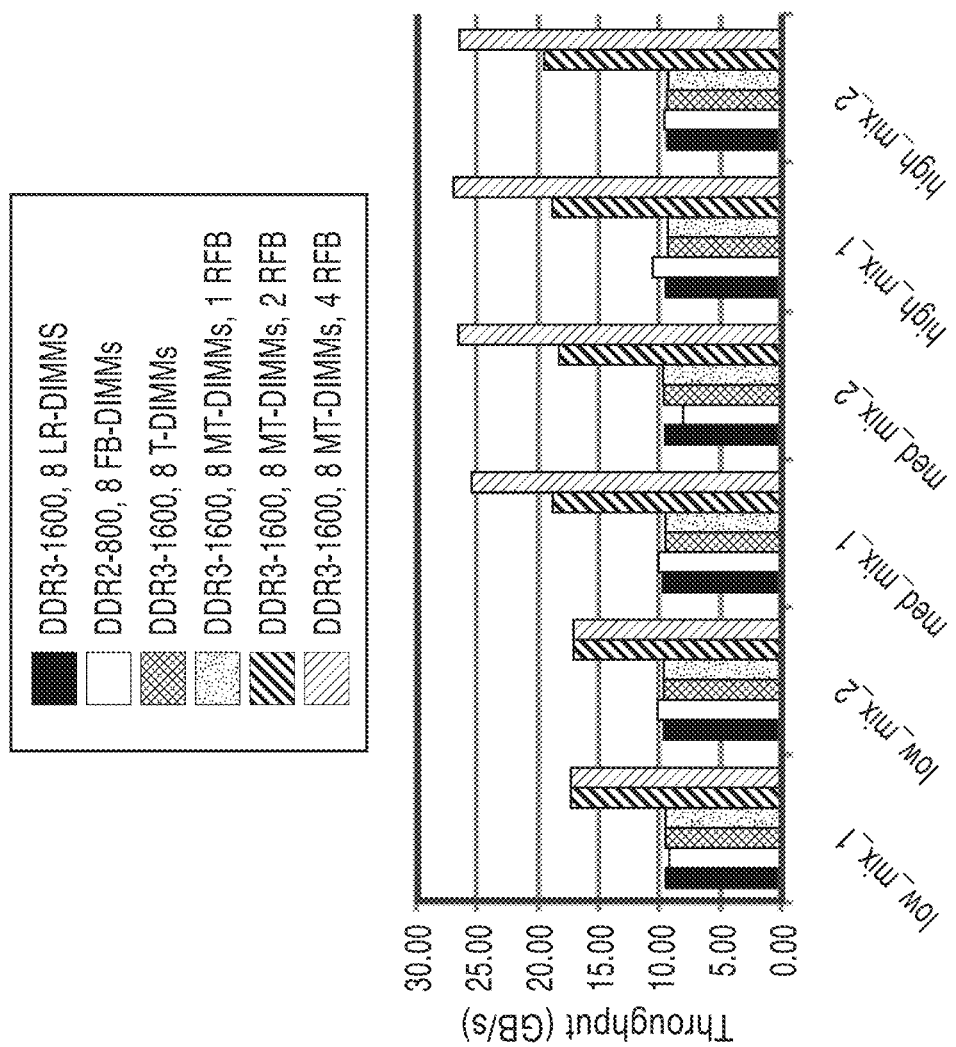
FIG. 35 is a bar graph of throughput for various MRF-DIMM configurations according to embodiments of the present invention, compared with existing DDR LR-DIMMs, DDR FB-DIMMs, and DDR T-DIMMs.

FIG. 35 illustrates throughput results for both conventional and inventive DIMMs. It can be seen that both FB-DIMM and T-DIMM performed as well as the LR-DIMM on average. This shows that even though half the ranks have an additional DRAM cycle of latency, with just two levels, the impact is not enough to significantly impact throughput. The same is also true for MT-DIMM. With one RF band per pin, the throughput for MT-DIMM is the same as T-DIMM. For MT-DIMM with two RF bands per pin, however, there is an average throughput improvement of 89%, reaching as high as 100%. By having two RF bands per pin, the bandwidth of the system is doubled while rank-to-rank switch time is reduced. Within each group of siblings, only two are competing for the same RF band. With one RF band per pin, there were 4 siblings competing for the same RF band. For MT-DIMM with 4 RF bands per pin, throughput is increased by 143% on average, reaching as high as 185%. Results "low_mix_1" and "low_mix_2" do not indicate any improvement when moving to 4 RF bands per pin, since there is already enough bandwidth for the traces with two RF bands per pin (i.e., no matter how much more bandwidth is added, throughput will not increase).

Figure 36A:
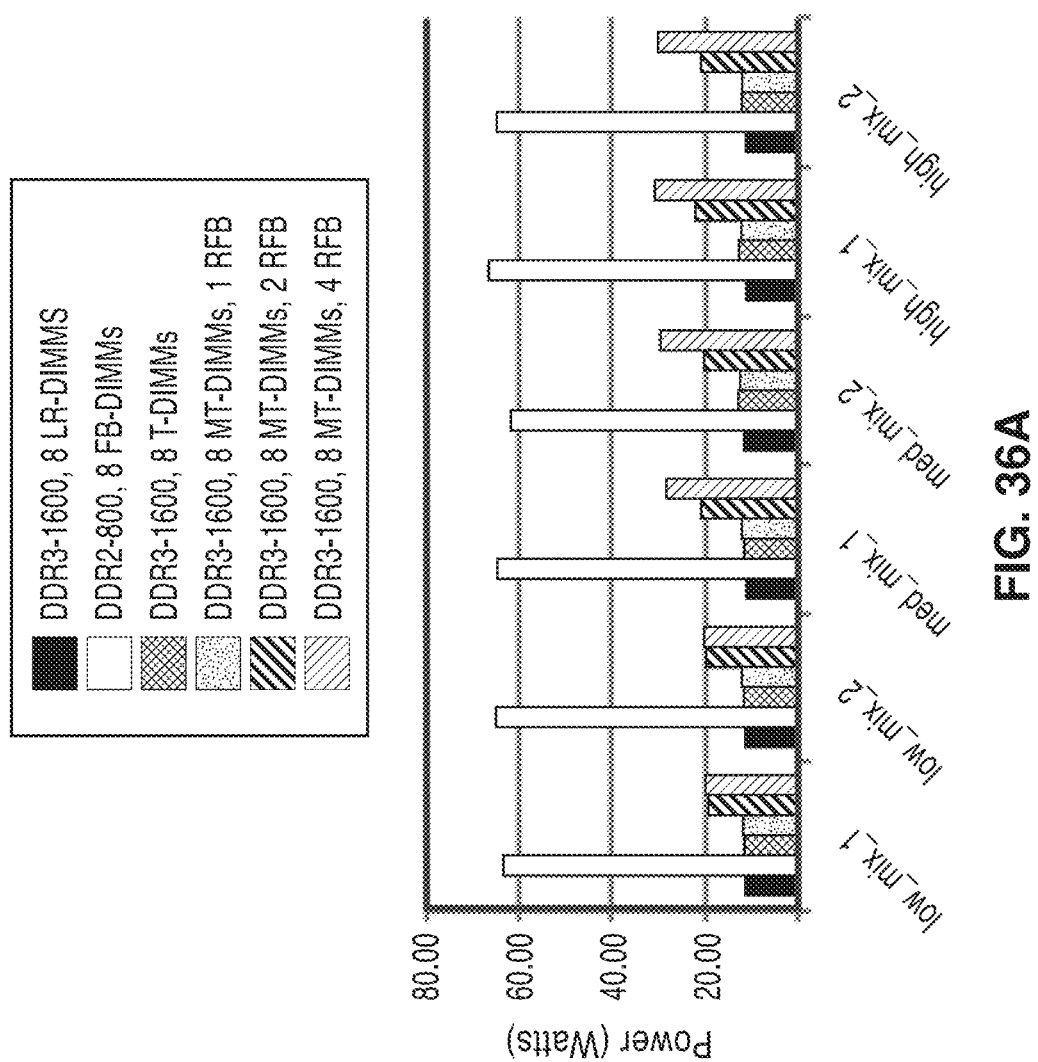
FIG. 36A through FIG. 36B are bar graphs of power and throughput per watt for various MRF-DIMM configurations according to embodiments of the present invention, compared with existing DDR LR-DIMMs, DDR FB-DIMMs, and DDR T-DIMMs.
Figure 36B:
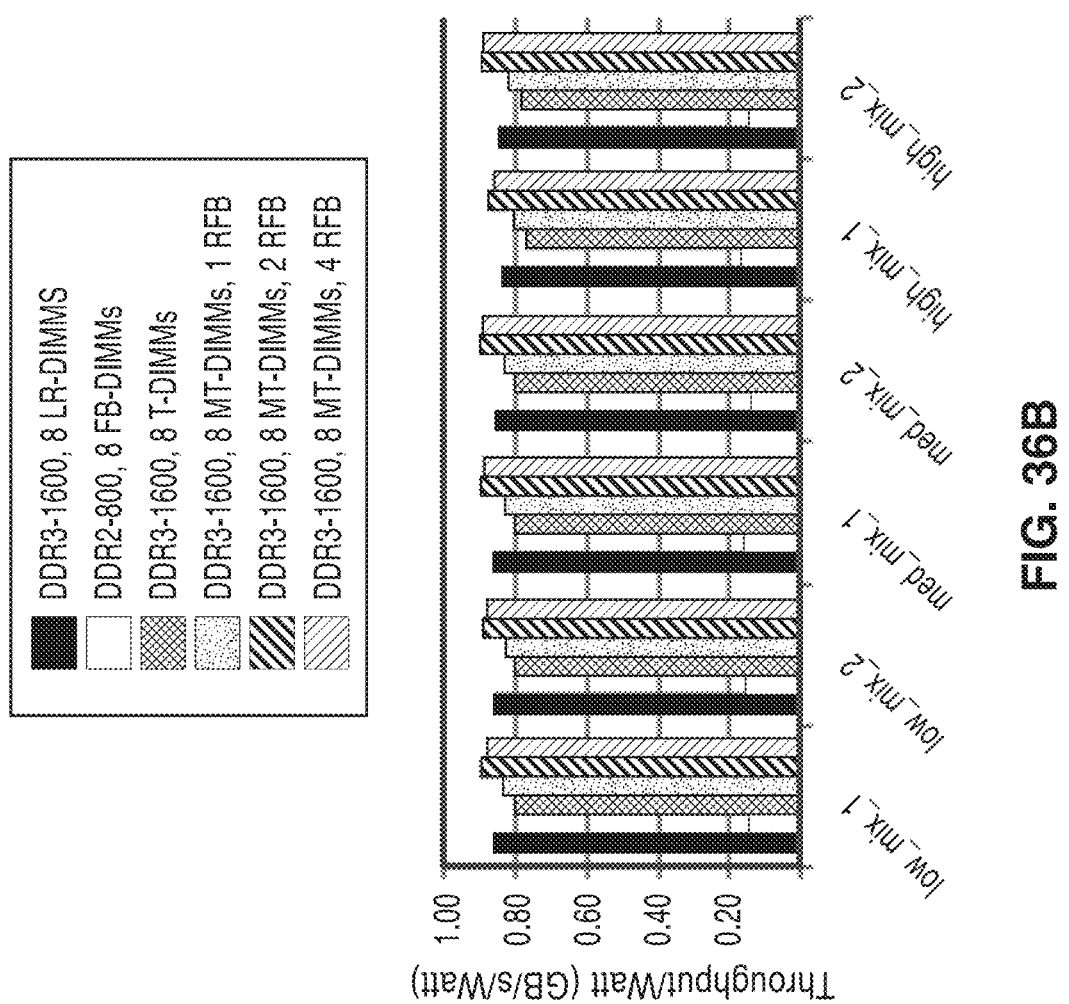

FIG. 36A through FIG. 36B show total power and throughput per watt results comparing the inventive DIMM embodiments with conventional DIMMs. FB-DIMM has by far the least beneficial power and throughput/watt of all the DIMMs. Compared to LR-DIMM, T-DIMM degrades throughput/watt by 7%. MT-DIMM with one RF band per pin degrades throughput/watt by 3%. However, for MT-DIMM with 2 and 4 RF bands per pin the throughput/watt increases by 5% and 4% respectively over LR-DIMM.

In this section, the scalability of the DIMM tree architecture is explored versus FB-DIMM.

Figure 37:
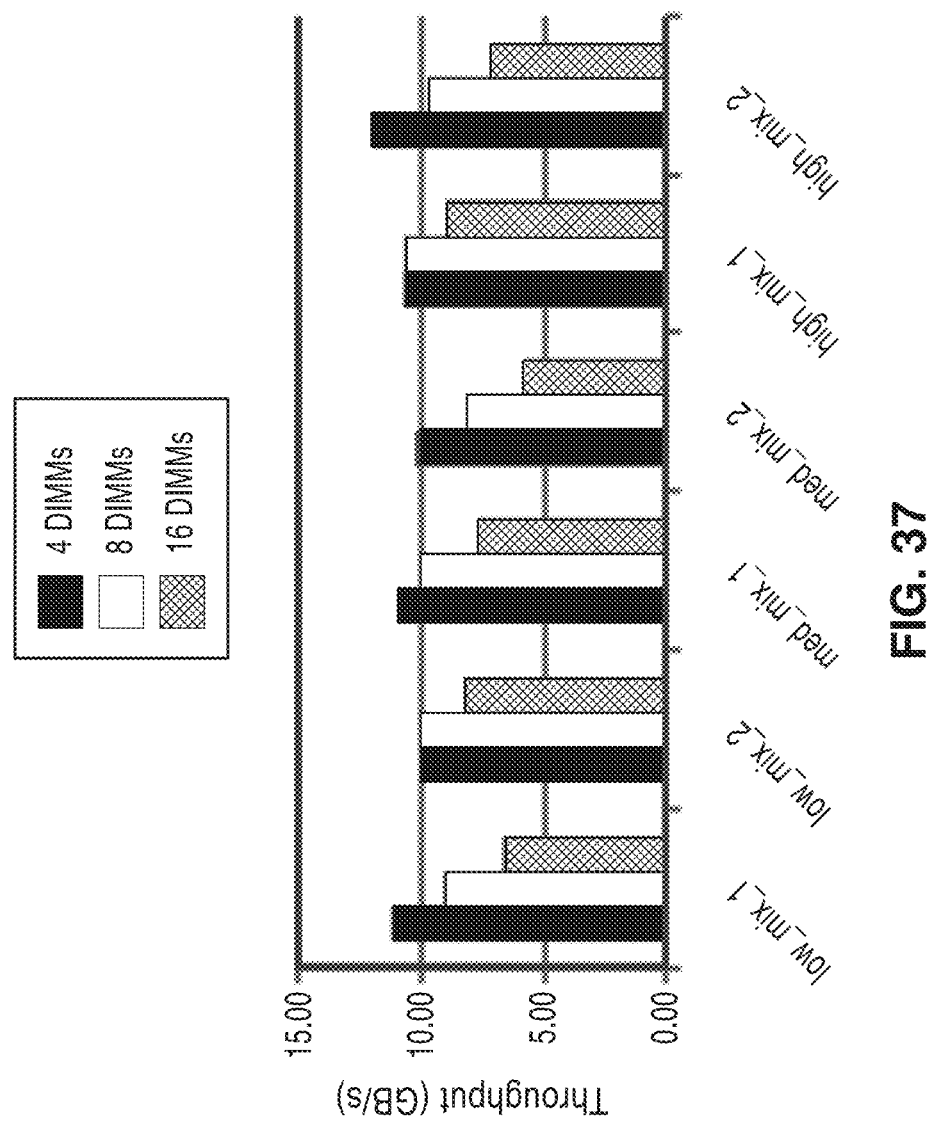
FIG. 37 is a bar graph of throughput for existing FB-DIMMs in response to scaling the number of connected DIMMs.

FIG. 37 shows the throughput for FB-DIMM as the number of DIMMs is increased. At 8 DIMMs, there is an 11% average degradation in throughput over the 4-DIMM case, with a maximum degradation of 19%. At 16 DIMMs, there is a 31% average degradation in throughput, with a maximum degradation of 43%. The linear growth in latency with the number of FB-DIMMs clearly has a significant impact on performance.

Figure 38A:
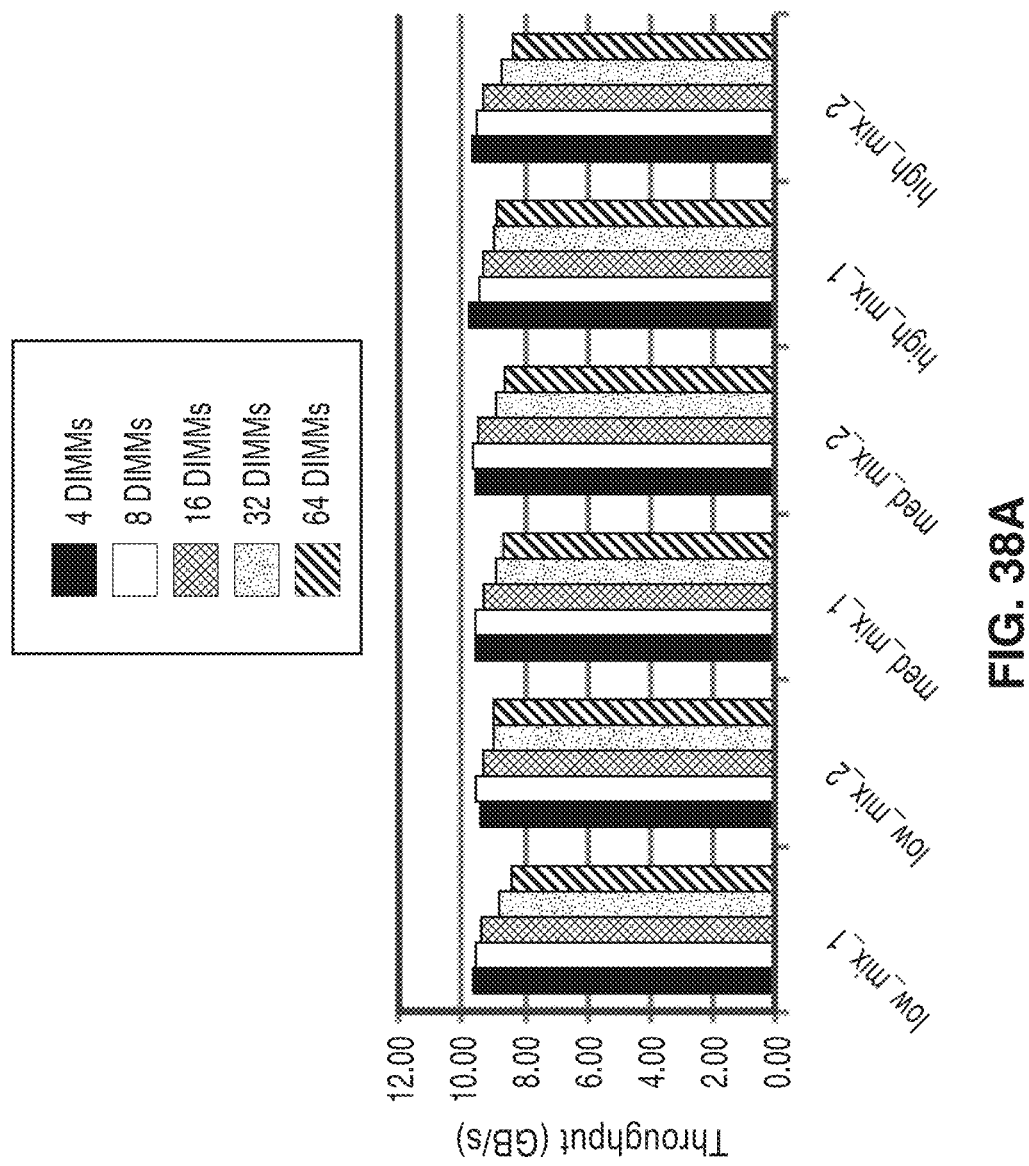
FIG. 38A through FIG. 38B are bar graphs of throughput for T-DIMMs and MT-DIMMs according to embodiments of the present invention, in response to scaling the number of connected DIMMs.
Figure 38B:
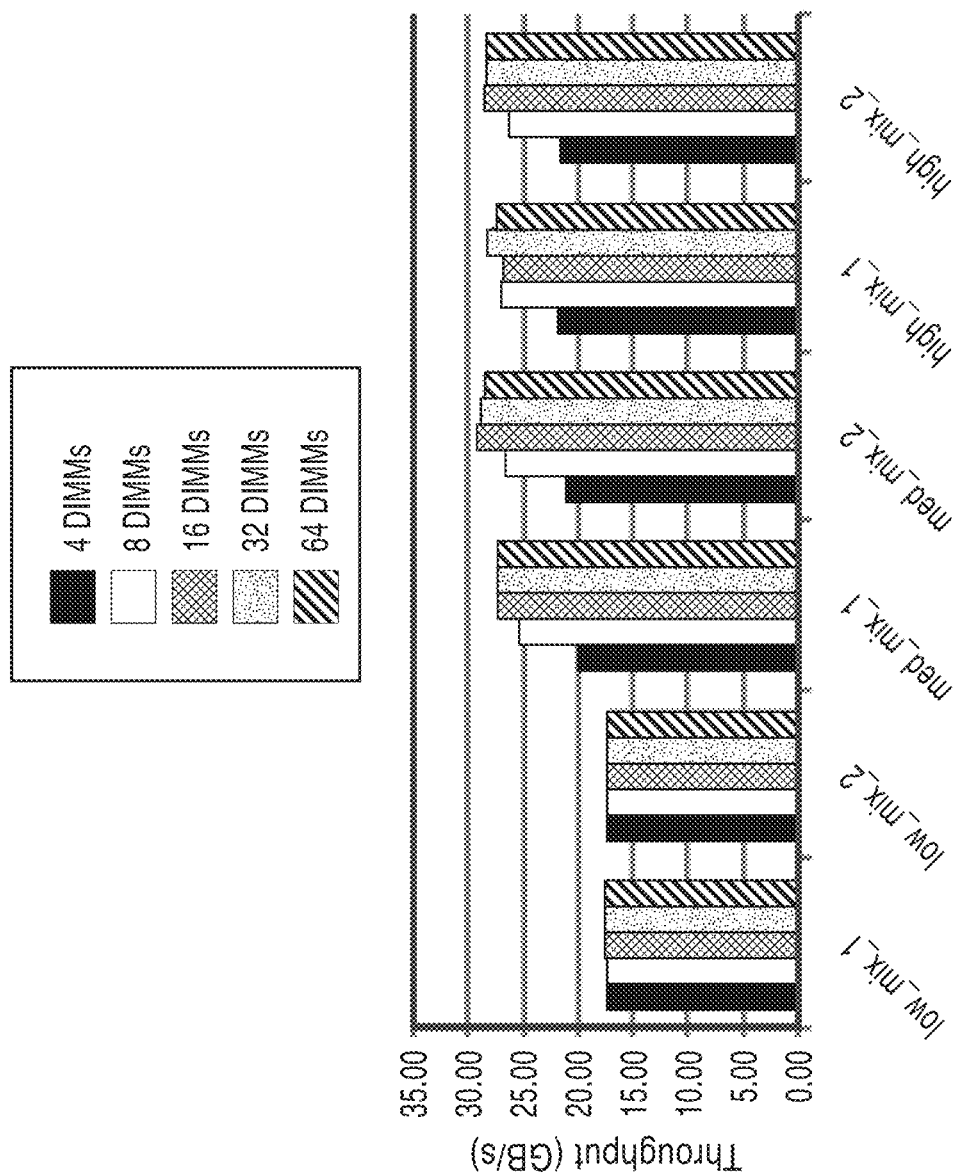

FIG. 38A through FIG. 38B show throughput for T-DIMM and MT-DIMM, respectively, as the number of DIMMs is varied from 4 to 64. It should be noted that the invention is not limited to 64 DIMMs, but this was simply the maximum number of entries allowed in the transaction queue of the simulator. Referring to FIG. 38A, the configuration of the T-DIMM DRAM system is a quadrary (4-ary) tree. At 16 DIMMs (two levels in tree), there was seen a 2% average degradation in throughput, with a maximum degradation of 4%. At 32 DIMMs (three levels in tree), there was seen an 8% average degradation in throughput, with a maximum degradation of 10%. At 64 DIMMs (three levels in tree), there was seen a 10% average degradation in throughput, with a maximum degradation of 13%. Since the number of levels in the tree increases logarithmically with the number of T-DIMMs, a DIMM tree architecture is seen to be much more scalable than that of FB-DIMMs.

Referring to FIG. 38b, showing throughput of an MT-DIMM with 4 RF bands per pin, throughput still increases as the number of DIMMs is increased to 8 and 16, even though the number of levels is increased. This increased throughput arises because each RF band is underutilized with only 4 DIMMs. Since there are 4 RF bands per pin, then in a 4-MT-DIMM configuration, there is only 1 DIMM per RF band. DRAM timing constraints, such as row-to-row activation time and precharge-to-activation time place a limit on the number of sequential transactions to the same DIMM within a window of time. By increasing the number of DIMMs to 8 and 16, the number of DIMMs per RF band is increased to 2 and 4 respectively, allowing the DRAM system to increase the utilization of the RF band. Beyond 16 DIMMs, little additional improvement is seen in throughput. Very beneficially, from a scalability standpoint there is less than 1% average degradation in throughput in response to scaling to 64 DIMMs.

Figure 39:
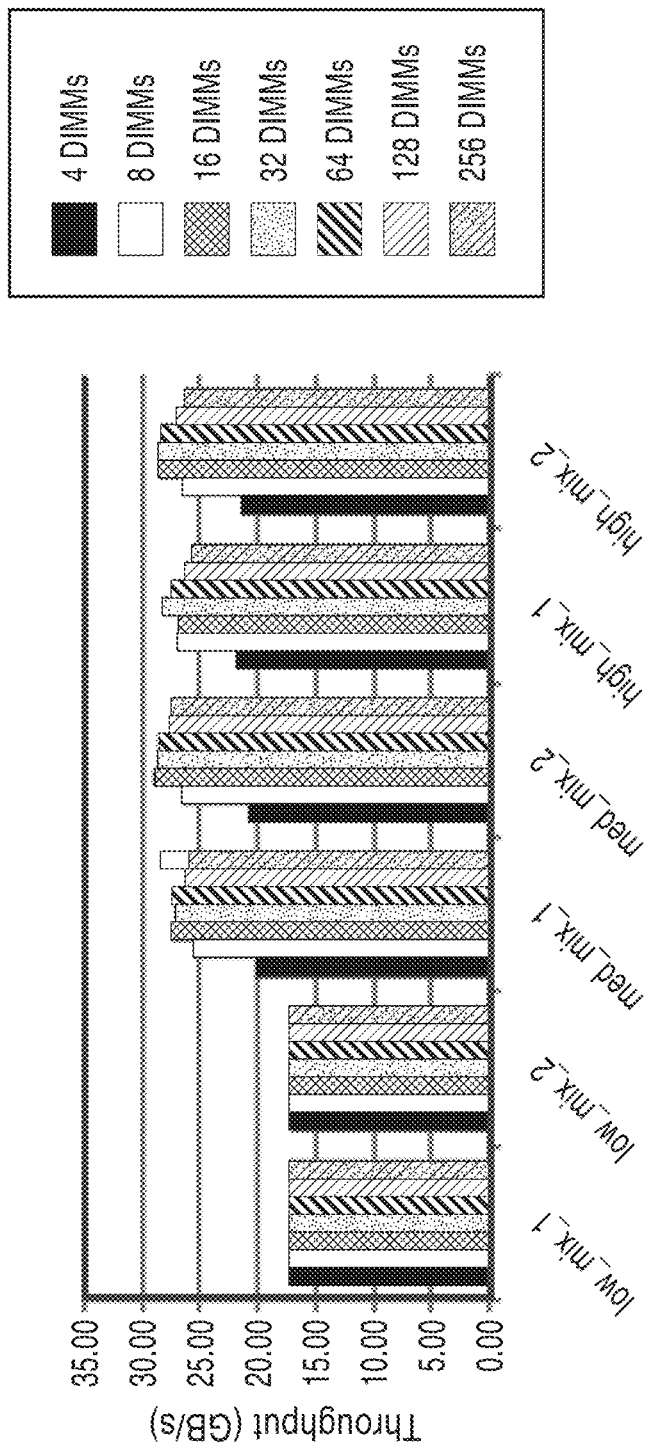
FIG. 39 is a bar graph of throughput for MT-DIMMs according to embodiments of the present invention, in response to scaling the number of connected DIMMs up to 256.

FIG. 39 depicts throughput as the size of the transaction queue is increased to 256 entries, and throughput measured as the number of DIMMs is increased to 256 (4 levels in the tree). At 256 DIMMs, there is only a 4% average degradation in throughput, with a maximum degradation of 6%. MT-DIMM is therefore able to scale to an order of magnitude more DIMMs than FB-DIMM.

So far these simulation results have only reflected the effect that the DRAM latency has on the throughput of the system. They have not reflected the additional system performance that may be gained by increased DRAM capacity, which results in a reduced number of disk accesses. Therefore, the results outlined have been very conservative. If the performance gains which arise from reduced disk accesses were factored in, the benefits of the inventive embodiments would be seen to be even more significant.

Table 5 sums up the latencies, throughput, and capacities of T-DIMM/MT-DIMM with 64 DIMMs against a hard drive and a solid state drive. It is assumed that each DIMM can hold 4 GB. Latency for T-DIMM/MT-DIMM is calculated as the time from the beginning of the first DRAM command for a read transaction sent from the memory controller until the data for that transaction is received at the memory controller. As can be seen, both T-DIMM and MT-DIMM dominate solid state drives and hard drives in terms of latency and throughput, but with a comparable amount of capacity.

DRAM systems are reaching a tipping point where technology is pushing the limits of traditional RC interconnects. Multiband RF-I (MRF-I) is a particularly well-suited candidate for replacing RC interconnect for interfacing DRAMs. MRF-I supports more concurrent logical channels, can operate at a higher frequency with lower power, and is fully compatible with CMOS technology. Evaluations have been shown in which MRF-I energy per bit was reduced by 60% over a traditional RC interconnect. MRF-DIMM was able to achieve an average of 107% and up to 126% improvement in throughput while still being as power efficient as LR-DIMM. For a DIMM tree architecture with MT-DIMMs, an average of 143% and up to 184% improvement was achieved in throughput while still being power efficient in an 8 DIMM system. MT-DIMM was also able to scale beyond 256 DIMMs on a single channel and improve throughput by 22% over an LR-DIMM system with just 8 DIMMs. By utilizing MRF-I for chip-to-DRAM communication in the inventive DIMM architectures, a clear benefit in terms of throughput, power, and scalability has been shown.

From the description herein it will be appreciated that the invention can be embodied in multiple ways without departing from the inventive concepts herein, including but not limited to the following embodiments:

1. An apparatus for memory interfacing, comprising: a baseband transmitter at a first frequency within a first integrated circuit configured for connection to a transmission line adapted for connection to at least a second integrated circuit; wherein said baseband transmitter is configured for outputting a baseband signal in response to receipt of a first data stream within said first integrated circuit; and at least one RF transmitter having a carrier at a second frequency which is amplitude shift keyed (ASK) and configured for connection to said transmission line; wherein multiple bands are simultaneously communicated from said first integrated circuit to at least said second integrated circuit.

2. The apparatus of embodiment 1, wherein said first integrated circuit comprises a microprocessor or memory controller configured for interfacing with said at least one second integrated circuit comprising memory devices.

3. The apparatus of embodiment 1, wherein said transmission lines comprise at least one differential pair of transmission lines within a shared parallel bus or point-to-point link.

4. The apparatus of embodiment 1, wherein said carrier of at least one RF transmitter is generated by one or more voltage controlled oscillators.

5. The apparatus of embodiment 1, wherein said at least one RF transmitter comprises multiple RF transmitters at a first integrated circuit; and wherein the carrier for these multiple RF transmitters is generated by a single voltage controlled oscillator.

6. The apparatus of embodiment 1, wherein said amplitude shift keying (ASK) is performed in response to switching the carrier on and off from connection to said transmission line.

7. The apparatus of embodiment 6, wherein said RF transmitter is transformer coupled to said transmission line.

8. The apparatus of embodiment 1, wherein said transmission line comprises a pair of transmission lines operating differentially as a single line.

9. The apparatus of embodiment 1, wherein said at least one baseband transmitter is configured with a multiple bit digitally calibrated baseband output which corrects for on-chip process variation and reduces impedance mismatch of active devices and characteristic mismatch of the transmission line.

10. The apparatus of embodiment 1, further comprising additional transmission lines coupled between said first integrated circuit and said second integrated circuit.

11. The apparatus of embodiment 1: wherein said at least one RF transmitter operates differentially on said transmission line, and said baseband transmitter operates in common mode on said transmission line; and wherein inter-band interference generated in response to simultaneous transmission of RF and baseband signals is suppressed utilizing spectral separation and orthogonal property between differential and common mode signaling.

12. The apparatus of embodiment 1, further comprising forward clocking in response to buffering a forwarded clock, wherein no phase locked loops (PLLs) or delay locked loops (DLLs) are required on one of said first integrated circuit or said second integrated circuit.

13. The apparatus of embodiment 1, wherein said chip-to-chip memory interfacing is performed within a memory module containing a plurality of dynamic random access memory (DRAM) devices.

14. The apparatus of embodiment 13, wherein said memory module comprises a dual in-line memory module (DIMM).

15. The apparatus of embodiment 14, further comprising a DIMM interface router (DIR) within a DIMM configured for receiving data, address, and control lines over a multiband interconnection along with other DIMM devices.

16. The apparatus of embodiment 14, further comprising a DIMM tree architecture in which each said RF transmitter is configured for transmitting multiple RF bands, and number of DIMMs increases exponentially as each new level of DIMMs and their associated latency are added.

17. An apparatus for memory interfacing, comprising: a baseband receiver of a first frequency within a second integrated circuit configured for connection to a transmission line adapted for connection to a first integrated circuit; wherein said baseband receiver is configured for outputting a digital baseband signal in response to receiving and converting a received baseband signal through said transmission line; and at least one RF receiver, configured for connection to said transmission line for receiving and converting an amplitude shift keyed (ASK) RF signal having a carrier at a second frequency to a digital RF band output; wherein multiple bands are simultaneously communicated from the first integrated circuit to at least said second integrated circuit.

18. The apparatus of embodiment 17, further comprising a band selective transformer for separating the baseband signal from the RF band signal.

19. The apparatus of embodiment 17, further comprising an active differential mixer circuit within said RF receiver for converting the ASK modulated RF signal back to an RF data signal.

20. A system for memory interfacing, comprising: a first integrated circuit device; a second integrated circuit device; a transmission line adapted for connection between said first integrated circuit device and said second integrated circuit device; a baseband transmitter at a first frequency within said first integrated circuit and a baseband receiver within said second integrated circuit, or said baseband transmitter at a first frequency within said second integrated circuit and a baseband receiver within said first integrated circuit; wherein said baseband transmitter is configured for outputting a baseband signal in response to receipt of a first data stream; and at least one RF transmitter within said first integrated circuit and/or said second integrated circuit having a carrier at a second frequency which is amplitude shift keyed (ASK) and configured for connection to said transmission line; wherein multiple bands are simultaneously communicated between said first integrated circuit and said second integrated circuit.

21. An apparatus for chip-to-chip memory interfacing, comprising: at least one baseband transmitter at a first frequency within a first integrated circuit configured for connection to an off-chip transmission line; wherein said at least one baseband transmitter is configured for outputting a baseband signal in response to receipt of a first data stream within said first integrated circuit; and at least one RF transmitter within a second integrated circuit coupled to said off-chip transmission line, and having a carrier at a second frequency modulated by amplitude shift keying (ASK) in response to receipt of a second data stream; wherein simultaneous bi-directional communication of said first data stream and said second data stream over multiple bands is performed between said first integrated circuit and said second integrated circuit.

22. The apparatus of embodiment 21, wherein said first integrated circuit comprises a microprocessor or memory controller configured for interfacing with said at least one second integrated circuit comprising memory devices, or said second integrated circuit comprises a microprocessor or memory controller configured for interfacing with said at least one first integrated circuit comprising memory devices.

23. The apparatus of embodiment 21, wherein said transmission lines comprise at least one differential pair of transmission lines within a shared parallel bus or point-to-point link.

24. The apparatus of embodiment 21, wherein said carrier of at least one RF transmitter is generated by one or more voltage controlled oscillators.

25. The apparatus of embodiment 21, wherein said at least one RF transmitter comprises multiple RF transmitters.

26. The apparatus of embodiment 25, wherein the carrier for said multiple RF transmitters is generated by a single voltage controlled oscillator coupled to said multiple RF transmitters.

27. The apparatus of embodiment 21, wherein said at least one RF transmitter is transformer coupled to said baseband transmitter and/or said baseband receiver, and to said off-chip transmission line.

28. The apparatus of embodiment 21, wherein said baseband transmitter is configured with a digitally calibrated baseband output which overcomes on-chip process variation and reduces impedance mismatch of active devices and characteristic mismatch to said off-chip transmission line.

29. The apparatus of embodiment 21: wherein said at least one RF transmitter operates differentially on said off-chip transmission line, and said baseband transmitter operates in common mode on said off-chip transmission line; and wherein inter-band interference generated in response to simultaneous transmission of RF and baseband signals is suppressed utilizing spectral separation and orthogonal property between differential and common mode signaling.

30. The apparatus of embodiment 21, further comprising: forward clocking, from said first integrated circuit to said second integrated circuit, or from said second integrated circuit to said first integrated circuit, in response to buffering a forwarded clock; wherein no phase locked loops (PLLs) or delay locked loops (DLLs) are required.

31. The apparatus of embodiment 21, wherein said chip-to-chip memory interfacing is performed within a memory module containing a plurality of dynamic random access memory (DRAM) devices.

32. The apparatus of embodiment 31, wherein said memory module comprises a dual in-line memory module (DIMM).

33. The apparatus of embodiment 32, further comprising a DIMM interface router (DIR) within a DIMM configured for receiving data, address, and control lines over a multiband interconnection along with other DIMM devices.

34. A system for chip-to-chip communication between integrated circuits, comprising: at least one baseband transmitter at a first frequency within a first integrated circuit configured for connection to a differential pair of off-chip transmission lines adapted for connection to a second integrated circuit; wherein said at least one baseband transmitter is configured for outputting a baseband signal in response to receipt of a first data stream within said first integrated circuit; and at least one RF transmitter, within said first integrated circuit or said second integrated circuit configured for amplitude shift keying (ASK) of a carrier at a second frequency which is coupled to said pair of off-chip transmission lines; wherein multiple bands are simultaneously communicated chip-to-chip between integrated circuits.

35. The system of embodiment 34, wherein said first integrated circuit comprises a microprocessor or memory controller configured for interfacing with said at least one second integrated circuit comprising memory devices, or said second integrated circuit comprises a microprocessor or memory controller configured for interfacing with said at least one first integrated circuit comprising memory devices.

36. The system of embodiment 34, wherein said carrier of at least one RF transmitter is generated by one or more voltage controlled oscillators.

37. The system of embodiment 34, wherein said at least one RF transmitter comprises multiple RF transmitters.

38. The system of embodiment 37, wherein the carrier for said multiple RF transmitters is generated by a single voltage controlled oscillator coupled to said multiple RF transmitters.

39. The system of embodiment 34, wherein said baseband transmitter is configured with a digitally calibrated baseband output which overcomes on-chip process variation and reduces impedance mismatch of active devices and characteristic mismatch to said off-chip transmission line.

40. An apparatus for chip-to-chip memory interfacing, comprising: a memory controller having multiple cores configured for communicating with multiple memory devices; a baseband receiver in each of said multiple cores in said memory controller is coupled to at least one of a plurality of differential transmission lines; and a plurality of RF transmitters, configured for amplitude shift keying (ASK) of a carrier generated from a voltage controlled oscillator shared between said plurality of RF transmitter, with each of said plurality of RF transmitters coupled to at least one of said plurality of differential transmission lines.

41. A memory module, comprising: an interface router having a multiband interconnection with simultaneous baseband and amplitude shift keyed RF band transmissions for receiving data and address information from outside of said memory module; and a plurality of memory devices within said memory module coupled to said interface router; wherein said address and data signals are received over the multiband combination of baseband and RF band and communicated with said plurality of memory chips.

42. The memory module of embodiment 41, further comprising a plurality of differential transmission lines coupled to said memory module over which said address and data information is communicated.

43. The memory module of embodiment 41, wherein command and/or control information is received over said baseband and RF band by said interface router.

44. The memory module of embodiment 41, wherein said memories comprise dynamic random access memory (DRAM) devices.

45. The memory module of embodiment 41, wherein said memory module comprises a dual in-line memory module (DIMM).

46. The memory module of embodiment 41, wherein said interface router is configured for transmitting multiple RF bands.

47. The memory module of embodiment 41, wherein said memory devices are coupled to said interface router with RC interconnects.

48. The memory module of embodiment 41, wherein said interface router comprises: a parent multiband RF transceiver configured for connection to a plurality of transmission line pairs over which said simultaneous baseband and amplitude shift keyed RF band transmissions are received; a router coupled to said parent and adapted with a plurality of data rate converters configured for RC interfacing with each of said plurality of memory devices; and a child multiband RF transceiver configured for connection to a plurality of transmission line pairs over which said simultaneous baseband and amplitude shift keyed RF band transmissions are transmitted to at least one additional memory module.

49. The memory module of embodiment 41, further comprising a buffer between said router and said child multiband RF transceiver for buffering memory signals being directed to at least one additional memory module.

50. The memory module of embodiment 41: wherein said memory module is configured for incorporation within a tree architecture having a plurality of device levels; wherein each level of memory module is configured for performing said simultaneous baseband and amplitude shift keyed RF band transmissions of data and addressing to a plurality of memory modules at a next level of said tree architecture; and wherein latency increases by one as each level in the tree architecture is added, while the number of memory modules contained in the tree architecture goes up exponentially.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Area of 8-bit transceivers

| Transceiver Type | BB | ASK-MRF-I | | |
| --- | --- | --- | --- | --- |
| | | 2 | 4 | 8 |
| No. of Pins | 8 | 8 | 4 | 2 |
| No. of Transceivers | 8 | 4 | 2 | 1 |
| Area (mm$^2$) | 0.528 | 0.372 | 0.341 | 0.310 |

TABLE 2

Transmitter (TX), Receiver (RX), and Transmission Line (TL) Latencies

| | Latency (ns) | | | |
| --- | --- | --- | --- | --- |
| | TX | RX | 5 cm TL | 10 cm TL |
| Baseband | 0.1 | 0.21 | 0.33 | 0.64 |
| RF-I | 0.14 | 0.22 | 0.39 | 0.72 |

TABLE 3

4-DIMM MRF-DIMM Evaluation Conditions

| Name of Mix | *Mix Contains | Bandwidth (GB/s) | #Transactions (millions) |
| --- | --- | --- | --- |
| low_mix_1 | mcf, milc, gcc, soplex, sjeng | 17.5 | 62.6 |
| low_mix_2 | lbm, milc, libquantum, namd, bzip2, sphinx3 | 17.2 | 71.2 |
| med_mix_1 | lbm, mcf, milc, libquantum, gcc, namd, bzip2, sphinx3, soplex, sjeng | 29.0 | 120.2 |
| med_mix_2 | milc, milc, milc, milc, milc, milc, gcc, gcc, gcc, gcc, gcc, gcc | 34.9 | 124.9 |
| hi_mix_1 | lbm, lbm | 197.8 | 82.8 |
| hi_mix_2 | mcf, bzip2, soplex, astar | 98.1 | 42.8 |

*mixes are from SPEC 2006 Benchmarks

TABLE 4

DRAMsim Parameter Values

| DRAMsim Configuration | Parameter Value |
| --- | --- |
| DRAM type | DDR3-1600/DDR2-800 |
| CPU Frequency | 4 GHz |
| Channel Width | 8 bytes |
| Address Mapping Policy | sdram_close_page_map |
| Row Buffer Policy | close_map |
| Ranks per Channel | 4 |
| Banks per Rank | 8 |

TABLE 4-continued

DRAMsim Parameter Values

| DRAMsim Configuration | Parameter Value |
| --- | --- |
| Row Count | 16384 |
| Column Count | 1024 |
| Rank-to-rank Switch Time | 1-DRAM cycle |

TABLE 5

Comparison of T-DIMM and MT-DIMM

| | Average Latency (uS) | Maximum Throughput (GBps) | Capacity (GB) |
| --- | --- | --- | --- |
| 64 T-DIMM | 0.34 | 11.9 | 256 |
| 64 MT-DIMM w/4RF bands/pin | 0.34 | 47.7 | 256 |
| *WD SiliconEdge ™ Solid State Drive | 250 | 0.35 | 256 |
| *WD VelociRaptor ™ Hard Drive | 3000 | 0.7 | 600 |

*WD = Western Digital

TABLE 6

DBI Performance Comparison with Conventional Devices

| | Existing Memory Device Types [c] | | | Inventive DBI Embodiments | |
| --- | --- | --- | --- | --- | --- |
| | [1] JSSC | [2] ISSCC | [4] JSSC | | |
| | 2009 | 2009 | 2010 | FR4 DBI | Roger DBI |
| CMOS Technology | 0.18 μm | 0.13 μm | 40 nm | 65 nm | 65 nm |
| Bands | BB | BB | BB | BB + RF [a] | BB + RF [a] |
| Supply (Volts) | 1.8 | 1.2 | 1.1 | 1.0 | 1.0 |
| T-Line Length (cm) (board type) | 10 (FR4) | 5 (N/A) | 7 (FR4) | 10 (FR4) | 10 (Roger) |
| Aggregate data rate (GB/s) | 5 | 6.0 | 4.3 | 8.4 | 10 |
| Communication [b] | Bi | Bi | Bi | Bi + Sim | Bi + Sim |
| Energy per bit (pJ/bit) | 17.4 | 15.8 | 3.3 | 2.5 | 2.5 |
| Total power (mW) | 87 | 95 | 14.4 | 11 (BB) 10 (RF) | 13 (BB) 12 (RF) |
| Chip Area (mm²) | 0.52 | 0.30 | N/A | 0.14 | 0.14 |
| Measured BER | $10^{-12}$ $(PRBS2^{15} - 1)$ | $10^{-12}$ $(PRBS2^{15} - 1)$ | N/A | $<10^{-15}$ $(PRBS2^{23} - 1)$ | $<10^{-15}$ $(PRBS2^{23} - 1)$ |

[a] RF carrier frequency = 23 GHz
[b] Communication Types: Bi = Bidirectional, Sim = Simultaneous
[c] Existing Memory Device Types are described in the following papers.
[1] JSSC 2009: Kwang-Il Oh, et al., "A 5-Gb/s/pin Transceiver for DDR Memory Interface with a Crosstalk Suppression Scheme," IEEE J. Solid-State Circuits, vol. 44, pp. 2222-2232, August, 2009.
[2] ISSCC 2009: Kyung-Soo Ha, et al., "A 6 Gb/s/pin Pseudo-Differential Signaling Using Common-Mode Noise Rejection Techniques Without Reference Signal for DRAM Interfaces," ISSCC Dig. Tech. Papers, pp. 138-139, February 2009.
[4] JSSC 2010: Brian Leibowitz, et al., "A 4.3 GB/s Mobile Memory Interface With Power-Efficient Bandwidth Scaling," IEEE J. Solid-State Circuits, vol. 45, no. 4, pp. 889-898, April, 2010.

We claim:

1. An apparatus for memory interfacing, comprising:
a baseband transmitter at a first frequency within a first integrated circuit configured for connection to a transmission line adapted for connection to at least a second integrated circuit;
wherein said baseband transmitter is configured for outputting a baseband signal in response to receipt of a first data stream within said first integrated circuit; and
at least one RF transmitter having a carrier at a second frequency which is amplitude shift keyed (ASK) and configured for connection to said transmission line;
wherein multiple bands, including a baseband and at least one amplitude shift keyed RF band, are simultaneously communicated from said first integrated circuit to the at least said second integrated circuit.

2. The apparatus as recited in claim 1, wherein said first integrated circuit comprises a microprocessor or a memory controller configured for interfacing with the at least said second integrated circuit comprising memory devices.

3. The apparatus as recited in claim 1, wherein said transmission lines comprise at least one differential pair of transmission lines within a shared parallel bus or a point-to-point link.

4. The apparatus as recited in claim 1, wherein said carrier of said at least one RF transmitter is generated by one or more voltage controlled oscillators.

5. The apparatus as recited in claim 1, wherein said at least one RF transmitter comprises multiple RF transmitters at said first integrated circuit; and wherein carriers for said multiple RF transmitters is generated by a single voltage controlled oscillator.

6. The apparatus as recited in claim 1, wherein said amplitude shift keying (ASK) is performed in response to switching the carrier on and off from connection to said transmission line.

7. The apparatus as recited in claim 6, wherein said at least one RF transmitter is transformer coupled to said transmission line.

8. The apparatus as recited in claim 1, wherein said transmission line comprises a pair of transmission lines operating differentially as a single line.

9. The apparatus as recited in claim 1, wherein said baseband transmitter is configured with a multiple bit digitally calibrated baseband output which corrects for on-chip process variation and reduces impedance mismatch of active devices and characteristic mismatch of the transmission line.

10. The apparatus as recited in claim 1, further comprising additional transmission lines coupled between said first integrated circuit and the at least said second integrated circuit.

11. The apparatus as recited in claim 1:
wherein said at least one RF transmitter operates differentially on said transmission line, and said baseband transmitter operates in common mode on said transmission line; and
wherein inter-band interference generated in response to simultaneous transmission of RF and baseband signals is suppressed utilizing spectral separation and orthogonal property between differential and common mode signaling.

12. The apparatus as recited in claim 1, further comprising forward clocking in response to buffering a forwarded clock, wherein no phase locked loops (PLLs) or delay locked loops (DLLs) are required on one of said first integrated circuit or the at least said second integrated circuit.

13. The apparatus as recited in claim 1, wherein said memory interfacing is performed within a memory module containing a plurality of dynamic random access memory (DRAM) devices.

14. The apparatus as recited in claim 13, wherein said memory module comprises a dual in-line memory module (DIMM).

15. The apparatus as recited in claim 14, further comprising a DIMM interface router (DIR) within the DIMM configured for receiving data, address, and control lines over a multiband interconnection along with other DIMM devices.

16. The apparatus as recited in claim 14, further comprising a DIMM tree architecture in which said at least one RF transmitter is configured for transmitting multiple RF bands, and number of DIMMs increases exponentially as each new level of DIMMs and their associated latency are added.

17. An apparatus for memory interfacing, comprising:
a baseband receiver of a first frequency within a second integrated circuit configured for connection to a transmission line adapted for connection to a first integrated circuit;
wherein said baseband receiver is configured for outputting a digital baseband signal in response to receiving and converting a received baseband signal through said transmission line; and
at least one RF receiver, configured for connection to said transmission line for receiving and converting an amplitude shift keyed (ASK) RF signal having a carrier at a second frequency to a digital RF band output;
wherein multiple bands, including a baseband and at least one amplitude shift keyed RF band, are simultaneously communicated from the first integrated circuit to said second integrated circuit.

18. The apparatus as recited in claim 17, further comprising a band selective transformer for separating the digital baseband signal from the digital RF band signal.

19. The apparatus as recited in claim 17, further comprising an active differential mixer circuit within said at least one RF receiver for converting the ASK modulated RF signal back to an RF data signal.

20. A system for memory interfacing, comprising:
a first integrated circuit device;
a second integrated circuit device;
a transmission line adapted for connection between said first integrated circuit device and said second integrated circuit device;
a baseband transmitter at a first frequency within said first integrated circuit device and a baseband receiver within said second integrated circuit device, or said baseband transmitter at a first frequency within said second integrated circuit device and said baseband receiver within said first integrated circuit device;
wherein said baseband transmitter is configured for outputting a baseband signal in response to receipt of a first data stream; and
at least one RF transmitter within said first integrated circuit device and/or said second integrated circuit device having a carrier at a second frequency which is amplitude shift keyed (ASK) and configured for connection to said transmission line;
wherein multiple bands, including a baseband and at least one amplitude shift keyed RF band, are simultaneously communicated between said first integrated circuit device and said second integrated circuit device.

21. An apparatus for chip-to-chip memory interfacing, comprising:
at least one baseband transmitter at a first frequency within a first integrated circuit configured for connection to an off-chip transmission line;
wherein said at least one baseband transmitter is configured for outputting a baseband signal in response to receipt of a first data stream within said first integrated circuit; and
at least one RF transmitter within a second integrated circuit coupled to said off-chip transmission line, and having a carrier at a second frequency modulated by amplitude shift keying (ASK) in response to receipt of a second data stream;
wherein simultaneous bi-directional communication of said first data stream and said second data stream over multiple bands is performed between said first integrated circuit and said second integrated circuit.

22. The apparatus as recited in claim 21, wherein said first integrated circuit comprises a microprocessor or memory controller configured for interfacing with said second integrated circuit comprising memory devices, or said second integrated circuit comprises a microprocessor or memory controller configured for interfacing with said first integrated circuit comprising memory devices.

23. The apparatus as recited in claim 21, wherein said transmission lines comprise at least one differential pair of transmission lines within a shared parallel bus or a point-to-point link.

24. The apparatus as recited in claim 21, wherein said carrier of said at least one RF transmitter is generated by one or more voltage controlled oscillators.

25. The apparatus as recited in claim 21, wherein said at least one RF transmitter comprises multiple RF transmitters.

26. The apparatus as recited in claim 25, wherein the carrier for said multiple RF transmitters is generated by a single voltage controlled oscillator coupled to said multiple RF transmitters.

27. The apparatus as recited in claim 21, wherein said at least one RF transmitter is transformer coupled to said baseband transmitter and to said off-chip transmission line.

28. The apparatus as recited in claim 21, wherein said at least one baseband transmitter is configured with a digitally calibrated baseband output which overcomes on-chip process variation and reduces impedance mismatch of active devices and characteristic mismatch to said off-chip transmission line.

29. The apparatus as recited in claim 21:
wherein said at least one RF transmitter operates differentially on said off-chip transmission line, and said at least one baseband transmitter operates in common mode on said off-chip transmission line; and wherein inter-band interference generated in response to simultaneous transmission of RF and baseband signals is suppressed utilizing spectral separation and orthogonal property between differential and common mode signaling.

30. The apparatus as recited in claim 21, further comprising:
   forward clocking, from said first integrated circuit to said second integrated circuit, or from said second integrated circuit to said first integrated circuit, in response to buffering a forwarded clock;
   wherein no phase locked loops (PLLs) or delay locked loops (DLLs) are required.

31. The apparatus as recited in claim 21, wherein said chip-to-chip memory interfacing is performed within a memory module containing a plurality of dynamic random access memory (DRAM) devices.

32. The apparatus as recited in claim 31, wherein said memory module comprises a dual in-line memory module (DIMM).

33. The apparatus as recited in claim 32, further comprising a DIMM interface router (DIR) within said DIMM configured for receiving data, address, and control lines over a multiband interconnection along with other DIMM devices.

34. A system for chip-to-chip communication between integrated circuits, comprising:
   at least one baseband transmitter at a first frequency within a first integrated circuit configured for connection to a differential pair of off-chip transmission lines adapted for connection to a second integrated circuit;
   wherein said at least one baseband transmitter is configured for outputting a baseband signal in response to receipt of a first data stream within said first integrated circuit; and
   at least one RF transmitter, within said first integrated circuit or said second integrated circuit configured for amplitude shift keying (ASK) of a carrier at a second frequency which is coupled to said pair of off-chip transmission lines;
   wherein multiple bands, including a baseband and at least one amplitude shift keyed RF band, are simultaneously communicated chip-to-chip between integrated circuits.

35. The system as recited in claim 34, wherein said first integrated circuit comprises a microprocessor or memory controller configured for interfacing with said second integrated circuit comprising memory devices, or said second integrated circuit comprises a microprocessor or memory controller configured for interfacing with said first integrated circuit comprising memory devices.

36. The system as recited in claim 34, wherein said carrier of at least one RF transmitter is generated by one or more voltage controlled oscillators.

37. The system as recited in claim 34, wherein said at least one RF transmitter comprises multiple RF transmitters.

38. The system as recited in claim 37, wherein the carrier for said multiple RF transmitters is generated by a single voltage controlled oscillator coupled to said multiple RF transmitters.

39. The system as recited in claim 34, wherein said at least one baseband transmitter is configured with a digitally calibrated baseband output which overcomes on-chip process variation and reduces impedance mismatch of active devices and characteristic mismatch to said off-chip transmission line.

40. An apparatus for chip-to-chip memory interfacing, comprising:
   a memory controller having multiple cores configured for communicating with multiple memory devices;
   a baseband receiver in each of said multiple cores in said memory controller is coupled to at least one of a plurality of differential transmission lines; and
   a plurality of RF transmitters, configured for amplitude shift keying (ASK) of a carrier generated from a voltage controlled oscillator shared between said plurality of RF transmitters, with each of said plurality of RF transmitters coupled to at least one of said plurality of differential transmission lines; and
   wherein said memory controller communicates with said multiple memory devices over each of said plurality of differential transmission lines using simultaneous transmissions which include a baseband and at least one amplitude shift keyed RF band.

41. A memory module, comprising:
   an interface router having a multiband interconnection with simultaneous baseband and amplitude shift keyed RF band transmissions for receiving data and address information from outside of said memory module; and
   a plurality of memory devices within said memory module coupled to said interface router;
   wherein said data and address information are received over the multiband interconnection with simultaneous baseband and amplitude shift keyed RF band transmissions and communicated with said plurality of memory chips.

42. The memory module as recited in claim 41, further comprising a plurality of differential transmission lines coupled to said memory module over which said address and data information is communicated.

43. The memory module as recited in claim 41, wherein command and/or control information is received over said simultaneous baseband and amplitude shift keyed RF band transmissions by said interface router.

44. The memory module as recited in claim 41, wherein said plurality of memory devices comprise dynamic random access memory (DRAM) devices.

45. The memory module as recited in claim 41, wherein said memory module comprises a dual in-line memory module (DIMM).

46. The memory module as recited in claim 41, wherein said interface router is configured for transmitting multiple RF bands.

47. The memory module as recited in claim 41, wherein said memory devices are coupled to said interface router with RC interconnects.

48. The memory module as recited in claim 41, wherein said interface router comprises:
   a parent multiband RF transceiver configured for connection to a plurality of transmission line pairs over which said simultaneous baseband and amplitude shift keyed RF band transmissions are received;
   a router coupled to said parent multiband RF transceiver and adapted with a plurality of data rate converters configured for RC interfacing with each of said plurality of memory devices; and
   a child multiband RF transceiver configured for connection to said plurality of transmission line pairs over which said simultaneous baseband and amplitude shift keyed RF band transmissions are transmitted to at least one additional memory module.

49. The memory module as recited in claim 41, further comprising a buffer between said router and said child multiband RF transceiver for buffering memory signals being directed to the at least one additional memory module.

50. The memory module as recited in claim 41:
wherein said memory module is configured for incorporation within a tree architecture having a plurality of device levels;
wherein each device level of said memory module is configured for performing said simultaneous baseband and amplitude shift keyed RF band transmissions of data and addressing to a plurality of memory modules at a next level of said tree architecture; and
wherein latency increases by one as each level in the tree architecture is added, while the number of memory modules contained in the tree architecture goes up exponentially.

* * * * *